(12) United States Patent
Ikushima et al.

(10) Patent No.: US 6,787,387 B2
(45) Date of Patent: Sep. 7, 2004

(54) ELECTRONIC DEVICE AND METHOD FOR FABRICATING THE ELECTRONIC DEVICE

(75) Inventors: Kimiya Ikushima, Hirakata (JP); Hiroyoshi Komobuchi, Kyoto (JP); Mikiya Uchida, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/601,470

(22) Filed: Jun. 23, 2003

(65) Prior Publication Data

US 2004/0053435 A1 Mar. 18, 2004

(30) Foreign Application Priority Data

Jun. 24, 2002 (JP) ........................................ 2002-182510

(51) Int. Cl.$^7$ ...................... H01L 21/00; H01L 21/461; H01L 31/75
(52) U.S. Cl. .................... 438/57; 438/739; 438/740; 257/293; 257/458
(58) Field of Search ................................ 257/227, 293, 257/458, 466, 623; 438/57–60, 706, 734–744, 50–53

(56) References Cited

U.S. PATENT DOCUMENTS 6,163,061 A * 12/2000 Iida ............................ 257/467

6,483,111 B1 * 11/2002 Ishikawa et al. ......... 250/338.4

FOREIGN PATENT DOCUMENTS

| JP | 05-126643 A | 5/1993 |
| JP | 09-162285 A | 6/1997 |
| JP | 2001-510641 A | 7/2001 |
| JP | 2001-210877 A | 8/2001 |
| JP | 2001-223331 A | 8/2001 |

* cited by examiner

Primary Examiner—Matthew Smith
Assistant Examiner—Calvin Lee
(74) Attorney, Agent, or Firm—Akin Gump Strauss Hauer & Feld, LLP

(57) ABSTRACT

A method for fabricating an electronic device includes the steps of: preparing a cavity defining sacrificial layer, at least the upper surface of which is covered with an etch stop layer; forming at least one first opening in the etch stop layer, thereby partially exposing the surface of the cavity defining sacrificial layer; etching the cavity defining sacrificial layer through the first opening, thereby defining a provisional cavity under the etch stop layer and a supporting portion that supports the etch stop layer thereon; and etching away a portion of the etch stop layer, thereby defining at least one second opening that reaches the provisional cavity through the etch stop layer and expanding the provisional cavity into a final cavity.

27 Claims, 43 Drawing Sheets

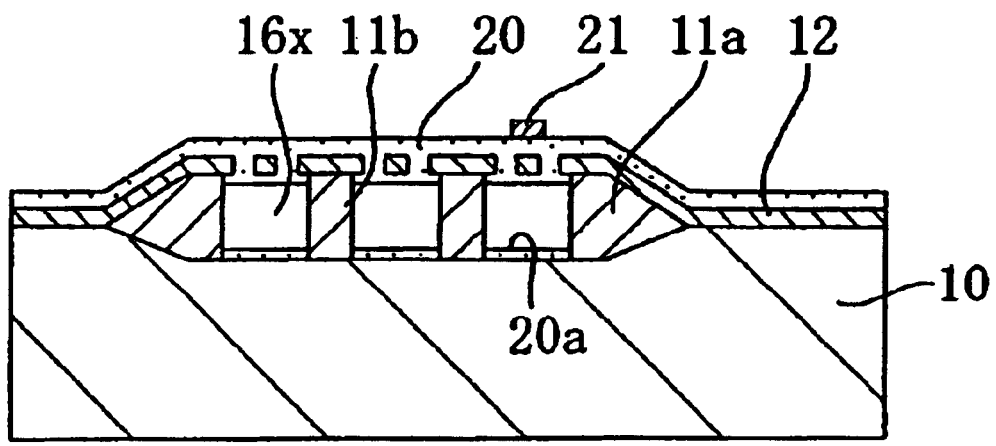
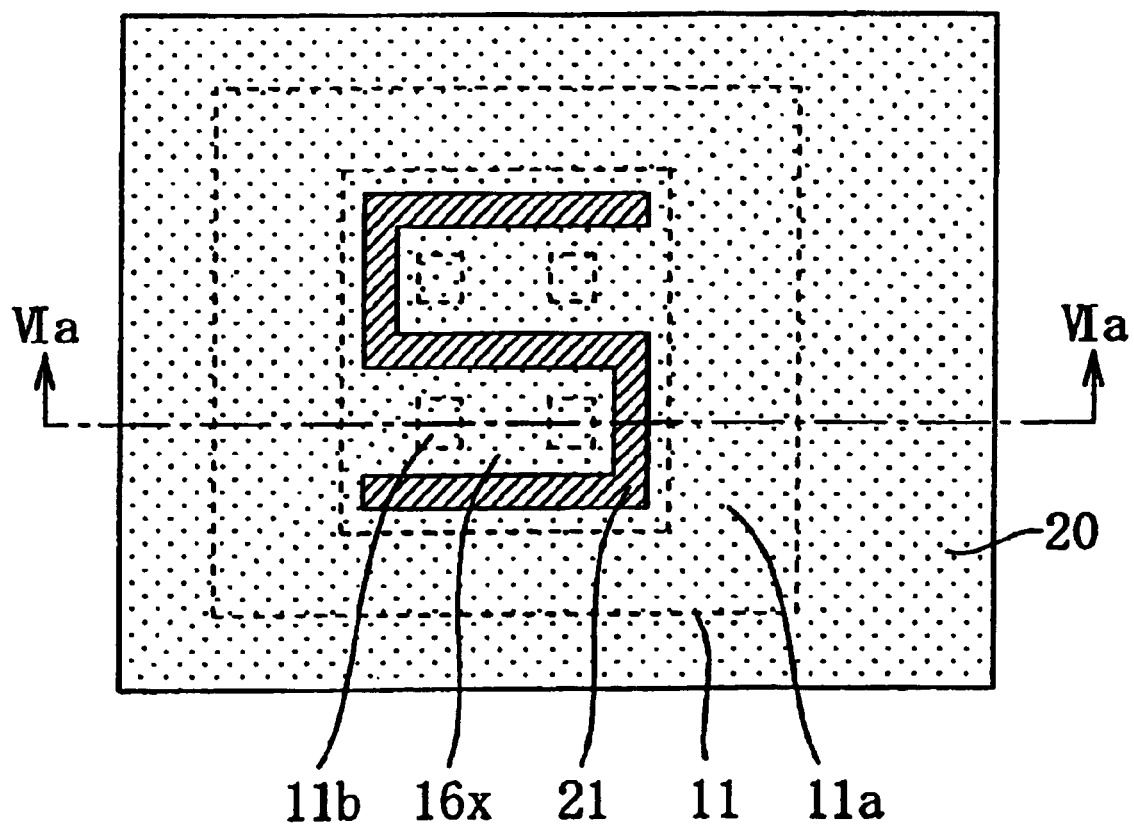

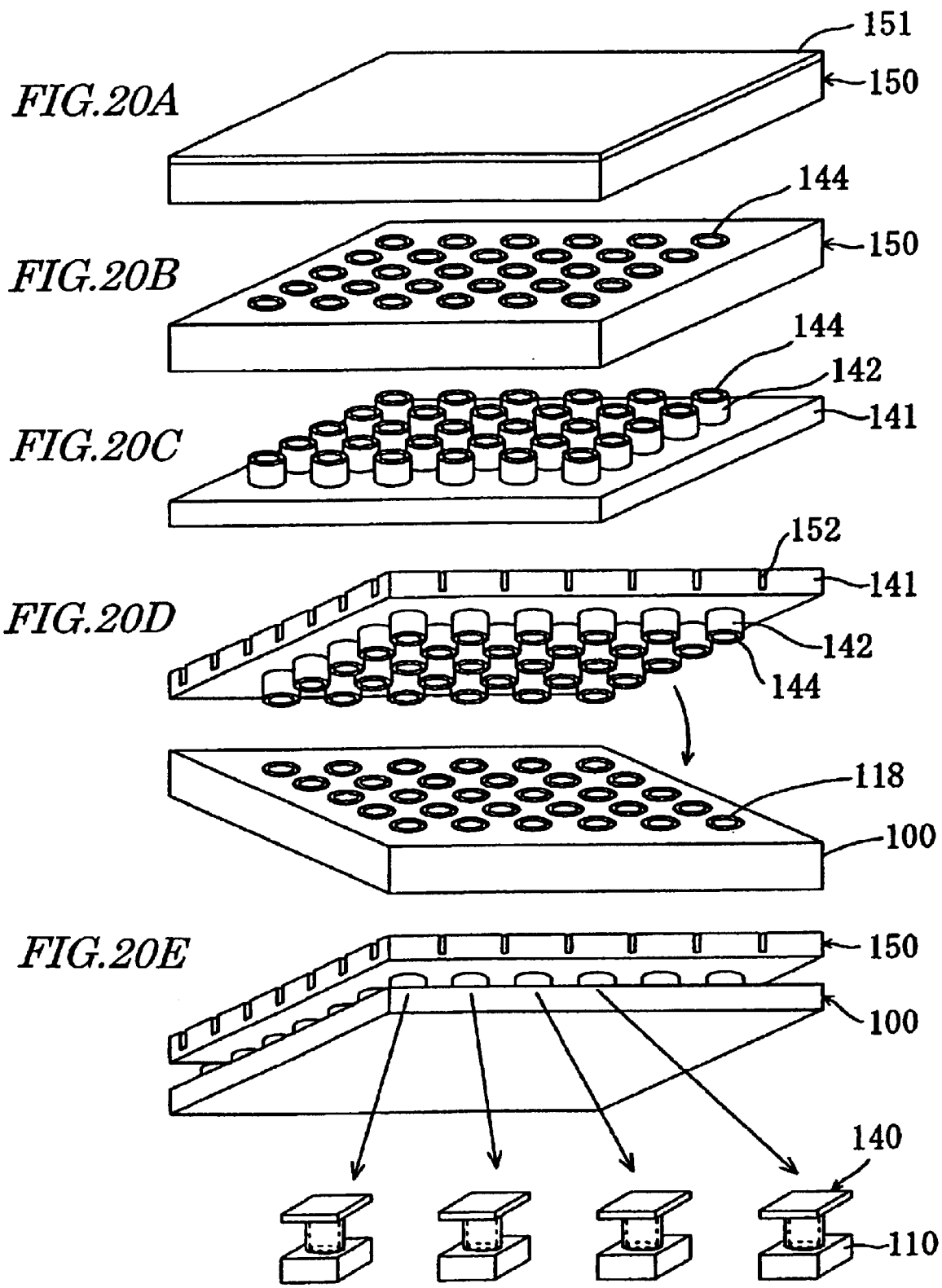

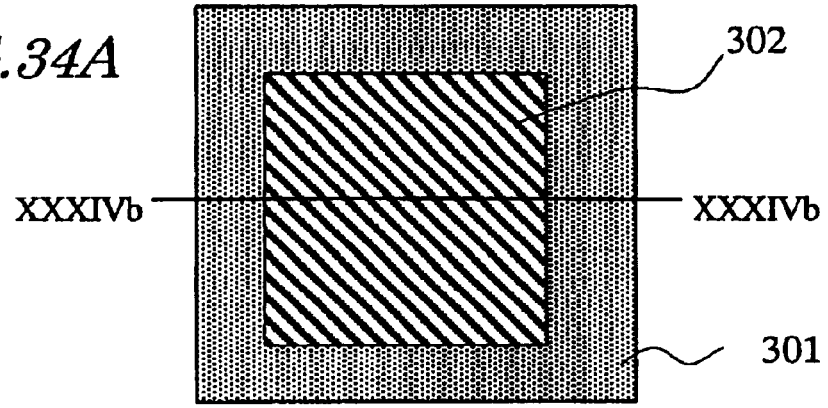
FIG.34A
FIG.34B
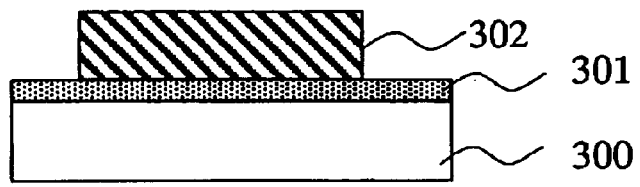
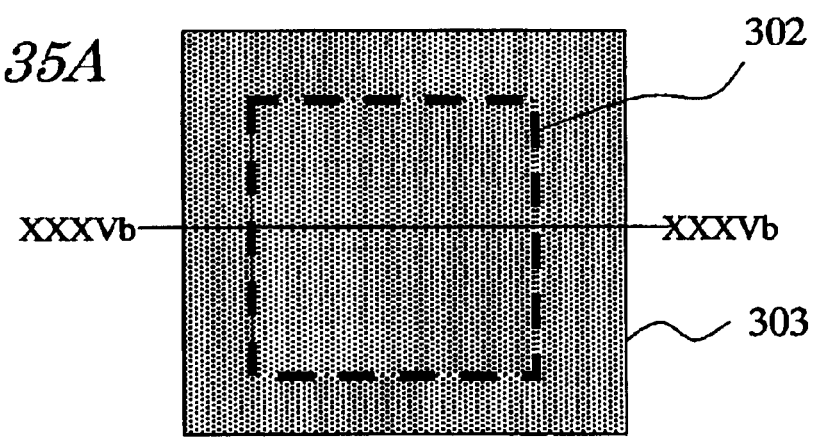
FIG.35A
FIG.35B
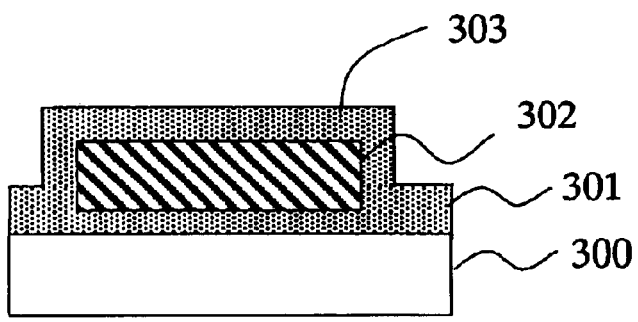

ELECTRONIC DEVICE AND METHOD FOR FABRICATING THE ELECTRONIC DEVICE

BACKGROUND OF THE INVENTION

1. Field of the Invention

The present invention relates to a method for fabricating an electronic device including an infrared sensor, for example, and an electronic device to be preferably fabricated by such a method.

2. Description of the Related Art

An infrared sensor, including a plurality of bolometers on a semiconductor substrate, is known in the art. The infrared spectral responsivity of such an infrared sensor decreases when the heat, generated in the bolometers responsive to incident infrared radiation, is transmitted to the semiconductor substrate. Thus, to ensure sufficient infrared spectral responsivity, it is necessary to decrease the thermal transferability between the bolometers and the semiconductor substrate. For that purpose, Japanese Laid-Open Publication No. 2001-210877 discloses a technique of creating a cavity on the surface of a silicon substrate to thermally isolate the silicon substrate with a huge heat capacity from infrared detectors such as bolometers.

Hereinafter, the technique disclosed in Japanese Laid-Open Publication No. 2001-210877 mentioned above will be described with reference to FIGS. 31A through 31G. According to the conventional method, first, as shown in FIG. 31A, the surface of a silicon substrate 1001 is thermally oxidized locally to form a locally oxidized silicon (LOCOS) film 1002 thereon.

Next, as shown in FIG. 31B, a silicon nitride layer 1003 and a polysilicon film 104 are stacked in this order over the LOCOS film 1002 and the silicon substrate 1001.

Thereafter, as shown in FIG. 31C, a plurality of holes 1005 are formed by photolithographic and dry etching processes so as to extend through the polysilicon film 1004, silicon nitride layer 1003 and LOCOS film 1002 and reach the surface of the silicon substrate 1001.

Subsequently, as shown in FIG. 31D, portions of the LOCOS film 1002, which are exposed on the inner surfaces of the holes 1005, are removed laterally by a wet etching process using buffered hydrofluoric acid. As a result, walls 1007 are defined by the remaining portions of the LOCOS the 1002 between the adjacent holes 1005.

Next, as shown in FIG. 31E, a thin polysilicon film is deposited on the surface of the discontinued polysilicon film 1004 and on the inner surfaces of the holes 1005 and then the thin polysilicon film and the discontinued polysilicon film 1004 are oxidized together to form a continuous silicon dioxide layer 1010. As a result of this process step, the holes 1005 are closed up with the silicon dioxide layer 1010 to define cavities 1011 as closed spaces.

Thereafter, as shown in FIG. 31F, a patterned conductor film 1012 with a zigzag planar shape, for example, is deposited on the silicon dioxide layer 1010 so as to function as an infrared detector.

By providing the cavities 1011 between the conductor film 1012 as a heat detector and the silicon substrate 1001 in this manner, the transfer of the heat from the infrared detector to the silicon substrate 1001 can be reduced, thus increasing the infrared spectral responsivity.

Hereinafter, another method for creating the cavities will be described. An infrared sensor, including cavities formed by such a method, is disclosed in Japanese Laid-Open Publication No. 05-126643, for example.

First, as shown in FIGS. 32A and 32B, a silicon dioxide layer 301 is deposited on a silicon substrate 300. When a polysilicon film to be deposited in the next process step is etched, the silicon dioxide layer 301 will function as a lower etch stop layer.

Next, as shown in FIGS. 33A and 33B, a polysilicon film 302 is deposited on the silicon dioxide layer 301 and then patterned as shown in FIGS. 34A and 34B. The patterned polysilicon film 302 will function as a sacrificial layer to be etched away to form a cavity.

Subsequently, as shown in FIGS. 35A and 35B, another silicon dioxide layer 303 is deposited on the polysilicon film 302 and then an infrared detector 304 is formed on the silicon dioxide layer 303 as shown in FIGS. 36A and 36B.

Thereafter, as shown in FIGS. 37A and 37B, yet another silicon dioxide layer 305 is deposited over the infrared detector 304. These silicon dioxide layers 303 and 305 function as an upper etch stop layer.

Then, as shown in FIGS. 38A and 38B, the silicon dioxide layers 303 and 305 are patterned to define cavity forming openings 306. Portions of the polysilicon film 302 are exposed at the bottom of these openings 306. Subsequently, hydrazine is introduced through the openings 306 of the silicon dioxide layers 303 and 305, thereby etching the polysilicon film 302. In this manner, a cavity 308 is formed as shown in FIGS. 39A and 39B.

In the method disclosed in Japanese Laid-Open Publication No. 2001-210877, the walls 1007 remain between the adjacent cavities 1011 as shown in FIG. 31F. To increase the effects to be obtained by providing the cavities 1011, the walls 1007, having some thermal conductivity, are preferably removed. The walls 1007 may be removed by performing the etching process step shown in FIG. 31D long enough to leave no walls 1007 there. However, if the walls 1007 were removed at this early stage, then the silicon nitride layer 1003 and the polysilicon film 1004 would crack before the structure shown in FIG. 31F is completed. Such a phenomenon is believed to be caused by a thermal stress resulting from a difference in thermal expansion coefficient between the silicon nitride layer 1003 and the silicon substrate 1001. That is to say, while the conductor film 1012 of polysilicon is annealed to activate a dopant that has been introduced into the conductor film 1012 and while the polysilicon film 1004 and the thin polysilicon film are thermally oxidized, a great thermal stress will be applied to the silicon nitride layer 1003 and silicon dioxide layer 1004.

For that reason, according to the method disclosed in Japanese Laid-Open Publication No. 2001-210877, it is difficult to form a big cavity by removing the walls 1007.

According to the method disclosed in Japanese Laid-Open Publication No. 05-126643 on the other hand, the polysilicon film 302 is removed by a chemical agent such as hydrazine, thus always requiring a drying process step to remove the chemical agent from the cavity 308. However, when such a drying process step is carried out, a great stress is created in the portions of the silicon dioxide layers 303 and 305 that support the ceiling of the cavity 308, thus possibly cracking those silicon dioxide layers 303 and 305.

SUMMARY OF THE INVENTION

In order to overcome the problems described above, preferred embodiments of the present invention provide an electronic device, in which members defining the ceiling of a cavity are not cracked, and a method for fabricating such an electronic device.

A method for fabricating an electronic device according to a preferred embodiment of the present invention preferably includes the steps of: (a) preparing a cavity defining sacrificial layer, at least the upper surface of which is covered with an etch stop layer; (b) forming at least one first opening in the etch stop layer, thereby partially exposing the surface of the cavity defining sacrificial layer; (c) etching the cavity defining sacrificial layer through the first opening, thereby defining a provisional cavity under the etch stop layer and a supporting portion that supports the etch stop layer thereon; and (d) etching away a portion of the etch stop layer, thereby defining at least one second opening that reaches the provisional cavity through the etch stop layer and expanding the provisional cavity into a final cavity.

In one preferred embodiment, the step (d) preferably includes the step of etching at least a part of the supporting portion, which is located under the second opening, through the second opening.

In another preferred embodiment of the present invention, the method preferably further includes the step of forming a structure, including a patterned thin film, on the etch stop layer before the step (d) is performed.

In this particular preferred embodiment, the step of forming the structure preferably includes the step of forming the structure such that the patterned thin film does not overlap with the portion of the etch stop layer to be removed to define the second opening in the step (d).

In another preferred embodiment, the step (a) preferably includes the steps of: depositing a material film of the cavity defining sacrificial layer on a substrate; and patterning the material film into the shape of the cavity defining sacrificial layer.

In this particular preferred embodiment, the step of patterning the material film preferably includes the step of patterning the material film into a cavity defining sacrificial layer that has a through hole extending from the upper surface thereof through the lower surface thereof.

Specifically, the step (c) preferably includes the step of defining the supporting portion in a region in which the cavity defining sacrificial layer is not present.

More specifically, the step (c) preferably includes the step of making a portion of the etch stop layer function as the supporting portion.

In another preferred embodiment, the step (c) preferably includes the step of leaving a portion of the cavity defining sacrificial layer as the supporting portion.

In still another preferred embodiment, the step (c) preferably includes the step of selectively removing the cavity defining sacrificial layer by a wet etching technique, and the step (d) preferably includes the step of removing the supporting portion at least partially by a dry etching technique.

In yet another preferred embodiment, the step (a) preferably includes the step of depositing the etch stop layer on the cavity defining sacrificial layer.

In yet another preferred embodiment, the step (a) preferably includes the step of preparing an SOI substrate that includes a silicon dioxide layer functioning as the etch stop layer and a single crystalline silicon substrate including a portion functioning as the cavity defining sacrificial layer.

In yet another preferred embodiment, the method preferably further includes the steps of: defining a mask, having a pattern that will define the second opening and that exposes the inside of the first opening, on the etch stop layer between the steps (b) and (c); and removing the mask after the step (d) has been performed.

In yet another preferred embodiment, the method preferably further includes, between the steps (c) and (e), the steps of: depositing a thin film on the etch stop layer to close up the first opening of the etch stop layer; forming a film for a sensor on the thin film; and patterning the film for the sensor.

In this particular preferred embodiment, the step of depositing the thin film preferably includes the step of depositing the thin film by a chemical vapor deposition process.

In that case, the method preferably further includes the step of forming a heat-absorbing insulating film on the thin film.

Then, the method preferably further includes the step of forming a passivation film on the heat-absorbing insulating film.

In yet another preferred embodiment, the step (a) preferably includes the step of locally oxidizing the surface of a single crystalline silicon substrate to define a silicon dioxide region on a selected area on the surface of the silicon substrate. In that case, at least a portion of the silicon dioxide region is preferably used as the cavity defining sacrificial layer.

In this particular preferred embodiment, the method preferably further includes the step of using the silicon dioxide region as an isolation film.

In yet another preferred embodiment, the step (a) preferably includes the step of using a surface portion of a semiconductor substrate as the cavity defining sacrificial layer.

In yet another preferred embodiment, the step (c) preferably includes the steps of: forming a recess, extending from the first opening into the cavity defining sacrificial layer, by a dry etching technique; and expanding the recess by an isotropic etching technique.

In yet another preferred embodiment, the step (c) may include the step of defining the supporting portion only around the provisional cavity.

In an alternative preferred embodiment, the step (c) may include the step of defining the supporting portion only inside of the provisional cavity.

In yet another preferred embodiment, where the final cavity has an overall transversal sectional area of about 1,000 $\mu m^2$ or more, the step (c) preferably includes the step of defining three to ten columns, each having a transversal sectional area of at least about 10 $\mu m^2$, as the supporting portion.

In yet another preferred embodiment, the step (a) preferably includes the step of depositing a nitride layer as the etch stop layer, and the step of depositing the thin film preferably includes the step of depositing a silicon dioxide film.

In yet another preferred embodiment, the method preferably further includes the step of forming a cap member that encapsulates the structure including the patterned thin film.

An electronic device according to a preferred embodiment of the present invention preferably includes: a substrate with at least one cavity; a thin film structure, which defines the upper surface of the cavity; and a patterned thin film that is supported by the thin film structure. In this electronic device, the thin film structure preferably includes at least one hole, which is not overlapped by the patterned thin film and which reaches the cavity.

In one preferred embodiment of the present invention, a convex portion may be provided inside of the cavity and right under the hole so as to protrude toward the thin film structure.

In an alternative preferred embodiment, a concave portion may be provided inside of the cavity and right under the hole so as to protrude away from the thin film structure.

In another preferred embodiment, the patterned thin film is preferably a bolometer, and the electronic device preferably functions as an infrared sensor.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 6A and 6B are respectively a cross-sectional view, taken on the plane VIa—VIa shown in FIG. 6B, and a plan view showing the process step of forming a resistor for the bolometer.

FIGS. 20A through 20E are cross-sectional views illustrating respective process steps for making a cap member for use in an electronic device according to the fourth preferred embodiment.

FIGS. 32A, 33A, 34A, 35A, 36A, 37A, 38A and 39A are plan views illustrating another conventional manufacturing process of an infrared detector as disclosed in Japanese Laid-Open Publication No. 05-126643.

FIGS. 32B, 33B, 34B, 35B, 36B, 37B, 38B and 39B are cross-sectional views of the structures shown in FIGS. 32A, 33A, 34A, 35A, 36A, 37A, 38A and 39A as taken on the planes XXXIIb—XXXIIb, XXXIIIb—XXXIIIb, XXXIVb—XXXIVb, XXXVb—XXXVb, XXXVIb—XXXVIb, XXXVIIb—XXXVIIb, XXXVIIIb—XXXVIIIb and XXXIXb—XXXIXb, respectively.

DETAILED DESCRIPTION OF PREFERRED EMBODIMENTS

Hereinafter, preferred embodiments of the present invention will be described with reference to the accompanying drawings.

Embodiment 1

An electronic device according to a first specific preferred embodiment of the present invention is an infrared sensor including a plurality of infrared detectors (i.e., bolometers).

Figure 1A:
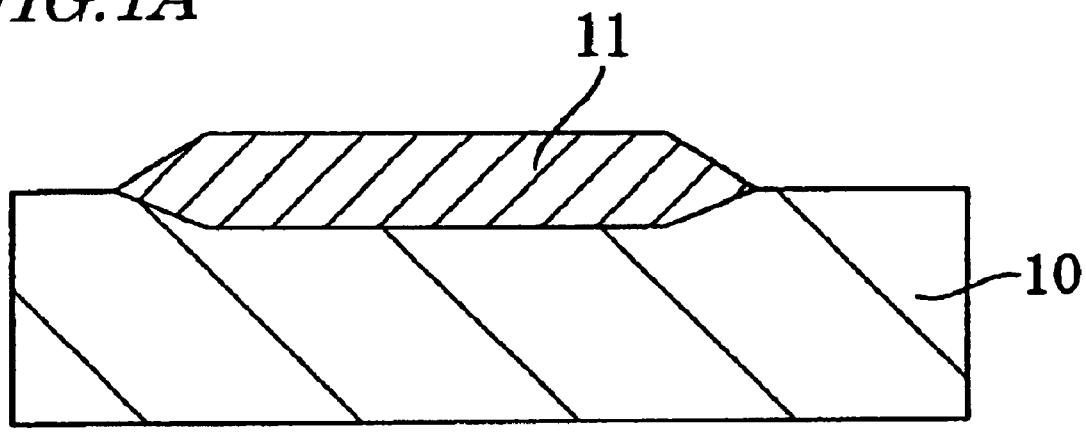
FIGS. 1A and 1B are respectively a cross-sectional view and plan view showing the process step of forming a cavity defining insulating film in a bolometer manufacturing process according to a first specific preferred embodiment of the present invention.
Figure 1B:
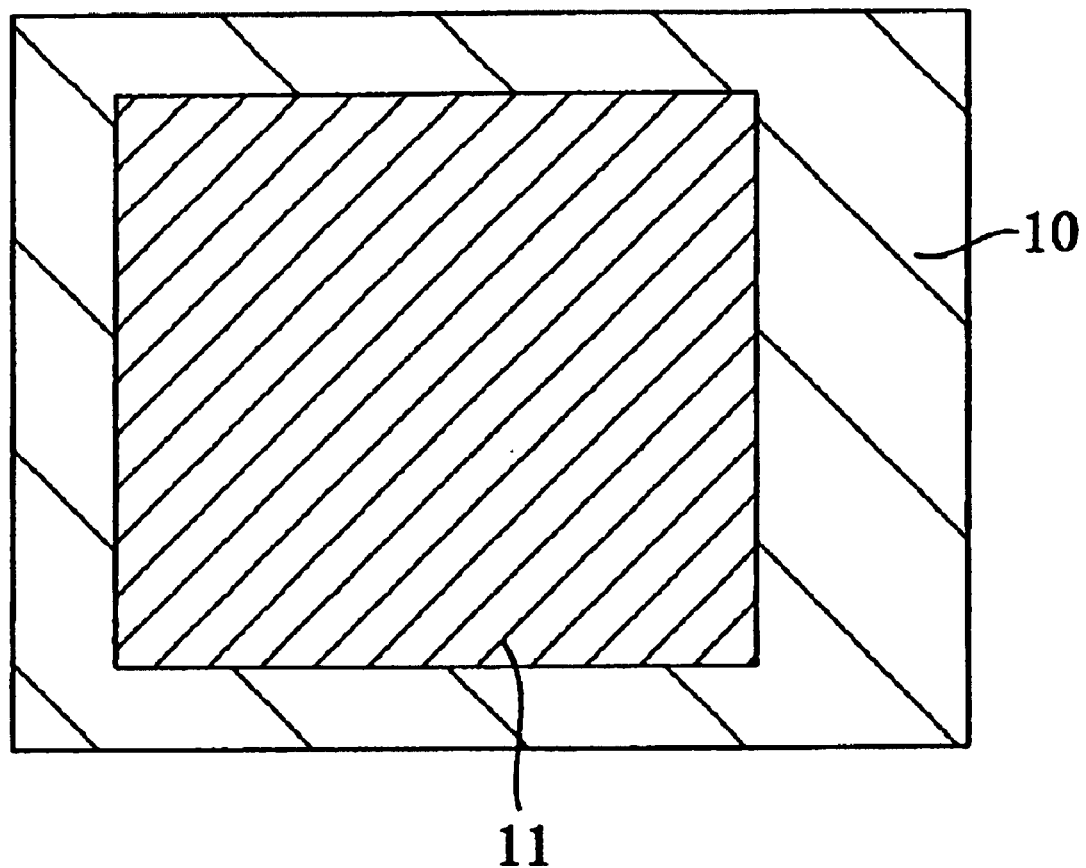

First, referring to FIGS. 1A and 1B, illustrated are a cross-sectional view and a plan view showing the process step of forming a cavity defining sacrificial layer. In the process step shown in FIGS. 1A and 1B, a selected surface area of a semiconductor substrate 10 is locally oxidized thermally by a known LOCOS process. The semiconductor substrate 10 for use in this preferred embodiment is preferably a single crystalline silicon wafer. Thus, a cavity defining insulating film 11 of silicon dioxide is formed as a thermal oxide as a result of this thermal oxidation process.

In the accompanying drawings, the cavity defining insulating film 11 is illustrated as being located in just one surface area of the semiconductor substrate 10. However, the cavity defining insulating film 11 may be naturally formed in multiple surface areas of the same semiconductor substrate 10 at the same time. In the following description of preferred embodiments, a method of forming just one cavity on the semiconductor substrate 10 will be described for the sake of simplicity. However, a method of forming multiple cavities on the same substrate at the same time should be readily understandable to those skilled in the art by reference to the disclosure of the present application.

In a preferred embodiment of the present invention, various types of circuits (e.g., control circuits) are preferably provided on other non-illustrated areas of the semiconductor substrate 10 for the purpose of operating the sensor normally. Those circuits may be formed on the semiconductor substrate 10 by known semiconductor integrated circuit technologies. If an integrated circuit including transistors as its circuit components is formed on the semiconductor substrate 10, then the respective MISFETs of the integrated circuit need to be electrically isolated from each other. Such electrical isolation is achieved by forming an isolation film on the semiconductor substrate 10. To reduce the number of manufacturing process steps required, the process step of forming the isolation film is preferably carried out as the process step of forming the cavity defining insulating film 11.

In this preferred embodiment, the cavity defining insulating film 11 preferably has a thickness of about 0.4 µm to about 1 µm and preferably has a rectangular planar shape of approximately 30 µm square to approximately 100 µm square. It should be noted, however, that the planar layout of the cavity defining insulating film 11 does not have to be rectangular but may also be any other shape.

Also, the cavity defining insulating film 11 does not have to be formed by the LOCOS process but may be formed by any other process. For example, a trench isolation process may also be adopted. In that case, trenches are preferably formed in advance on the surface of the semiconductor substrate 10, and then filled with an insulating film to be deposited by a thin film deposition process such as a CVD process, for example.

Figure 2A:
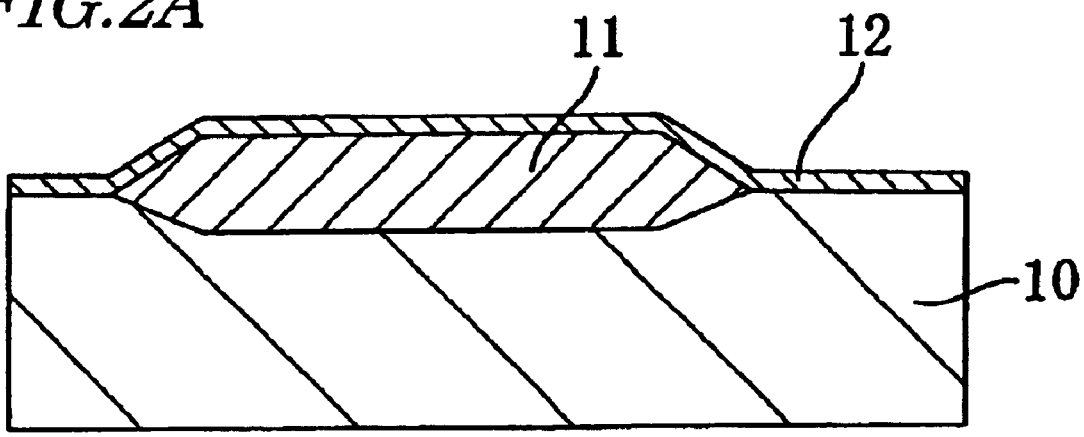
FIGS. 2A and 2B are respectively a cross-sectional view and a plan view showing the process step of forming a silicon nitride layer on the substrate.
Figure 2B:
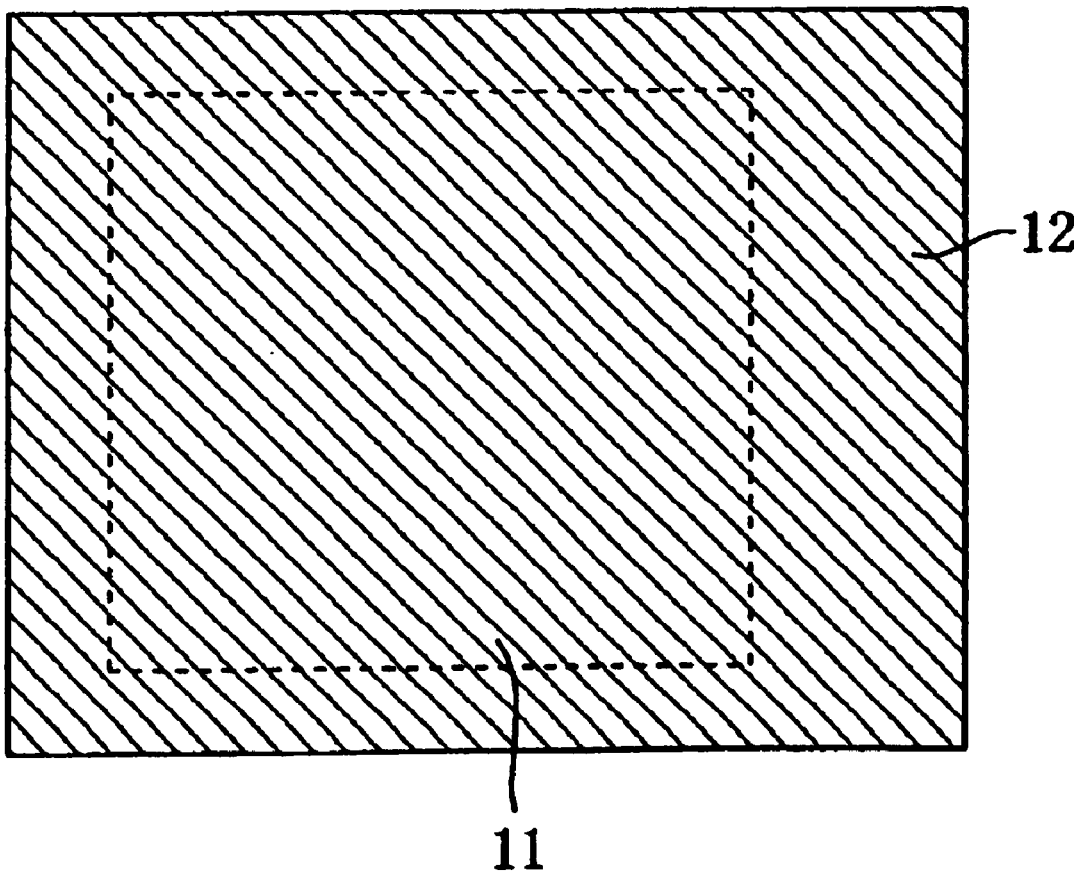

Next, referring to FIGS. 2A and 2B, illustrated are a cross-sectional view and a plan view showing the process step of forming a silicon nitride layer, functioning as an etch stop layer, on the semiconductor substrate 10.

In the process step shown in FIGS. 2A and 2B, a silicon nitride layer 12 is preferably deposited by a CVD process to a thickness of about 200 nm to about 400 nm on the semiconductor substrate 10 and the cavity defining insulating film 11. This process step is preferably carried out with the substrate 10 heated to, and maintained at, about 760° C.

Figure 3A:
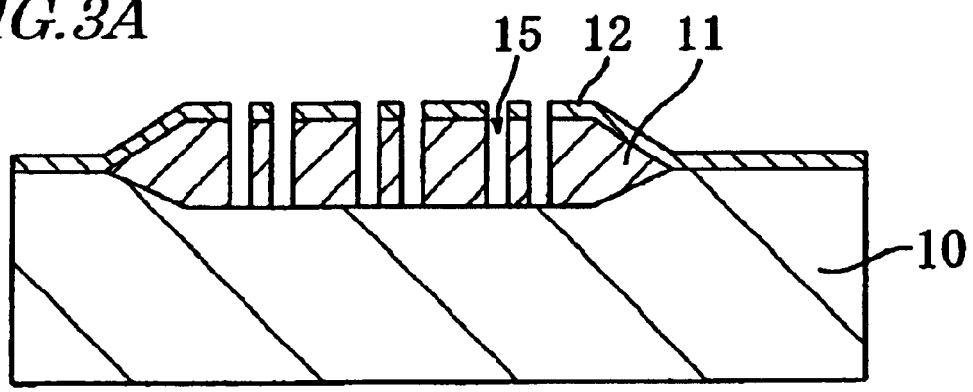
FIGS. 3A and 3B are respectively a cross-sectional view, taken on the plane IIIa—IIIa shown in FIG. 3B, and a plan view showing the process step of forming cavity defining openings.
Figure 3B:
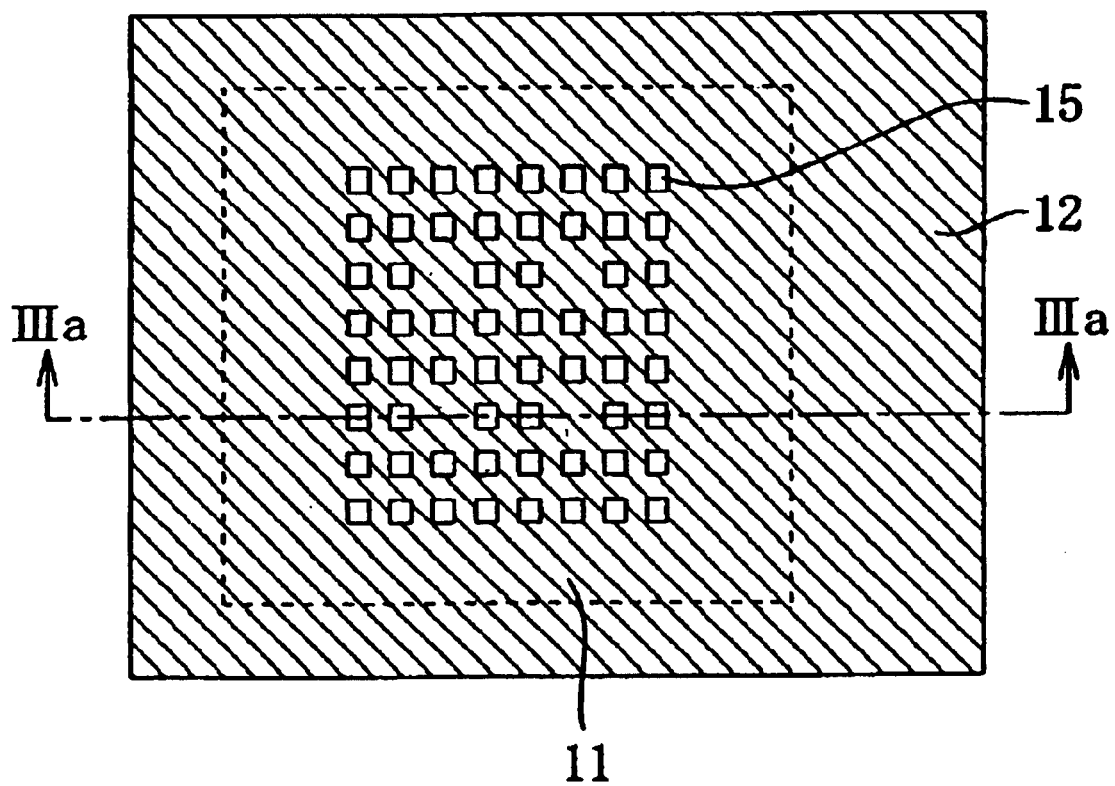

FIG. 3B is a plan view showing the process step of forming cavity defining openings (i.e., the first opening) and FIG. 3A is a cross-sectional view thereof as taken on the plane IIIa—IIIa shown in FIG. 3B.

In the process step shown in FIGS. 3A and 3B, first, a resist mask (not shown) is preferably defined by a photolithographic process on the silicon nitride layer 12. This resist mask preferably has a pattern that defines the cavity defining openings 15 to extend through the silicon nitride layer 12 and the cavity defining insulating film 11. The cavity defining openings 15 preferably have the arrangement pattern shown in FIG. 3B and reach the surface of the silicon substrate 10. Such cavity forming openings 15 may be formed by removing the exposed portions of the silicon nitride layer 12, which are not covered with the resist mask, and then removing the exposed portions of the cavity defining insulating film 11 which are not covered with the resist mask. These etching process steps are preferably carried out by a dry etching technique that achieves sufficient anisotropy. These openings 15 may have a diameter of about 0.3 μm, for example.

As can be seen from FIG. 3B, the pitch between adjacent openings 15 increases at four locations. At these four locations, the cavity defining insulating film 11 will not be removed completely but left partially in the next process step of forming provisional cavities.

Figure 4A:
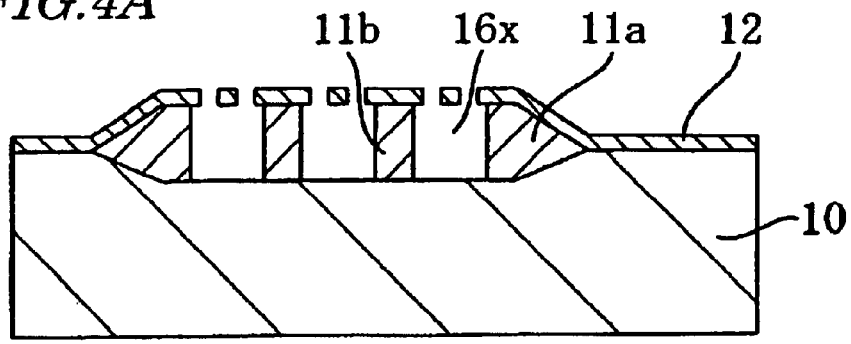
FIGS. 4A, 4B and 4C are respectively a vertical sectional view, taken on the plane IVa—IVa shown in FIG. 4B, a plan view and a partial transversal sectional view showing the process step of forming provisional cavities.
Figure 4B:
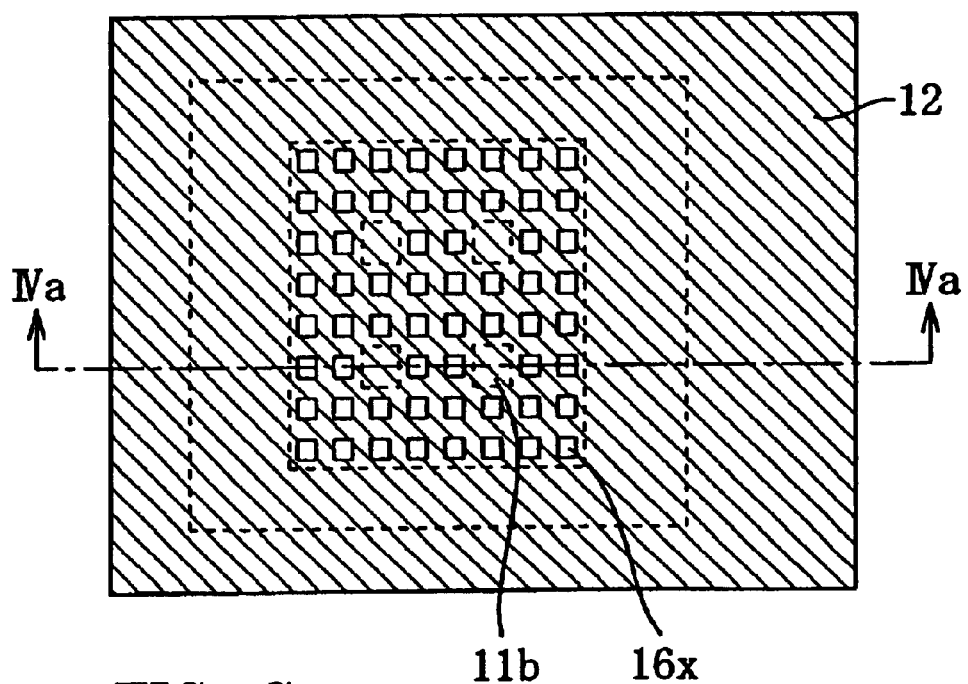
Figure 4C:
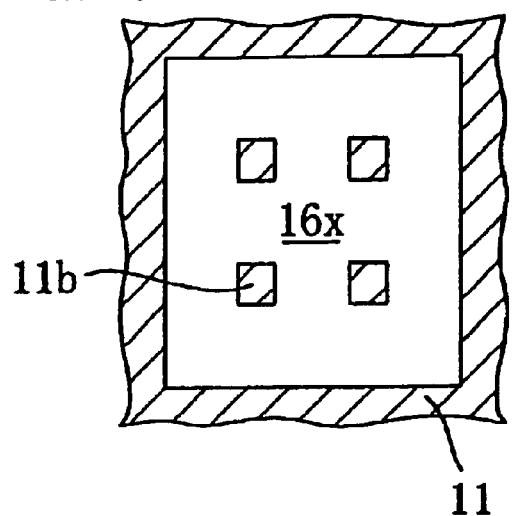

FIG. 4B is a plan view showing the process step of forming the provisional cavities, and FIG. 4A is a cross-sectional view thereof as taken on the plane IVa—IVa shown in FIG. 4B. In this process step, the cavity defining insulating film 11 is preferably wet-etched with buffered hydrofluoric acid, thereby forming the provisional cavities 16x and defining a supporting portion by the etch residues of the cavity defining insulating film 11. This supporting portion is preferably made up of walls 11a surrounding the provisional cavities 16x and four columns 11b, which are located among the provisional cavities 16x. The ceiling of the provisional cavities 16x (i.e., the etch stop layer) is supported by the walls 11a and the columns 16b, thereby preventing pieces of the silicon nitride layer 12 from dropping down and other unfavorable situations.

In the process step of forming the provisional cavities, an etchant for use to etch the cavity defining insulating film 11 isotropically is preferably supplied through the openings 15, which are arranged as shown in FIG. 3B, to the cavity defining insulating film 11. Since the etching action advances isotropically, not only portions of the cavity defining insulating film 11, which are located under the openings 15, but also other intermediate portions thereof, which are located between adjacent openings 15, are etched away. In the four locations at which the openings 15 are arranged at the increased pitch, the lateral etching action advances insufficiently from under the openings 15. As a result, the etch residues are left, thereby defining the columns 11b. In this preferred embodiment, if this etching process of forming the provisional cavities is carried out for too long a time, then the columns 11b will lose much of its thickness and disappear in the end. For that reason, the arrangement pitch of the openings 15 and the etching time need to be adjusted appropriately.

It should be noted that the number and locations of the columns 11b are not limited to those adopted in this preferred embodiment. Rather, a supporting portion having an arbitrary size or shape may be formed by changing the shape, size and planar layout of the openings 15 appropriately.

Figure 5A:
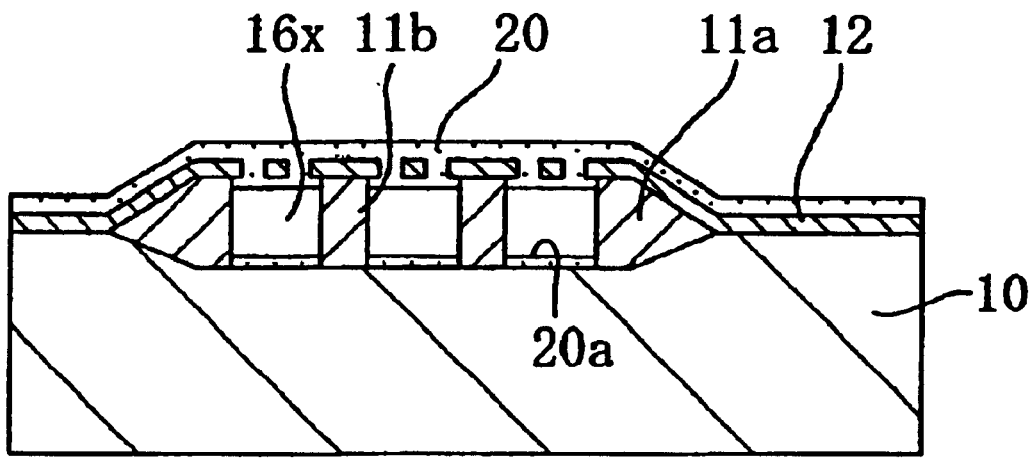
FIGS. 5A and 5B are respectively a cross-sectional view, taken on the plane Va—Va shown in FIG. 5B, and a plan view showing the process step of temporarily closing the provisional cavities.
Figure 5B:
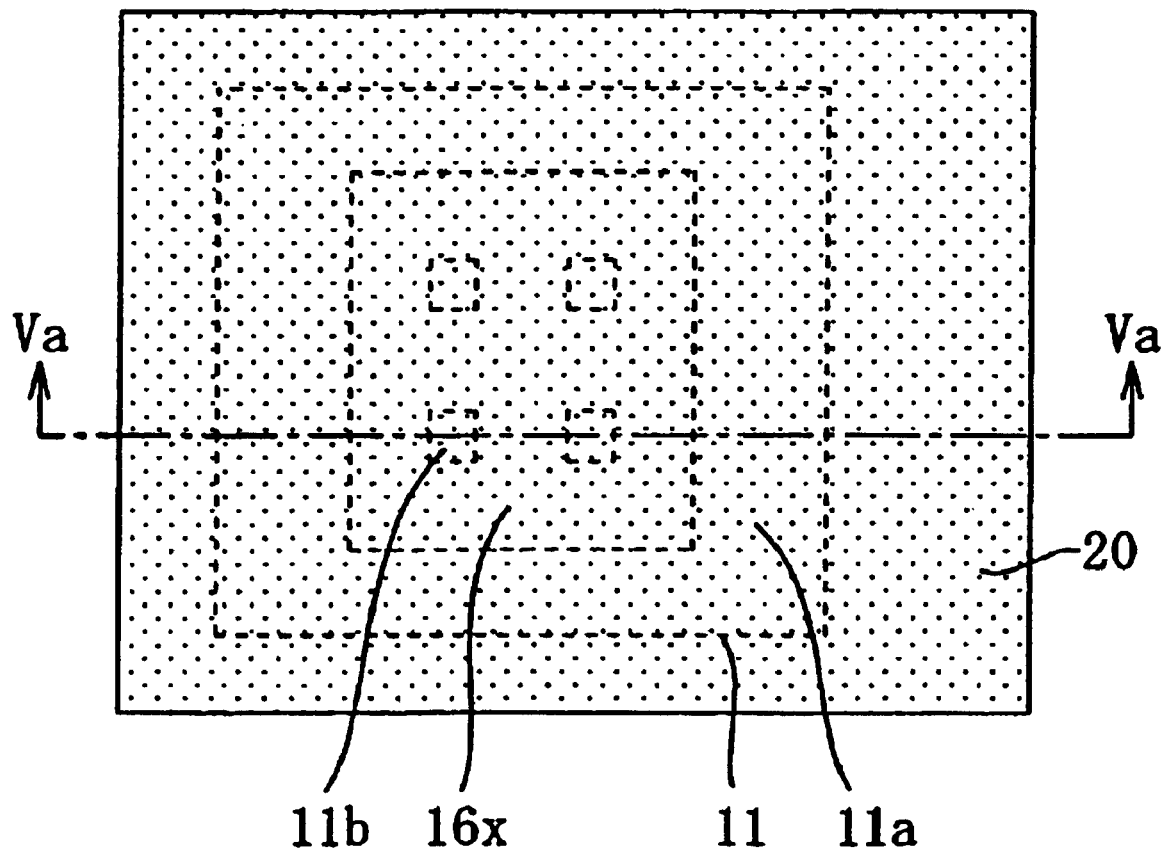

Next, the process step of temporarily closing up the openings 15 that were provided to form the provisional cavities is carried out. FIG. 5B is a plan view illustrating that process step, and FIG. 5A is a cross-sectional view thereof as taken on the plane Va—Va shown in FIG. 5B. In this process step, a silicon dioxide layer 20 is deposited by a CVD process to a thickness of about 350 nm over the semiconductor substrate 10. The silicon dioxide layer 20 is preferably formed by supplying a TEOS source gas.

As a result, the cavity defining openings 15, which the silicon nitride layer 12 as the ceiling of the provisional cavities 16x has had until the previous process step, are closed up with the silicon dioxide layer 20 deposited. The silicon dioxide layer 20 is deposited by heating the substrate to about 680° C., which is much lower than the temperature of the substrate (e.g., about 900° C.) when the polysilicon film is thermally oxidized.

For a certain period of time after the process step of depositing the silicon dioxide layer 20 has been started, those openings 15 are still not closed entirely. Thus, an additional oxide layer is deposited on the bottom of the provisional cavities 16x. Such an oxide layer will be referred to herein as a "bottom oxide layer 20a".

Subsequently, as shown in FIGS. 6A and 6B, the process step of depositing a resistor for the bolometer on the silicon dioxide layer 20 is carried out. FIG. 6B is a plan view illustrating the layout of a patterned resistor for the bolometer, and FIG. 6A is a cross-sectional view thereof as taken on the plane VIa—VIa shown in FIG. 6B.

In this process step, a polysilicon film is deposited to a thickness of about 500 nm over the semiconductor substrate 10 and then patterned by photolithographic and etching techniques. By patterning the polysilicon film, an approximately S-shaped resistor 21 may be defined for the bolometer, for example. This resistor 21 will eventually function as an infrared detector for the resultant infrared sensor. The resistor 21 is preferably provided so as not to overlap with the columns 11b among the provisional cavities 16x. In other words, no columns 11b should be located right under the resistor 21 for the bolometer.

Figure 7A:
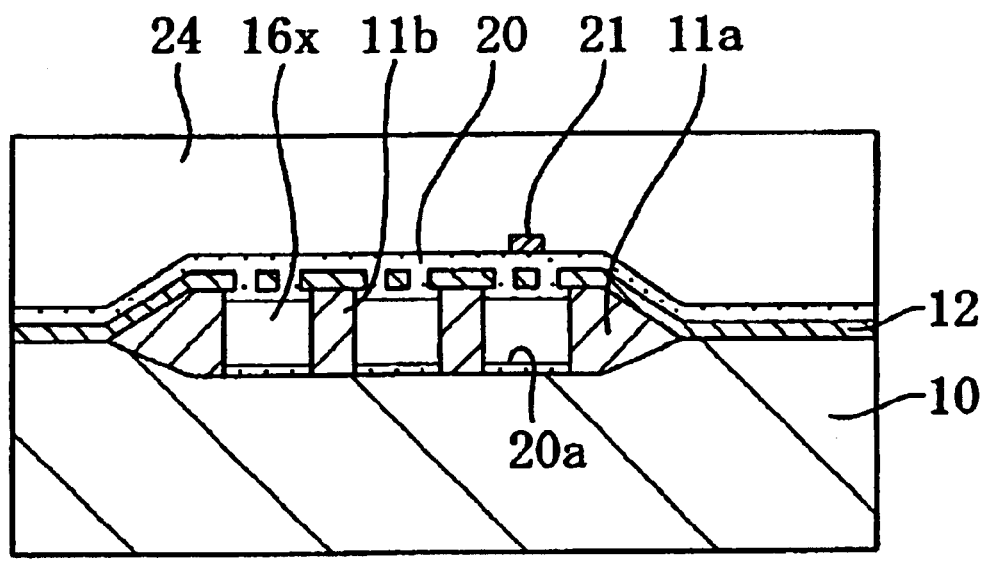
FIGS. 7A and 7B are respectively a cross-sectional view, taken on the plane VIIa—VIIa shown in FIG. 7B, and a plan view showing the process step of forming an interlevel dielectric film.
Figure 7B:
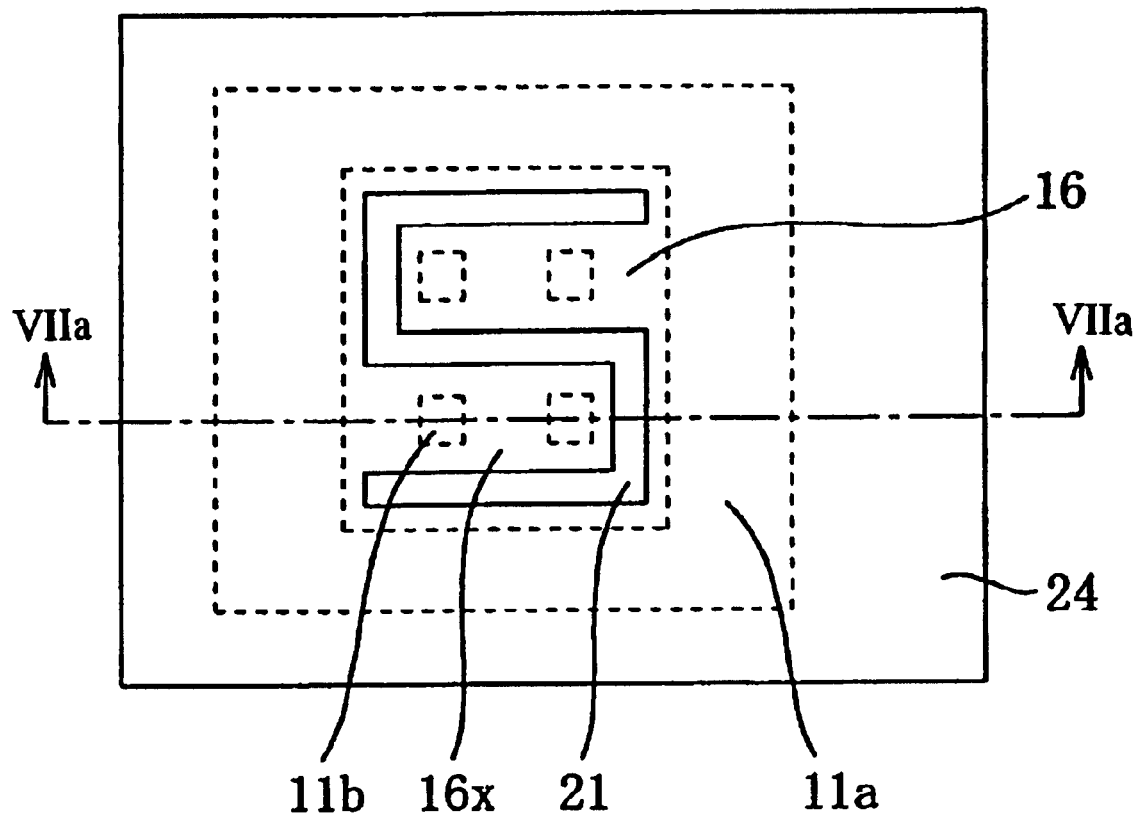

Next, as shown in FIGS. 7A and 7B, the process step of forming an interlevel dielectric film is carried out. FIG. 7B is a plan view, and FIG. 7A is a cross-sectional view thereof as taken on the plane VIIa—VIIa shown in FIG. 7B. In this process step, an interlevel dielectric film 24 of BPSG (boro phospho silicate glass) is deposited to a thickness of about 700 nm to about 1 μm over the silicon dioxide layer 20 and the resistor 21 for the bolometer. This interlevel dielectric film 24 will eventually function as an infrared radiation absorbing film.

Figure 8A:
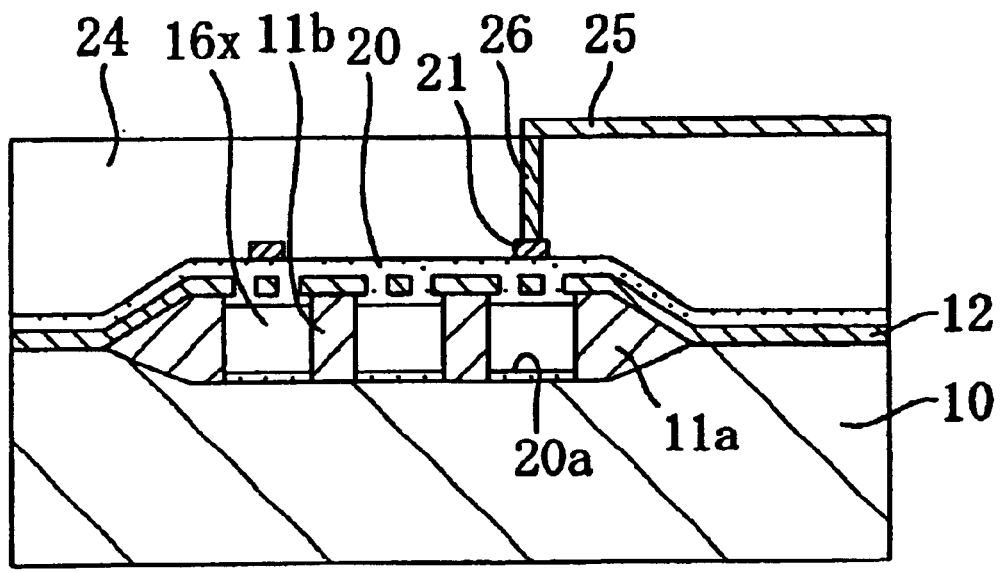
FIGS. 8A and 8B are respectively a cross-sectional view, taken on the plane VIIIa—VIIIa shown in FIG. 8B, and a plan view showing the process step of forming an interconnect for the bolometer.
Figure 8B:
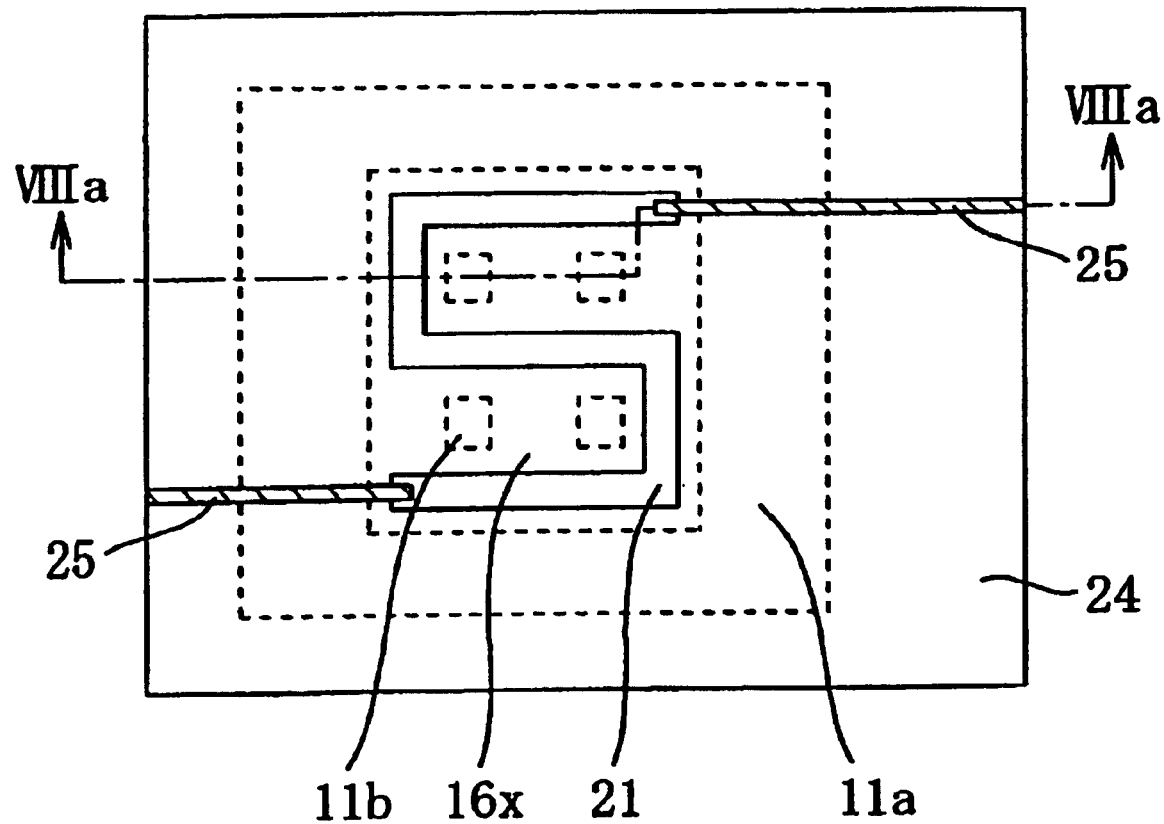

Subsequently, as shown in FIGS. 8A and 8B, the process step of forming interconnects for the bolometer is carried out. FIG. 8B is a plan view illustrating a layout for the interconnects, and FIG. 8A is a cross-sectional view thereof as taken on the plane VIIIa—VIIIa shown in FIG. 8B.

In this process step, first, two holes are opened by photolithographic and dry etching processes so as to extend vertically through the interlevel dielectric film 24 and reach both terminals of the resistor 21 for the bolometer. Thereafter, these two holes are filled with tungsten (W), thereby forming two plugs 26 that are respectively connected to the two terminals of the resistor 21 for the bolometer. Furthermore, an Al alloy film is deposited on the interlevel dielectric film 24 and then patterned, thereby defining two interconnects 25 that are connected to the two plugs 26, respectively. These interconnects 25 will be used to electrically connect a pixel region in which the bolometer is provided to a peripheral circuit. As will be described later, the resistor 21 changes its electrical resistance depending on whether the resistor 21 is exposed to infrared radiation or not. Accordingly, by sensing the variation in the electrical resistance of the resistor 21 by the amount of current flowing through the interconnects 25, the infrared exposure dose of the infrared sensor can be detected.

Figure 9A:
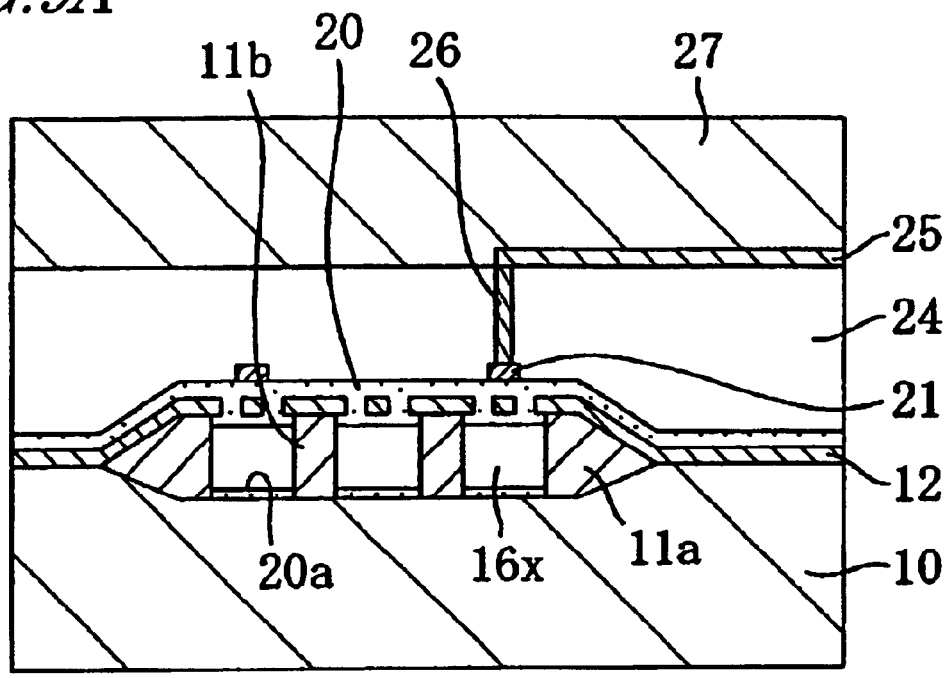
FIGS. 9A and 9B are respectively a cross-sectional view, taken on the plane IXa—IXa shown in FIG. 9B, and a plan view showing the process step of forming a passivation film.
Figure 9B:
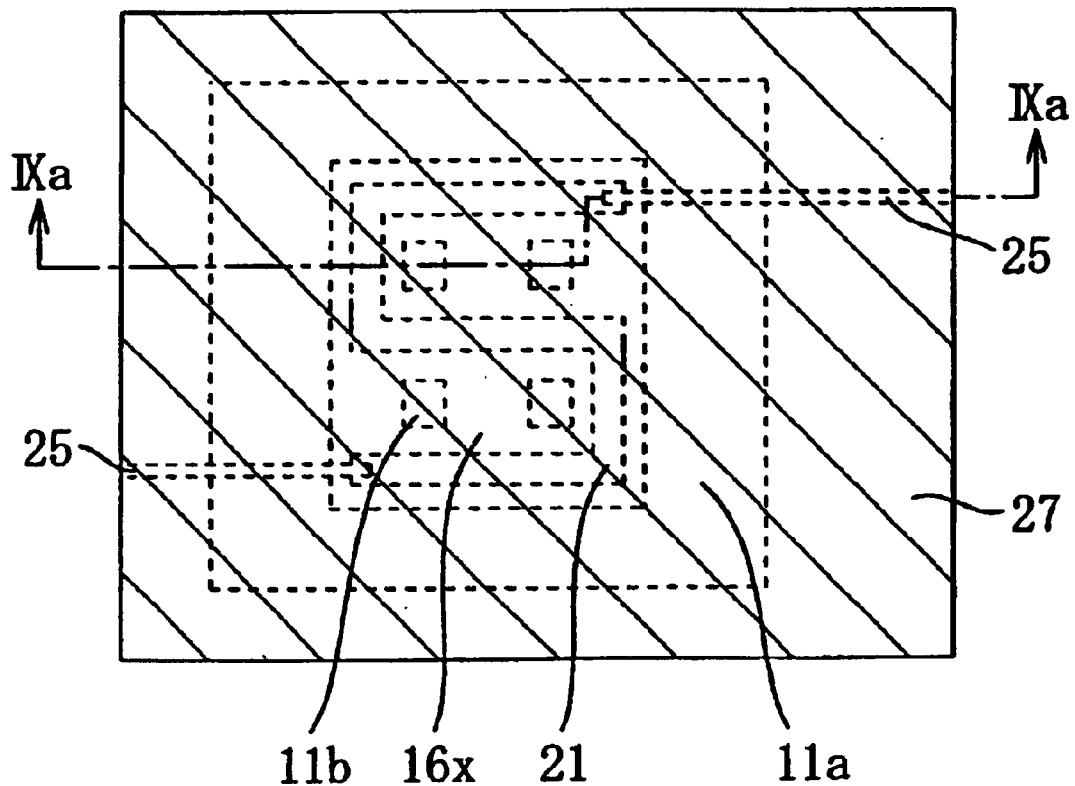

Thereafter, the process step of forming a passivation film is carried out. FIG. 9B is a plan view illustrating a structure already including the passivation film, and FIG. 9A is a cross-sectional view thereof as taken on the plane IXa—IXa shown in FIG. 9B. In this process step, a passivation film 27 of silicon nitride is preferably deposited over the interlevel dielectric film 24 and the interconnects 25. The passivation film 27 functions not only as a protective insulating film but also as an infrared radiation absorbing layer. The passivation film 27 may be deposited at about 400° C., for example.

Figure 10A:
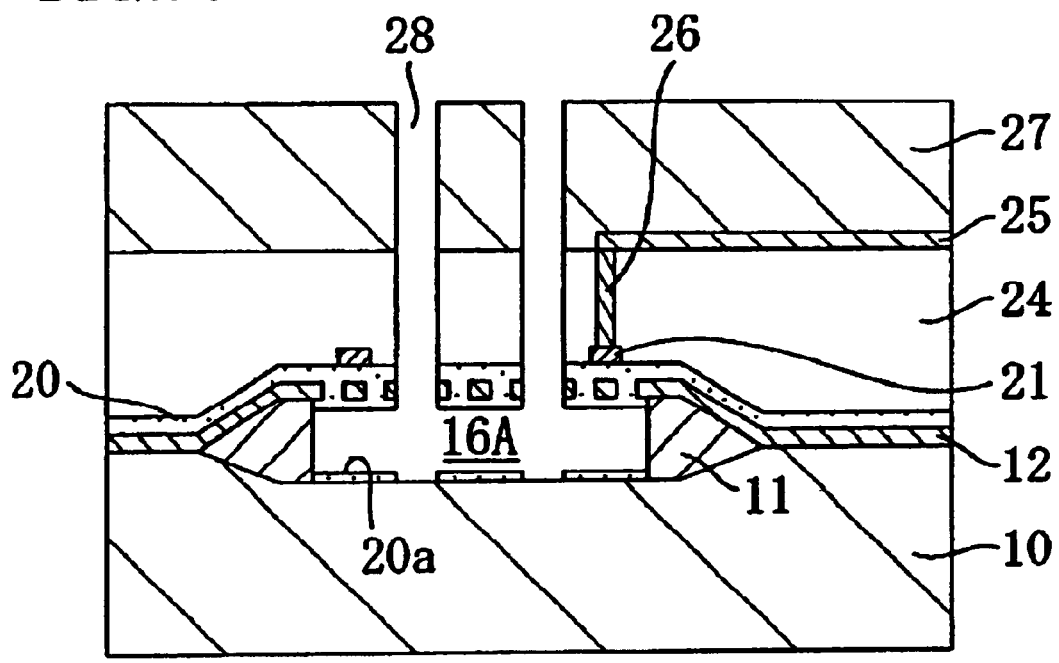
FIGS. 10A and 10B are respectively a cross-sectional view, taken on the plane Xa—Xa shown in FIG. 10B, and a plan view showing the process step of forming a final cavity.
Figure 10B:
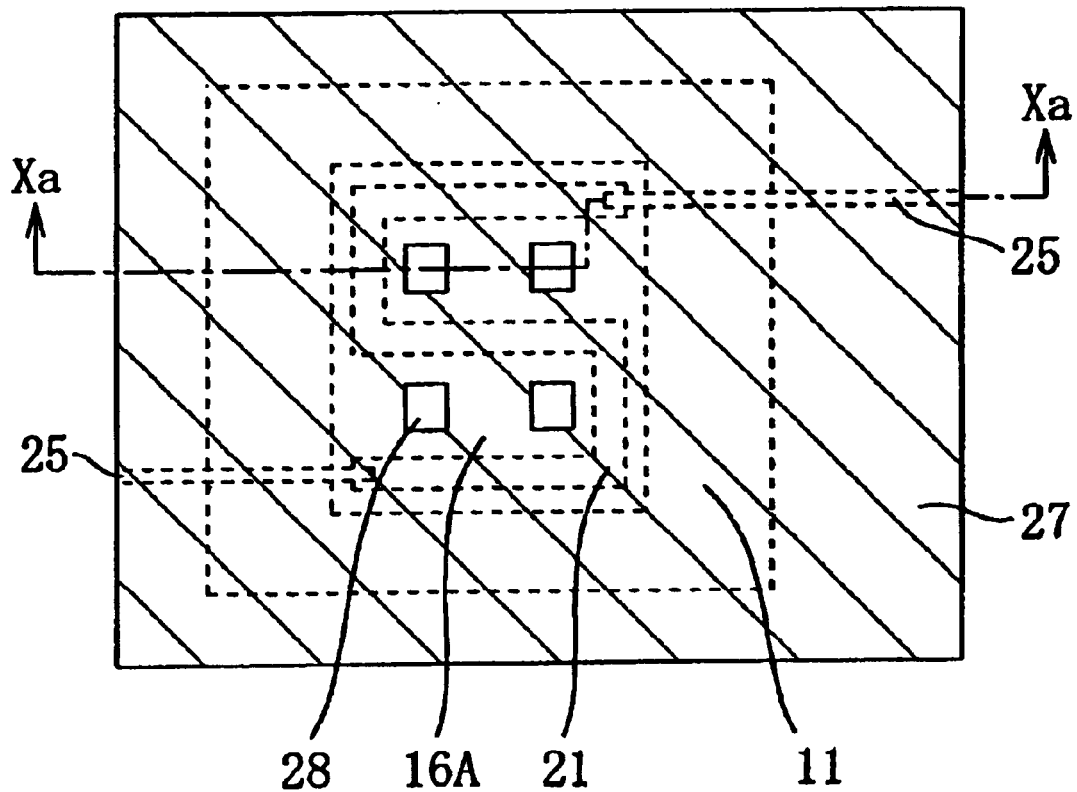

Finally, the process step of defining a final cavity is carried out. FIG. 10B is a plan view illustrating a structure in which the final cavity has already been defined, and FIG. 10A is a cross-sectional view thereof as taken on the plane Xa—Xa shown in FIG. 10B. In this process step, portions of the passivation film 27, interlevel dielectric film 24, silicon dioxide layer 20 and silicon nitride layer 12, which have been located over the columns 11b, are removed by photolithographic and dry etching techniques, thereby forming holes (i.e., the second openings) 28. Thereafter, the columns 11b, located among the provisional cavities 16x, are also etched away through the holes 28. As a result of this process step, at least the upper half of the columns 11b is removed, thereby defining a final cavity 16A, which has a greater inner volume than the total inner volume of the provisional cavities. In the example illustrated in FIG. 10A, the columns 11b are removed completely and the bottom oxide layer 20a is also removed partially.

In the preferred embodiment described above, the columns 11b are formed in the process step shown in FIGS. 4A and 4B. Alternatively, walls may be laid out as a supporting portion so as not to be overlapped by the resistor 21 for the bolometer. If such walls are provided, the holes 28 should be opened over those walls, and the walls should be removed at least partially (preferably entirely) by an etching process, in the process step shown in FIGS. 10A and 10B.

In the manufacturing process of this preferred embodiment, the supporting portion, including the columns and walls, is removed at least partially from inside of the final cavity 16A. As a result, the supporting portion is removed entirely, or at least the connections between the supporting portion and the etch stop layer are cut off, thus reducing a thermal conductance to be created between the resistor 21 for the bolometer and the silicon substrate. Consequently, the infrared spectral responsivity or resolution can be improved.

In the preferred embodiment described above, the cavity defining openings 15 of the silicon nitride layer 12, functioning as the etch stop layer, are closed up with the CVD oxide layer. If the openings 15 are closed up by oxidizing a polysilicon film, then a high-temperature process must be carried out, the respective members of the ceiling may be deformed excessively, and the ceiling itself may collapse. According to this preferred embodiment, however, no such high-temperature processes are required. This is advantageous particularly when transistors, for example, need to be provided on the semiconductor substrate 10 separately from the infrared detectors, because the characteristics of the transistors might be affected by such high-temperature processes.

In the preferred embodiment described above, a LOCOS film is used as the cavity defining insulating film 11. Alternatively, the LOCOS film may be replaced with a trench isolation film such as a shallow trench isolation (STI) film.

Also, the resistor 21 for the bolometer may also be made of Ti, TiO, Pt or $VO_x$, not just polysilicon. Each of these alternative materials also changes its electrical resistance when its temperature rises responsive to the incident infrared radiation. Thus, these materials may also be used for variable-resistance infrared detectors (i.e., bolometers).

In the infrared sensor of this preferred embodiment, the total thickness of the passivation film 27 and interlevel dielectric film 24 is preferably about 1 $\mu$m to about 2 $\mu$m (e.g., about 1.6 $\mu$m). The reason is as follows. Specifically, if the total thickness of these films is about 1 $\mu$m or more, then the infrared absorption coefficient can be kept sufficiently high. And if the total thickness of these films is about 2 $\mu$m or less, then these films will not have an excessive heat capacity.

Generally speaking, if a silicon process is adopted to form bolometers as infrared detectors, then high-temperature treatment must be carried out in a number of process steps, thus creating an internal stress due to a difference in thermal expansion coefficient (or shrinkage coefficient) among respective members of the bolometers. Thus, the conventional method of fabricating an infrared sensor by utilizing a silicon process has the following drawbacks:

If the number or the transversal cross-sectional area of the columns to support the ceiling of the cavities is decreased, then the ceiling of the cavities will have a decreased mechanical strength. In that case, the cavities might be blocked with the ceiling collapsed during the manufacturing process of the infrared sensor; but If the number or the transversal cross-sectional area of the columns to support the ceiling of the cavities is increased, then the infrared detectors (i.e., bolometers) cannot be thermally insulated from the substrate sufficiently, thus decreasing the responsivity of the infrared sensor.

Hereinafter, it will be described in detail exactly how such problems are caused by a tensile stress to be applied to a silicon nitride layer grown. FIGS. 11A through 11D are perspective views showing the problems of a conventional infrared sensor manufacturing process to be compared with the process of this preferred embodiment. On the other hand, FIGS. 12A through 12C are perspective views showing the advantages of the infrared sensor manufacturing process of this preferred embodiment.

Figure 11A:
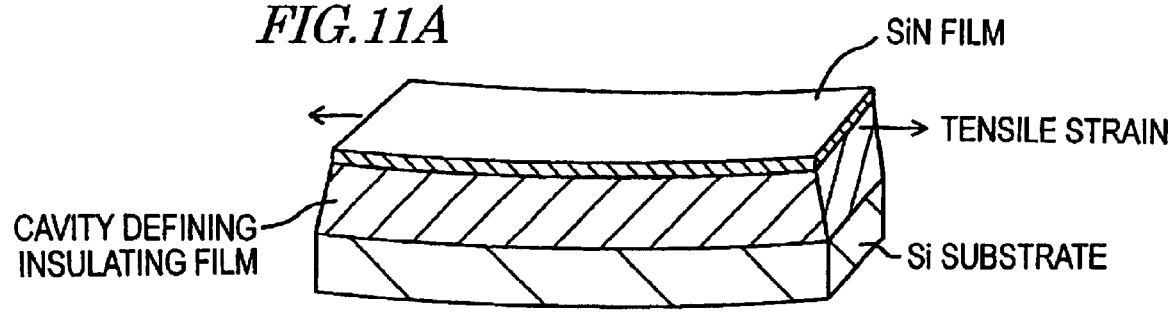
FIGS. 11A through 11D are perspective views showing the problems of a conventional infrared sensor manufacturing process to be compared with the manufacturing process of the first preferred embodiment.
Figure 12A:
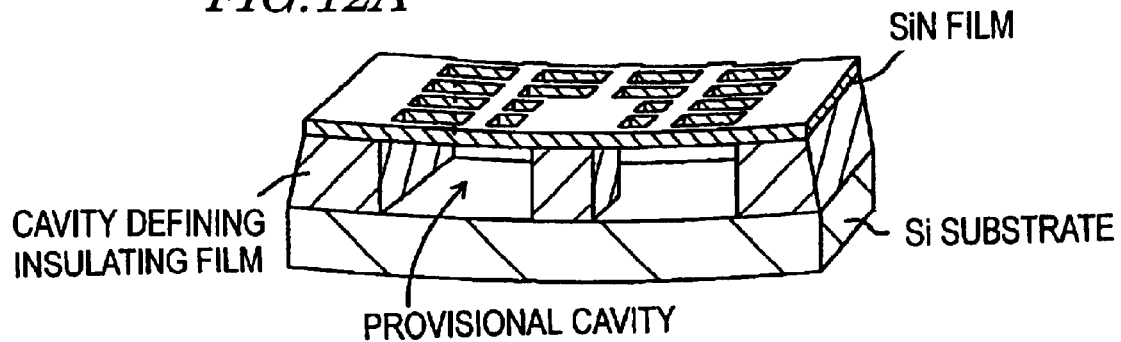
FIGS. 12A through 12C are perspective views showing the advantages of the infrared sensor manufacturing process of the first preferred embodiment.
Figure 12B:
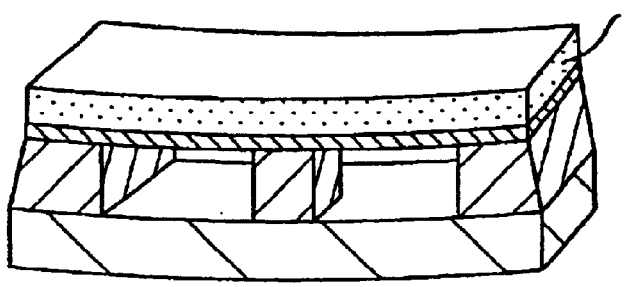
Figure 12C:
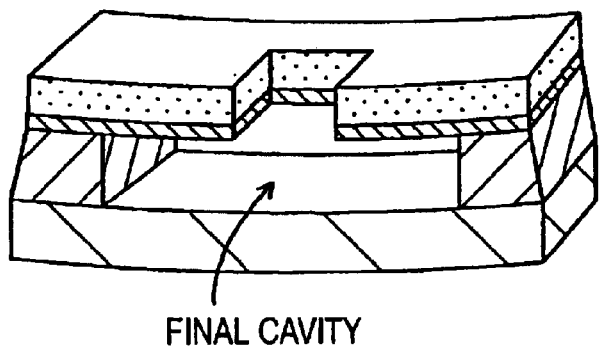

In the conventional manufacturing process, first, a silicon nitride layer is deposited by a CVD process on a cavity defining insulating film as shown in FIG. 11A. Thereafter, when the temperature of the substrate is decreased to its normal temperature, the substrate will be warped upward, thus creating a tensile stress in the silicon nitride layer. The situation shown in FIG. 11A corresponds to the process step shown in FIGS. 2A and 2B. Such a stress is created due to a difference in thermal expansion coefficient (or shrinkage coefficient) between the silicon nitride layer and the silicon substrate or due to structural defects that produce depending on the growth conditions. According to a document entitled "Applied Physics Data Book" (published by Maruzen Co., Ltd., p. 528), when a silicon nitride layer is deposited on a silicon substrate, a huge tensile stress of about $10^{-10}$ dyn/$cm^2$ is applied to the silicon nitride layer in such a situation.

Figure 11B:
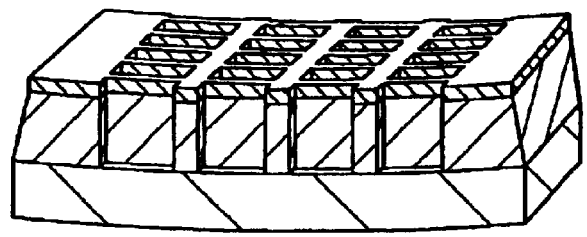

Next, when holes are formed by a dry etching process so as to extend through the silicon nitride layer and the cavity defining insulating film as shown in FIG. 11B, an even greater tensile stress is applied to the silicon nitride layer. The situation shown in FIG. 11B corresponds to the process step shown in FIGS. 3A and 3B.

Figure 11C:
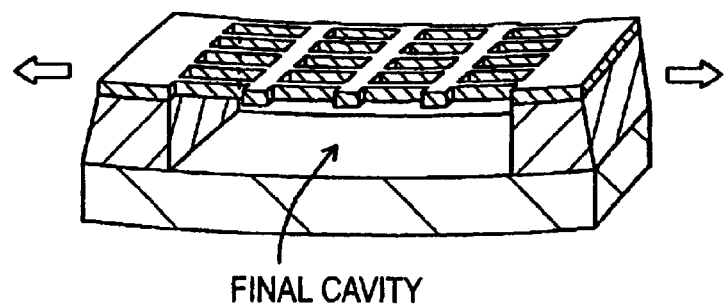
Figure 11D:
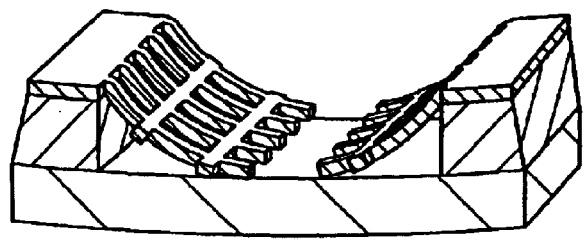

Suppose a final cavity is defined after that by a wet etching process with no columns or walls left as shown in FIG. 11C for the purpose of increasing the responsivity of the infrared sensor. In that case, if the final cavity is defined by removing the cavity defining insulating film of silicon dioxide completely, then the stress will be concentrated on the silicon nitride layer, thus partially cracking the silicon nitride layer. As a result, pieces of the silicon nitride layer might drop down into the final cavity as shown in FIG. 11D.

On the other hand, in the manufacturing process of this preferred embodiment, after the holes have been defined as shown in FIG. 11B, provisional cavities are once defined by a wet etching process with columns left as shown in FIG. 12A (corresponding to the process step shown in FIGS. 4A and 4B) unlike the conventional process step shown in FIG. 11C. At this point in time, the silicon nitride layer is still supported by the columns. Thus, it is possible to prevent the silicon nitride layer from being cracked or collapsed as shown in FIG. 11D.

Thereafter, as shown in FIG. 12B, the openings of the ceiling for the provisional cavities are closed up with a TEOS film, and then an interlevel dielectric film and a passivation film are deposited thereon in this order (in the process step shown in FIGS. 5A and 5B and in the process step shown in FIGS. 6A and 6B). At this point in time, the silicon nitride layer has been reinforced with the TEOS film, interlevel dielectric film and passivation film. In the manufacturing process of this preferred embodiment, a resistor for a bolometer is actually provided between the TEOS film and the interlevel dielectric film. However, the illustration of such a resistor is omitted from FIG. 12B for the sake of simplicity.

Subsequently, as shown in FIG. 12C, the columns between the provisional cavities are removed to define a final cavity (in the process step shown in FIGS. 10A and 10B). In the manufacturing process of this preferred embodiment, interconnects are actually formed on the interlevel dielectric film. However, the illustration of the interconnects is omitted from FIG. 12C for the sake of simplicity.

Thus, according to the manufacturing process of this preferred embodiment, an infrared sensor with a sufficiently high infrared spectral responsivity or resolution can be provided while preventing the silicon nitride layer, which functions not only as an etch stop layer but also as a framework for the ceiling of the cavities, from being cracked or collapsed.

Embodiment 2

Hereinafter, a method for fabricating an infrared sensor according to a second specific preferred embodiment of the present invention will be described. In the manufacturing process of this second preferred embodiment, the respective process steps of the first preferred embodiment described above are also carried out as shown in FIGS. 1A through 10B until the final cavity is defined.

Figure 13A:
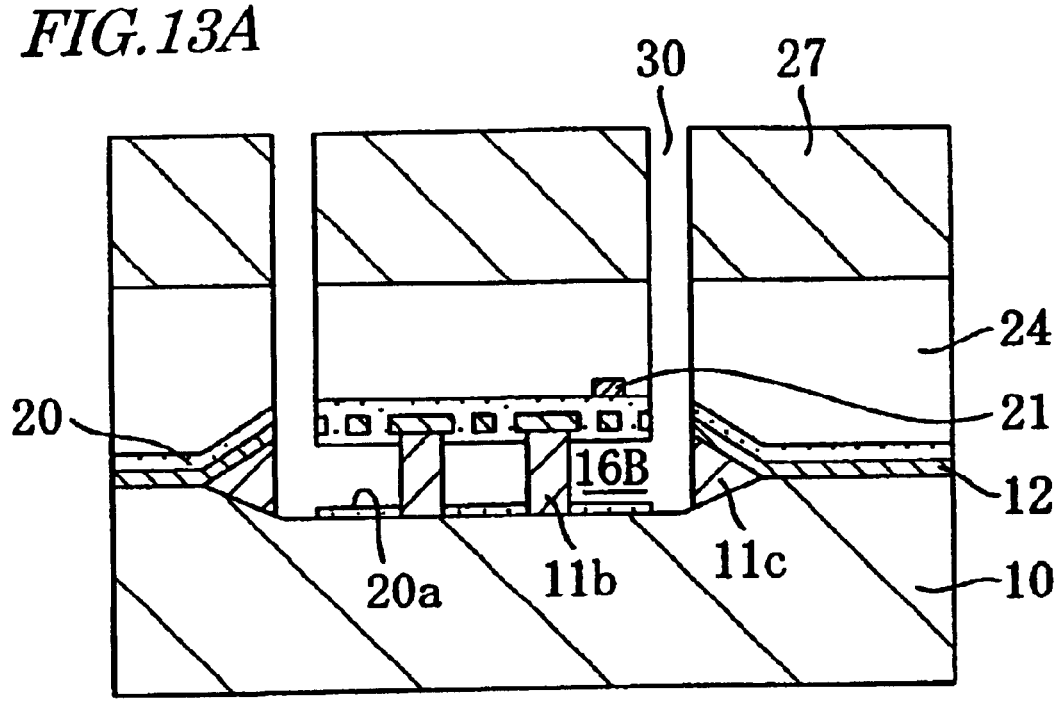
FIGS. 13A and 13B are respectively a cross-sectional view, taken on the plane XIIIa—XIIIa shown in FIG. 13B, and a plan view showing the process step of forming a final cavity according to a second specific preferred embodiment of the present invention.
Figure 13B:
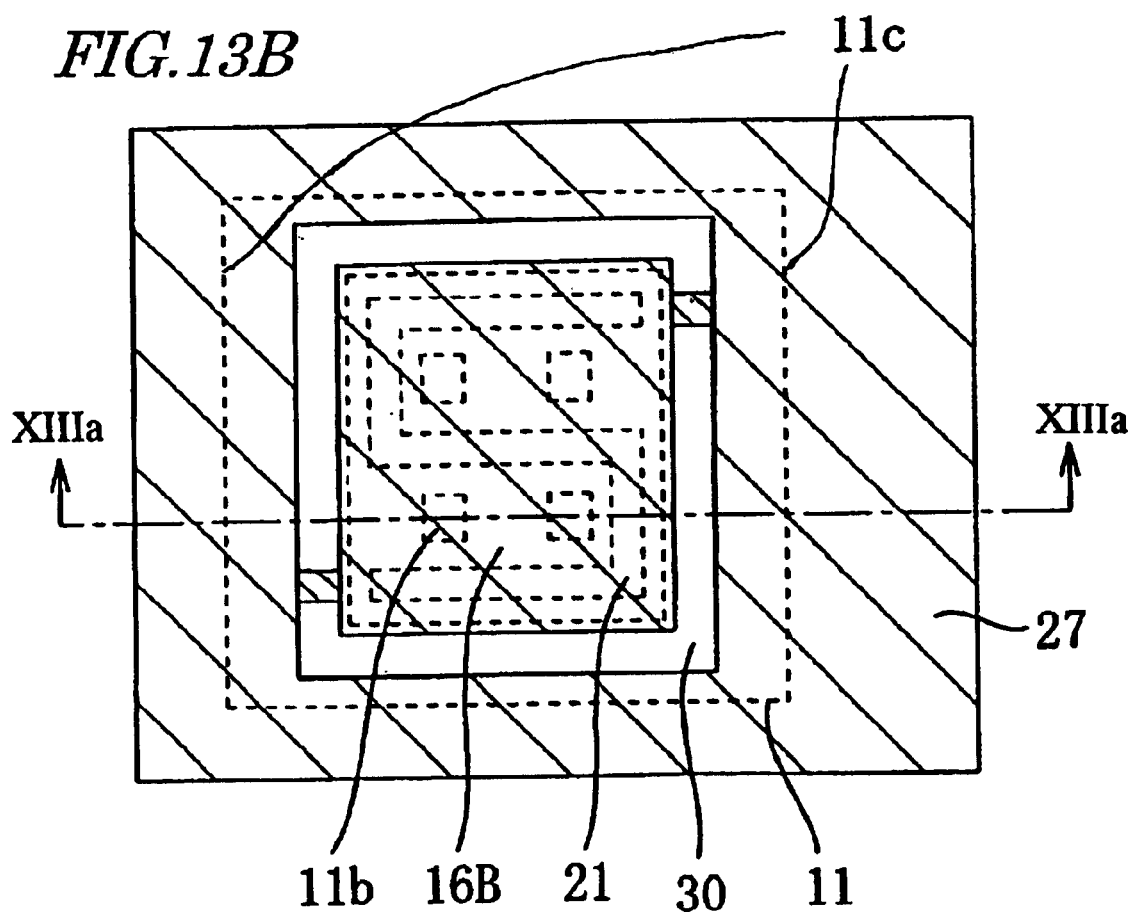

FIG. 13B is a plan view illustrating a structure in which the final cavity of this second preferred embodiment has just been defined, and FIG. 13A is a cross-sectional view thereof taken on the plane XIIIa—XIIIa shown in FIG. 13B.

In this second preferred embodiment, the locations and shape of a second group of openings to be defined by photolithographic and dry etching processes through the passivation film 27, interlevel dielectric film 24 and silicon nitride layer 12 are different from those of the counterparts of the first preferred embodiment described above. More specifically, in this second preferred embodiment, the holes 30 are defined as the second group of openings on a sidewall 11a that surrounds the provisional cavities 16x. Then, at least a portion of the sidewall 11a is etched away through the holes 30, thereby expanding the provisional cavities into a final cavity.

As a result of this etching process, the columns 11b are not etched but left, while the sidewall 11a is partially etched downward to be a sidewall 11c with a narrower width. Consequently, a final cavity 16B is defined so as to have a greater transversal sectional area than the total one of the provisional cavities. Also, as a result of the etching process, the bottom oxide layer 20a on the bottom of the final cavity 16B is also etched partially.

In the first preferred embodiment described above, all of the columns 11b are removed entirely from inside of the final cavity 16A. However, if the final cavity 16A has a relatively large transversal sectional area, then the members that make up the ceiling of the final cavity 16A might be cracked or collapsed. Thus, in this second preferred embodiment, the columns 11b are left and the sidewall 11a is partially removed, thereby improving the infrared spectral responsivity and resolution.

In this second preferred embodiment, the cavity defining openings 15 of the silicon nitride layer 12 are also closed up with the silicon dioxide layer 20 that has been deposited by a CVD process. Thus, as in the first preferred embodiment described above, the manufacturing process can be advanced without placing any excessive thermal strain onto the ceiling of the cavities. As a result, the effects of the first preferred embodiment are also achieved by this second preferred embodiment.

If the final cavity 16B has a transversal sectional area of about 1,000 $\mu m^2$ or more, then two to ten columns, each having a transversal sectional area of at least about 10 $\mu m^2$, are preferably left inside of the final cavity 16B. Then, the ceiling of the cavity 16B will not be cracked.

Conversely, when it is unlikely that the ceiling should collapse even if the columns 11b are removed, the holes 28 of the first preferred embodiment described above, as well as the holes 30, may be defined and then not just the sidewall 11a but the columns 11b may be etched either partially or entirely.

Embodiment 3

Hereinafter, a third specific preferred embodiment of the present invention will be described. In this preferred embodiment, a silicon substrate is used as the cavity defining layer (i.e., the cavity defining sacrificial layer).

Figure 14A:
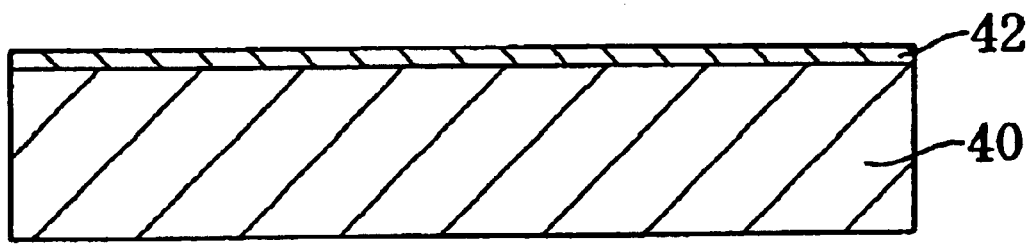
FIGS. 14A and 14B are respectively a cross-sectional view and a plan view showing the process step of forming a silicon nitride layer on a substrate according to a third specific preferred embodiment of the present invention.
Figure 14B:
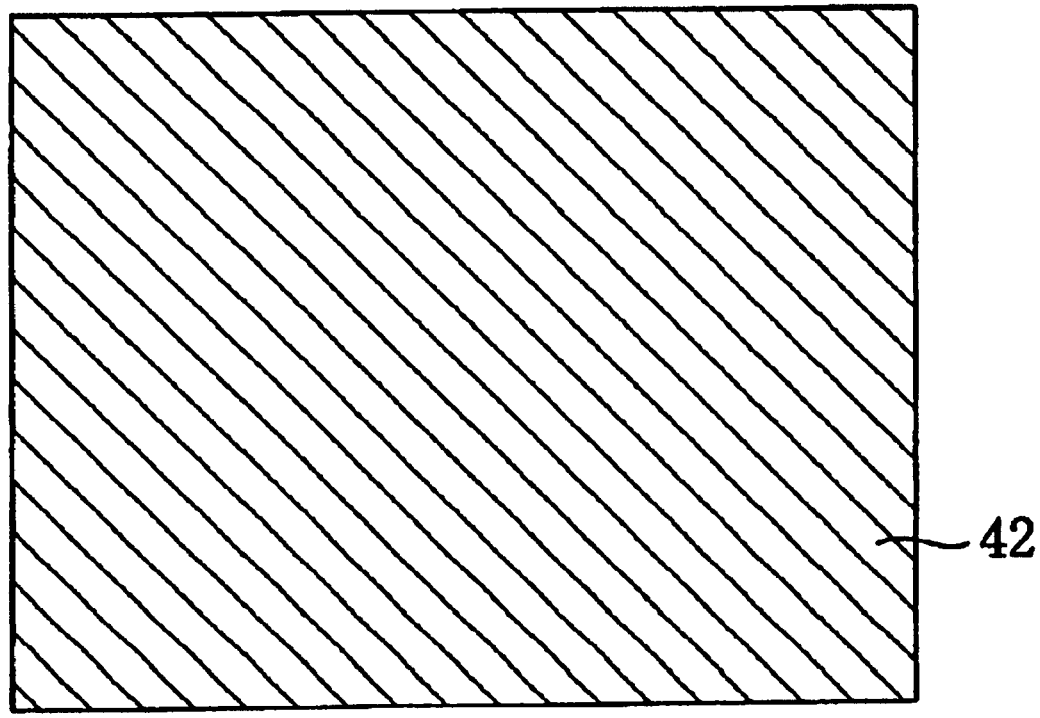

First, as shown in FIGS. 14A and 14B, the process step of forming a silicon nitride layer on a substrate 40 is carried out. FIG. 14B is a plan view illustrating the substrate 40 on which the silicon nitride layer 42 has been deposited, and FIG. 14A is a cross-sectional view thereof.

In this process step, the silicon nitride layer 42 is deposited by a CVD process to a thickness of about 200 nm to about 400 nm on the silicon substrate 40 that has been heated to, and maintained at, about 760° C. The silicon nitride layer 42 will function as an etch stop layer.

Figure 15A:
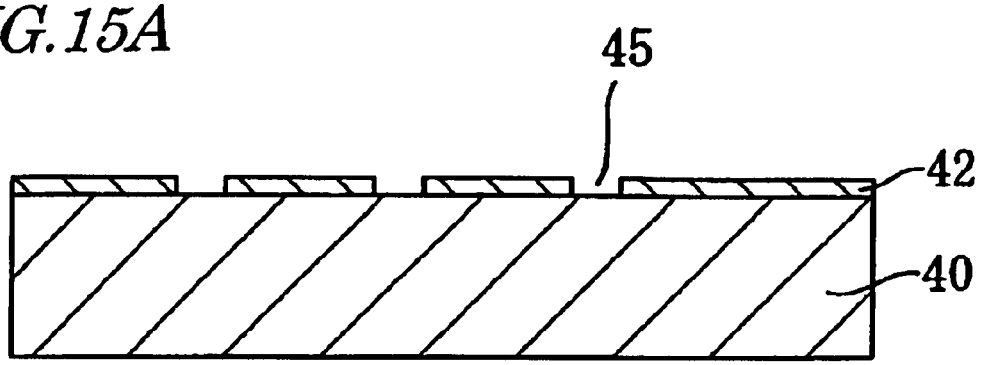
FIGS. 15A and 15B are respectively a cross-sectional view, taken on the plane XVa—XVa shown in FIG. 15B, and a plan view showing the process step of forming openings through the silicon nitride layer.
Figure 15B:
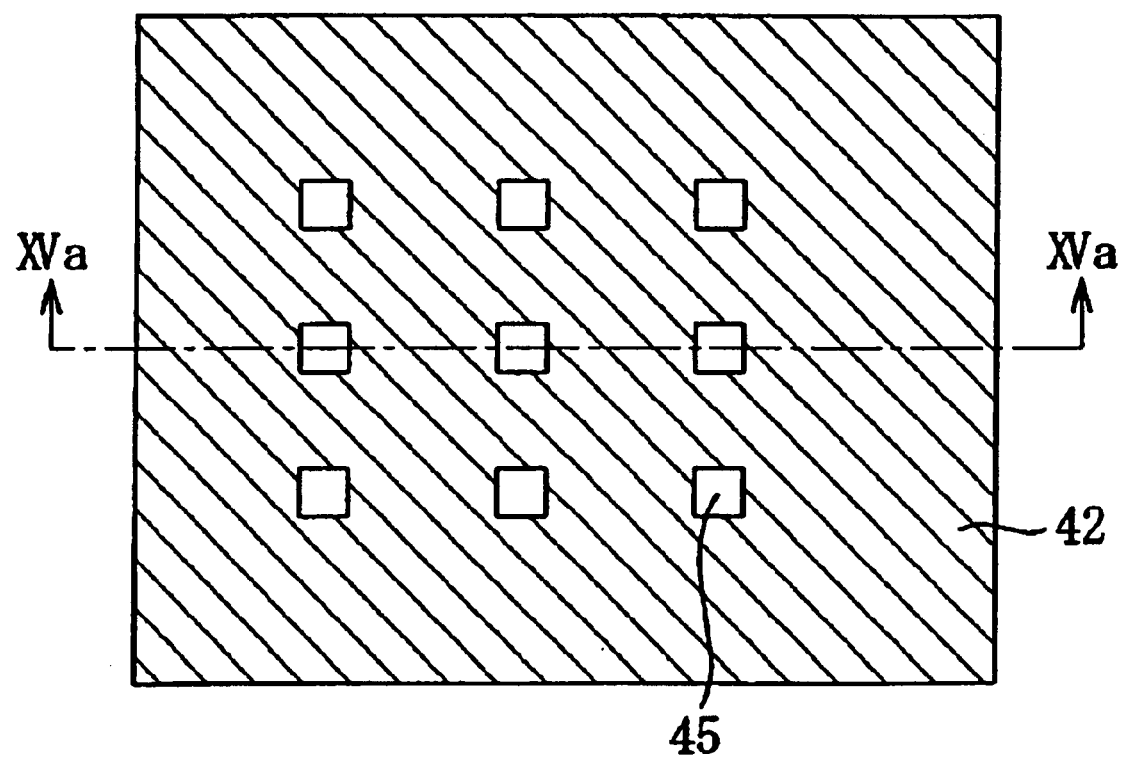

Next, as shown in FIGS. 15A and 15B, the process step of forming openings 45 through the silicon nitride layer 42 is carried out. FIG. 15B is a plan view illustrating an exemplary arrangement of the openings 45, and FIG. 15A is a cross-sectional view thereof taken on the plane XVa—XVa shown in FIG. 15B.

In this process step, the silicon nitride layer 42 is dry-etched with a resist mask (not shown), which has been defined by a photolithographic process, thereby forming cavity defining openings 45 through the silicon nitride layer 42. In the example illustrated in FIG. 15B, nine openings 45 are arranged in three columns and three rows. The pitch of three horizontally arranged openings 45 that make up each row is greater than that of three vertically arranged openings 45 that make up each column.

Figure 16A:
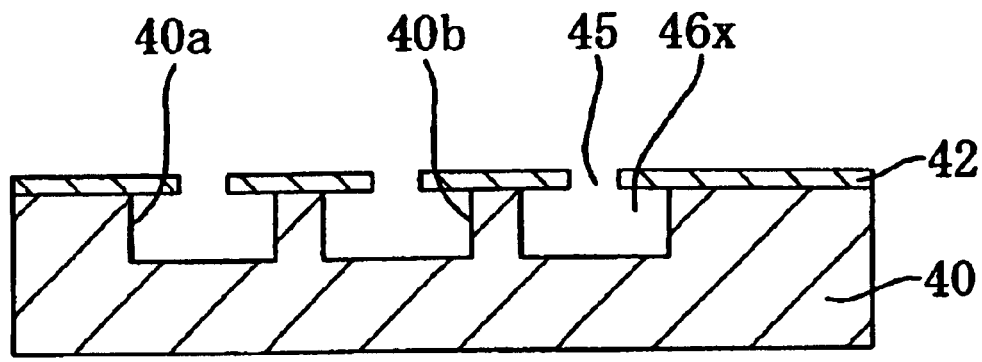
FIGS. 16A and 16B are respectively a vertical sectional view, taken on the plane XVIa—XVIa shown in FIG. 16B, and a plan view showing the process step of forming provisional cavities.
Figure 16B:
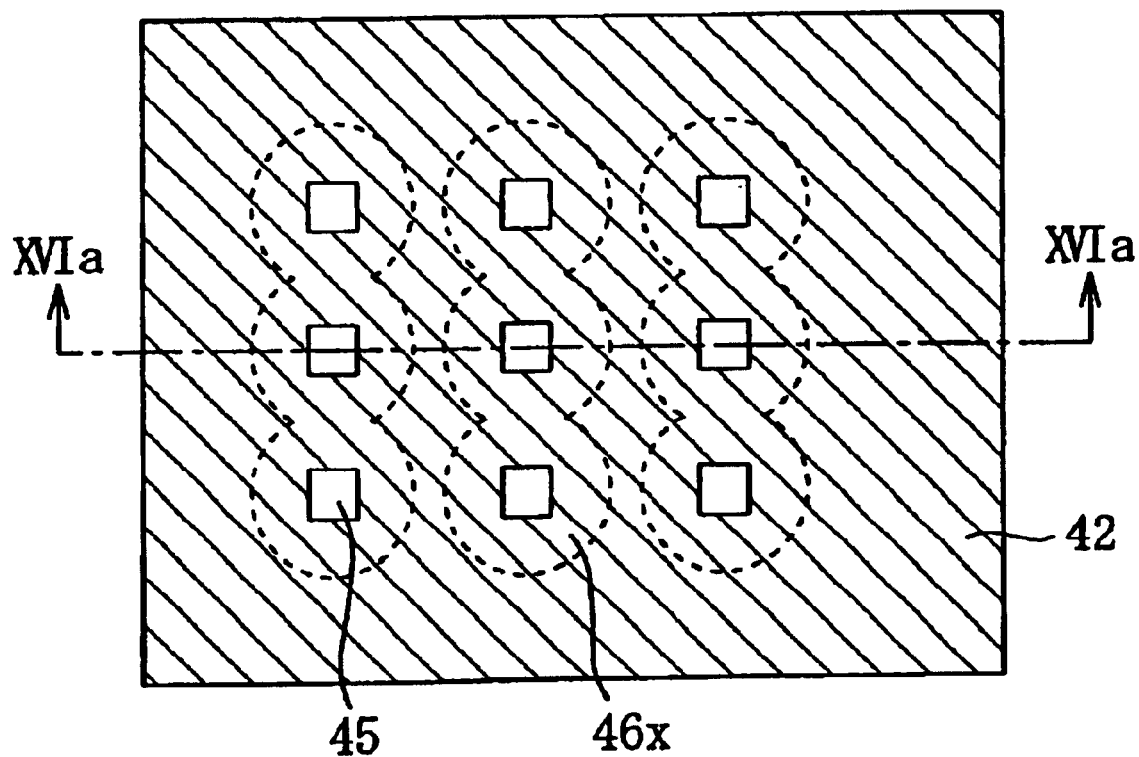

Then, as shown in FIGS. 16A and 16B, the process step of defining provisional cavities is carried out. FIG. 16B is a plan view illustrating a structure in which the provisional cavities have been defined, and FIG. 16A is a cross-sectional view thereof taken on the plane XVIa—XVIa shown in FIG. 16B.

In this process step, portions of the silicon substrate 40 are wet-etched with an alkaline etchant such as KOH or hydrazine. This etching action advances isotropically from portions of the silicon substrate 40, which are exposed inside of the openings 45. The isotropic wet etching action advances not only vertically but also laterally. Accordingly, a portion of the silicon substrate 40, which is located between two horizontally adjacent cavity defining openings 45, is etched from both sides. Thus, as shown in FIG. 16B, two concave portions formed by the etching process may be linked together where two adjacent openings 45 are arranged at a relatively narrow pitch, but etch residues may be left where two adjacent openings 45 are arranged at a relatively wide pitch.

In this manner, a number of provisional cavities 46x are defined and walls 40a are also defined by the residues of the silicon substrate 40 between those provisional cavities 46x as shown in FIGS. 16A and 16B.

In the example illustrated in FIG. 16B, each set of three adjacent provisional cavities 46x arranged in the column direction are linked together, while each set of three adjacent provisional cavities 46x arranged in the row direction are still separated from each other. However, the arrangement of the provisional cavities 46x is not limited to such an arrangement. Alternatively, the provisional cavities 46x may be all isolated from each other, some of them linked together, or even all of them combined together. In any case, the provisional cavities 46x can be freely designed based on the shape, size and arrangement of the cavity defining openings 45. The provisional cavities 46x are also changeable with the wet etching conditions.

In this preferred embodiment, it is important to leave the walls 40a that function as a supporting portion for the etch stop layer and prevent the provisional cavities from being blocked. For that reason, in performing the wet etching process to define the provisional cavities 46x, the etching conditions need to be adjusted such that no single continuous big cavity, free of columns or walls, will be defined.

Figure 17A:
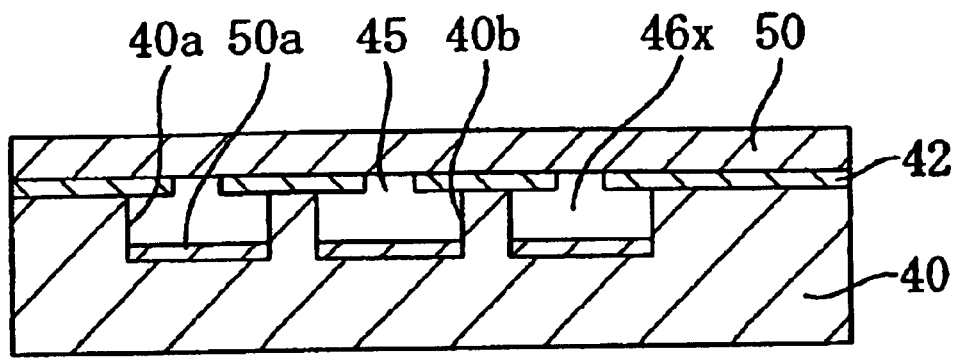
FIGS. 17A and 17B are respectively a cross-sectional view, taken on the plane XVIIa—XVIIa shown in FIG. 17B, and a plan view showing the process step of temporarily closing the provisional cavities.
Figure 17B:
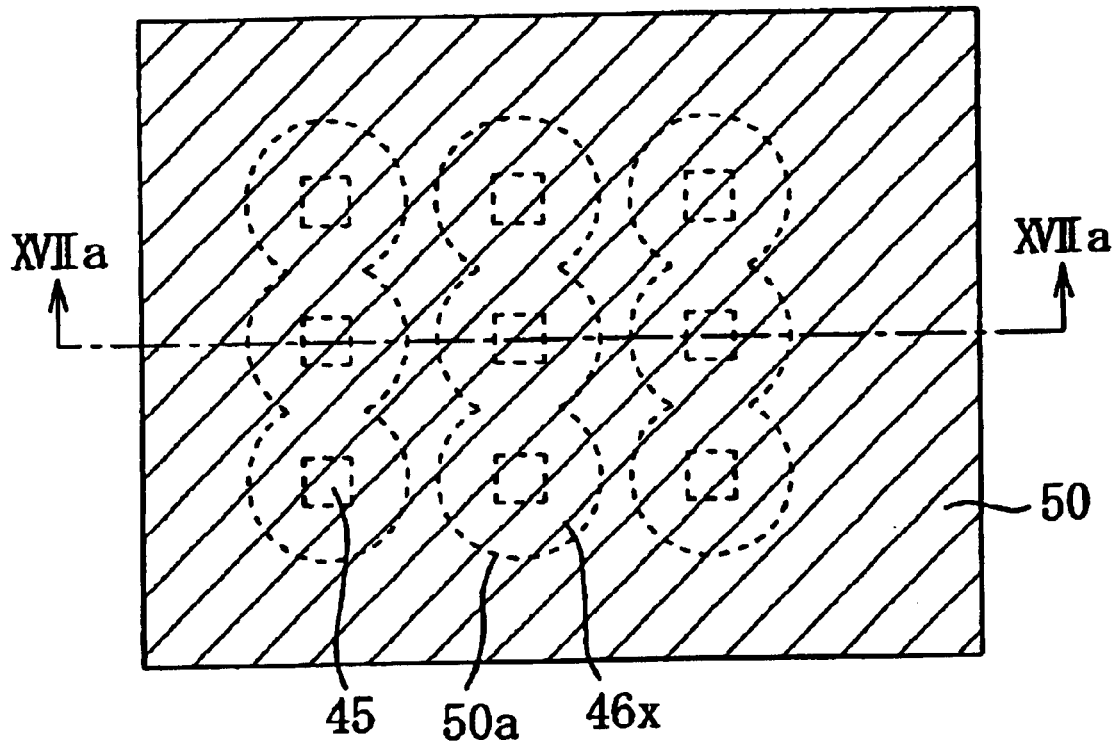

Subsequently, the process step of closing up the openings 45 is carried out. FIG. 17B is a plan view illustrating a structure in which a silicon dioxide layer 50 has just been deposited, and FIG. 17A is a cross-sectional view thereof taken on the plane XVIIa—XVIIa shown in FIG. 17B. In this process step, the silicon dioxide layer 50 of TEOS is deposited by a CVD process to a thickness of about 350 nm over the substrate 40, thereby closing up the cavity defining openings 45 of the silicon nitride layer 42 that functions as the ceiling of the provisional cavities 46x. Meanwhile, a bottom oxide layer 50a is also deposited on the bottom of the provisional cavities 46x.

Figure 18A:
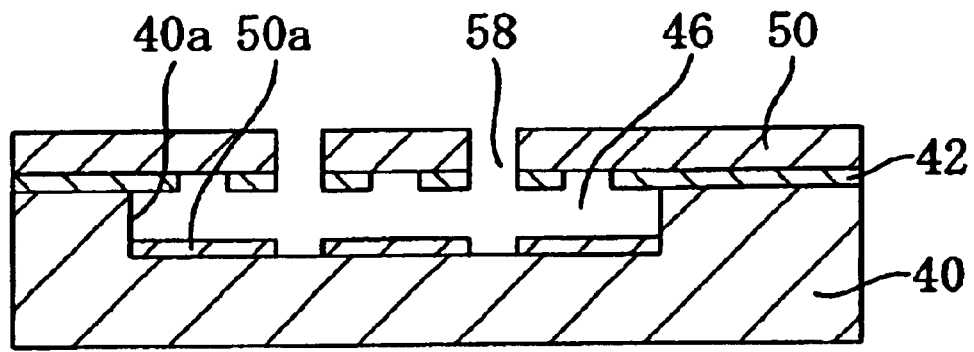
FIGS. 18A and 18B are respectively a cross-sectional view, taken on the plane XVIIIa—XVIIIa shown in FIG. 18B, and a plan view showing the process step of defining a final cavity.
Figure 18B:
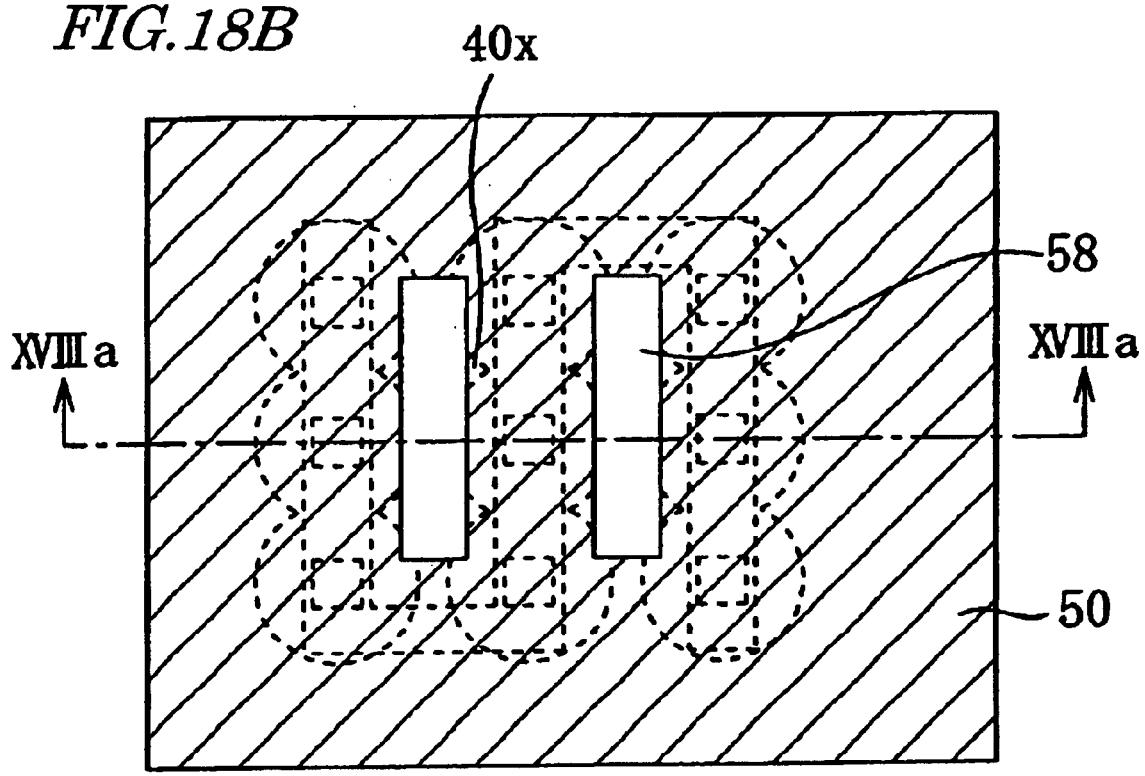

FIG. 18B is a plan view illustrating a structure in which a second group of openings have been formed through the silicon dioxide layer 50, and FIG. 18A is a cross-sectional view thereof taken on the plane XVIIIa—XVIIIa shown in FIG. 18B. In this process step, first, holes 58 are defined by removing portions of the silicon dioxide layer 50 by photolithographic and dry etching techniques so as to be located over the walls 40a between the provisional cavities 46x. Then, the walls 40a are etched downward through those holes 58. As a result of this etching process, a final cavity 46 is defined. Thus, according to this third preferred embodiment, cavities can be formed directly on the silicon substrate 40 without using any insulating film such as the LOCOS film.

It should be noted that before the final cavity 46 is defined, the resistor for the bolometer may be formed as in the first and second preferred embodiments described above. In that case, a patterned resistor for the bolometer is provided in an S shape as indicated by the dashed lines in FIG. 18B. Although not shown, after the resistor has been formed, an interlevel dielectric film and a passivation film are deposited in this order over the resistor and then the holes 58 are defined so as to extend these films.

Embodiment 4

Hereinafter, preferred embodiments of an infrared sensor including the resistor for bolometer of any of the first, second and third preferred embodiments of the present invention will be described.

Figure 19A:
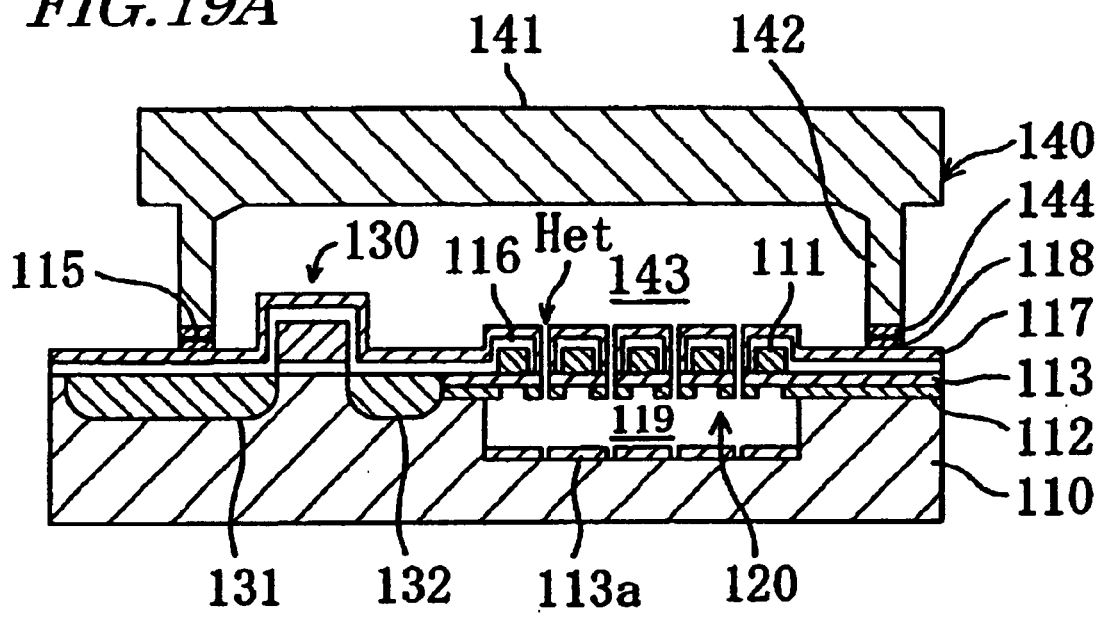
FIGS. 19A and 19B are respectively a cross-sectional view and an electric circuit diagram of an infrared sensor according to a fourth specific preferred embodiment of the present invention.
Figure 19B:
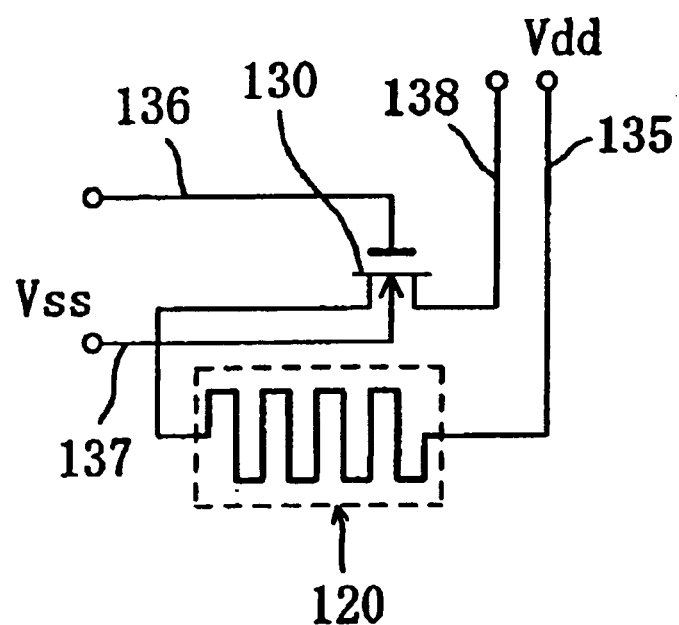

FIGS. 19A and 19B are respectively a cross-sectional view and an electric circuit diagram of an infrared sensor according to a fourth specific preferred embodiment of the present invention. The infrared sensor to be described below is supposed to include the infrared detector of the third preferred embodiment shown in FIGS. 18A and 18B. Alternatively, the infrared sensor may also include the infrared detectors of the first or second preferred embodiment described above.

As shown in FIG. 19A, the infrared sensor of this preferred embodiment preferably includes: a silicon substrate 110 with a thickness of about 700 µm; a resistive element (or bolometer) 120 provided on the silicon substrate 110; a switching transistor 130, which is also provided on the silicon substrate 110 and which turns ON and OFF the current to be supplied to the resistive element 120; and a cap member 140 for use to maintain a reduced pressure atmosphere around the resistor 120. This infrared sensor may have an overall size of about several millimeters. On the silicon substrate 110, provided are a resistor 111 with a winding pattern, a silicon nitride layer 112 and a silicon dioxide layer (e.g., a TEOS film) 113 that support the resistor 111 thereon, and an interlevel dielectric film (e.g., BPSG film) 116 and a passivation film (e.g., silicon nitride layer) 117 that cover the resistor 111. The winding resistor 111, silicon dioxide layer 113, interlevel dielectric film 116 and passivation film 117 are vertically sandwiched between a pair of cavities 119 and 143 in which a vacuum has been created. These cavities 119 and 143 are linked together via holes Het that extend through the silicon nitride layer 112, silicon dioxide layer 113 and interlevel dielectric film 116.

The resistor 111 may be made of Ti, TiO, polysilicon or Pt.

A ringlike film 118 of a soft metallic material (e.g., aluminum) is provided on a portion of the passivation film 117, which is located under the cylinder portion 142 of the cap member 140. Another ringlike film 144 of a soft metallic material such as aluminum is also provided at the bottom of the cylinder portion 142. The ringlike bonding portion 115 to be defined between these two ringlike films 118 and 144 maintains the reduced pressure atmosphere (or vacuum) in the cavity 143 between the cap member 140 and the silicon substrate 110 and in the cavity 119 in the silicon substrate 110. That is to say, due to the presence of these cavities 143 and 119, the resistor 111 is thermally insulated from the silicon substrate 110 such that the temperature rises efficiently responsive to incident infrared radiation.

The cap member 140 includes a substrate portion 141, which is obtained by epitaxially growing a Ge layer to a thickness of about 3 µm and an Si layer to a thickness of about 1 µm on a silicon substrate with a thickness of about 700 µm. A Fresnel lens is preferably provided on the surface of the Si layer. The cavity 143 with a depth of at least several µm is defined by the cylinder portion 142 of the cap member 140. It should be noted that a portion to be a window portion may be thinned by an etching technique, for example.

The switching transistor 130 includes a source region 131, a drain region 132 and a gate electrode 133. The source region 131 is defined under the cylinder portion 142 of the cap member 140. That is to say, the source region 131 is provided as a signal line to electrically connect the resistor 111, encapsulated in the vacuum, to an external member.

Although not shown in FIG. 19A, a Peltier device is preferably attached to the lower surface of the silicon substrate 110 for the purpose of cooling the resistive element. The Peltier device utilizes the absorption of heat that occurs when carriers move across a Schottky contact. In this preferred embodiment, any of various types of Peltier devices with a known structure may be used.

As shown in FIG. 19B, one terminal of the resistor 111 is connected to a line 135 that provides a supply voltage Vdd, while the other terminal thereof is connected to the drain region 132 of the switching transistor 130. A switching signal is input to the gate of the switching transistor 130 by way of a line 136. The source of the switching transistor 130 is connected to an infrared detector (not shown) for detecting the infrared exposure dose of the resistor 111 by way of a line 138 that has a standard resistor at the other end thereof. The substrate region of the switching transistor 130 is connected to a ground terminal, which supplies a ground voltage Vss, by way of a line 137. In this configuration, when infrared radiation is incident onto the resistor 111, the resistor 111 increases its temperature in accordance with the exposure dose thereof, thus also changing the electrical resistance thereof. Then, the potential level on the line 138 also changes. Accordingly, the infrared exposure dose can be detected based on the magnitude of this potential variation.

In a discrete infrared sensor, an operational amplifier for amplifying the output of the bolometer may also be provided on the same substrate. In that case, the operational amplifier, as well as the bolometer and switching transistor of this preferred embodiment, may be encapsulated by the cap member.

Hereinafter, a method of making a cap member for use in the electronic device of this preferred embodiment will be described with reference to FIGS. 20A through 20E.

First, as shown in FIG. 20A, a cap prototype wafer 150 is prepared by epitaxially growing a Ge layer and an Si layer in this order on a silicon wafer. The Ge layer may be epitaxially grown to a thickness of about 3 μm on the silicon wafer in the following manner. Specifically, an $Si_{1-x}Ge_x$ layer is epitaxially grown on the silicon wafer such that the Ge mole fraction x changes from 0 to 1 and then the Ge layer is epitaxially grown to the thickness of about 3 μm. Thereafter, another $Si_{1-x}Ge_x$ layer is epitaxially grown on the Ge layer such that the Ge mole fraction x changes from 1 to 0 and the Si layer is epitaxially grown to a thickness of about 1 μm. Subsequently, a Fresnel lens, which will be divided into multiple convex lenses for use to focus an infrared ray onto each infrared sensor, is formed on the surface of the Si layer.

Next, with the Fresnel lens on the cap prototype wafer 150 facing downward, an Al film 151 is deposited by an evaporation, sputtering or any other suitable process to a thickness of about 600 nm on the other side of the cap prototype wafer 150 (i.e., so as to face the Ge and Si layers with the silicon wafer interposed between them).

Subsequently, the Al film 151 is etched by using a resist pattern (not shown) defined thereon as a mask, thereby forming a plurality of ringlike films 144 as shown in FIG. 20B.

Thereafter, by using either the ringlike films 144 as a hard mask or the resist pattern left as it is, the cap prototype wafer 150 is subjected to a dry etching process (e.g., a reactive ion etching (RIE) process). In this manner, a plurality of cylinder members 142, each defining a cavity for an infrared sensor, are made of the cap prototype wafer 150 as shown in FIG. 20C. As a result, the cap prototype wafer 150 now consists of a wafer portion 141 including the residues of the silicon wafer, the Ge layer, the Si layer and the Fresnel lens, and the cylinder members 142. The height of the cylinder members 142 (i.e., the depth of the concave portions) may be at least several μm.

Alternatively, the cap members may also be formed by using not such a bulk silicon wafer but an SOI wafer including an oxide insulating layer (e.g., a so-called "BOX layer"). In that case, the silicon wafer can be etched such that a high etch selectivity is achieved between the insulating layer and the silicon wafer. Thus, the concave portions can be formed just as intended, i.e., no farther than the bottom of the insulating layer.

Next, as shown in FIG. 20D, the wafer portion 141 of the cap prototype wafer 150 is turned over so as to face upward and then subjected to a dry etching process (e.g., an ICP-RIE process), thereby forming notches 152 to make the wafer portion 141 easily dividable into respective cap members for infrared sensors. Meanwhile, a body wafer 100 having the structure shown in FIG. 19A is also prepared, and a plurality of ringlike films 118 of Al are formed on the body wafer 100.

Thereafter, as shown in FIG. 20E, the cap prototype wafer 150 is mounted onto the body wafer 100 on which the infrared detectors have been formed by the manufacturing process of the third preferred embodiment described above, for example. Then, these two wafers 150 and 100 are pressed against each other and bonded together with the two groups of ring-like films 118 and 144 aligned and bonded with each other. In this manner, the ringlike bonding portions 115 such as that shown in FIG. 19A are defined.

Finally, as shown at the bottom of FIG. 20E, the cap prototype wafer 150, as well as the infrared sensors, is divided along the notches 152, while the body wafer 100 is also diced into a number of chips for the respective infrared sensors. As a result, a plurality of discrete infrared sensors, each including a silicon substrate 110 and a cap member 140, are completed.

Figure 21:
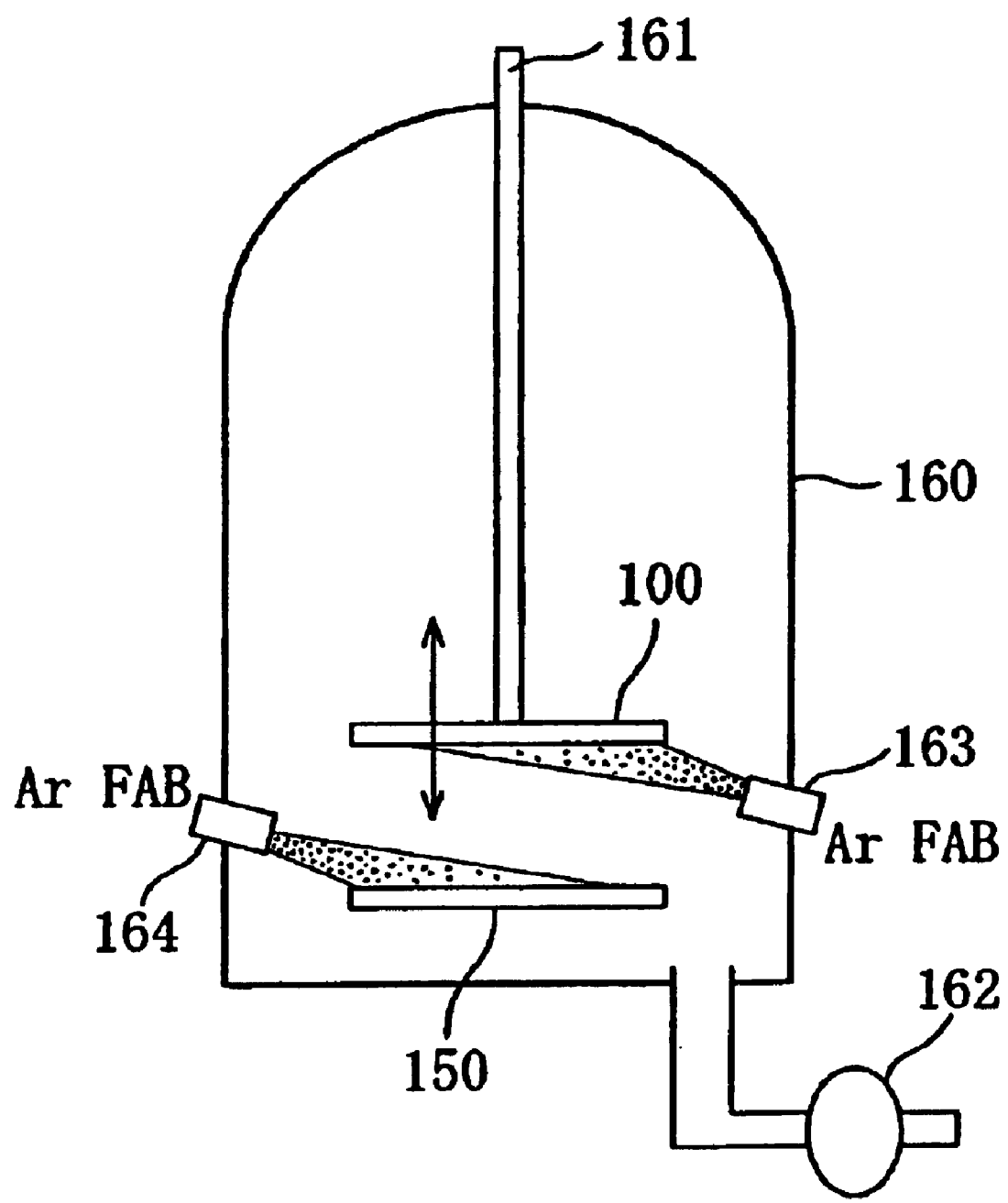
FIG. 21 is a cross-sectional view schematically illustrating a configuration for a pressure bonding apparatus for use in the fourth preferred embodiment.

FIG. 21 is a cross-sectional view schematically illustrating a configuration for a pressure bonding apparatus. As shown in FIG. 21, a supporting member 161 for applying a pressure for the pressure bonding purposes, a broad band rotary pump 162 for maintaining a vacuum inside a chamber 160, and Ar irradiators 163 and 164 are attached to the chamber 160. Into this apparatus, the body wafer 100 and the cap prototype wafer 150 are loaded such that the body wafer 100 is located over the cap prototype wafer 150. Then, the respective ringlike films 118 and 144 (see FIG. 20D) are exposed to Ar atom beams that have been irradiated from the Ar irradiators 163 and 164. As a result of this Ar beam exposure, contaminants and oxide layers are removed from the surface of Al of the ringlike films 118 and 144. Thereafter, with a vacuum of about $10^{-4}$ Pa maintained inside the chamber 160, a pressure of about 0.5 MPa to about 20 MPa is applied to between the two groups of ringlike films 118 and 144 at a normal temperature of about 30° C., for example, thereby bonding these two groups of ringlike films 118 and 144 together. Optionally, to remove Ar from the surface of the ringlike films 118 and 144, the ringlike films 118 and 144 may be pre-heated to about 150° C. before the pressure bonding process is carried out.

Alternatively, O atoms or any other neutral atoms may be irradiated instead of the Ar atoms. Even so, similar effects are also achievable because dangling bonds can also be exposed on the surface of the metal (i.e., Al in this case) as in this preferred embodiment.

The metals to be bonded together may be Al or any of various other metals (including alloys thereof). Among other things, In, Cu, Au, Ag and an Al—Cu alloy having low melting points are particularly preferred because such a metal or alloy can be bonded at a normal temperature or at least around a normal temperature. These metals to be bonded together may be either the same as each other or different from each other. For example, if In films are deposited by an evaporation process, patterned into ringlike films, and then subjected to a pressure, the surface of the In films will break down, a natural oxide layer disappears from the surface portions of the In films, and the In films can be bonded together. The pressure bonding process may also be carried out in this manner.

Furthermore, the bonding process does not have to be carried out as such a thermal pressure bonding process but may also be an ultrasonic bonding process, a bonding process to be performed at a normal temperature by modifying the compositions, or any other method. As another alternative, the bonding process may also be carried out as hydrogen bonding between Si and Si, between Si and an oxide, or between two oxides.

Specifically, the bonding process is preferably carried out at a vacuum of about $10^{-2}$ Pa to about $10^{-4}$ Pa. In that case, the infrared sensor can always exhibit sufficiently high performance while maintaining a high vacuum inside and yet various inconveniences, which are normally caused to maintain such a high vacuum, can be avoided. As a result, a practical bonding process can be carried out easily, thus contributing to mass production significantly.

In this preferred embodiment, not the overall array of cells such as sensors or radiators is maintained in a vacuum. A wafer including a great number of infrared sensors thereon is once prepared, but is divided into multiple chips, each of which is then encapsulated in a vacuum to define an infrared sensor chip. Accordingly, this preferred embodiment can also be used effectively even in a discrete device. This preferred embodiment is applicable for actual use particularly effectively, because a normal electronic device manufacturing process (e.g., a CMOS process, in particular) can be used as it is.

In this preferred embodiment, the sealing portions are not soldered up as in the prior art, but bonded together by subjecting a pair of soft metals such as aluminum to a pressure bonding process. Thus, this preferred embodiment is also effective in reducing the size of infrared sensors and other types of electronic devices.

According to the manufacturing process of this preferred embodiment, even when a great number of discrete infrared sensors are formed on a wafer, the cap members can be bonded for the respective infrared sensors individually. Particularly when the notches 152 are provided for the wafer portion 141 as shown in FIG. 20D, the stresses to be applied to the bonding portions of the respective cells can be uniformized. In that case, no excessive stress will be applied locally to the portions being bonded together. As a result, the bonding portions can be bonded together with high reliability.

Embodiment 5

Hereinafter, a fifth specific preferred embodiment of the present invention will be described.

Figure 22:
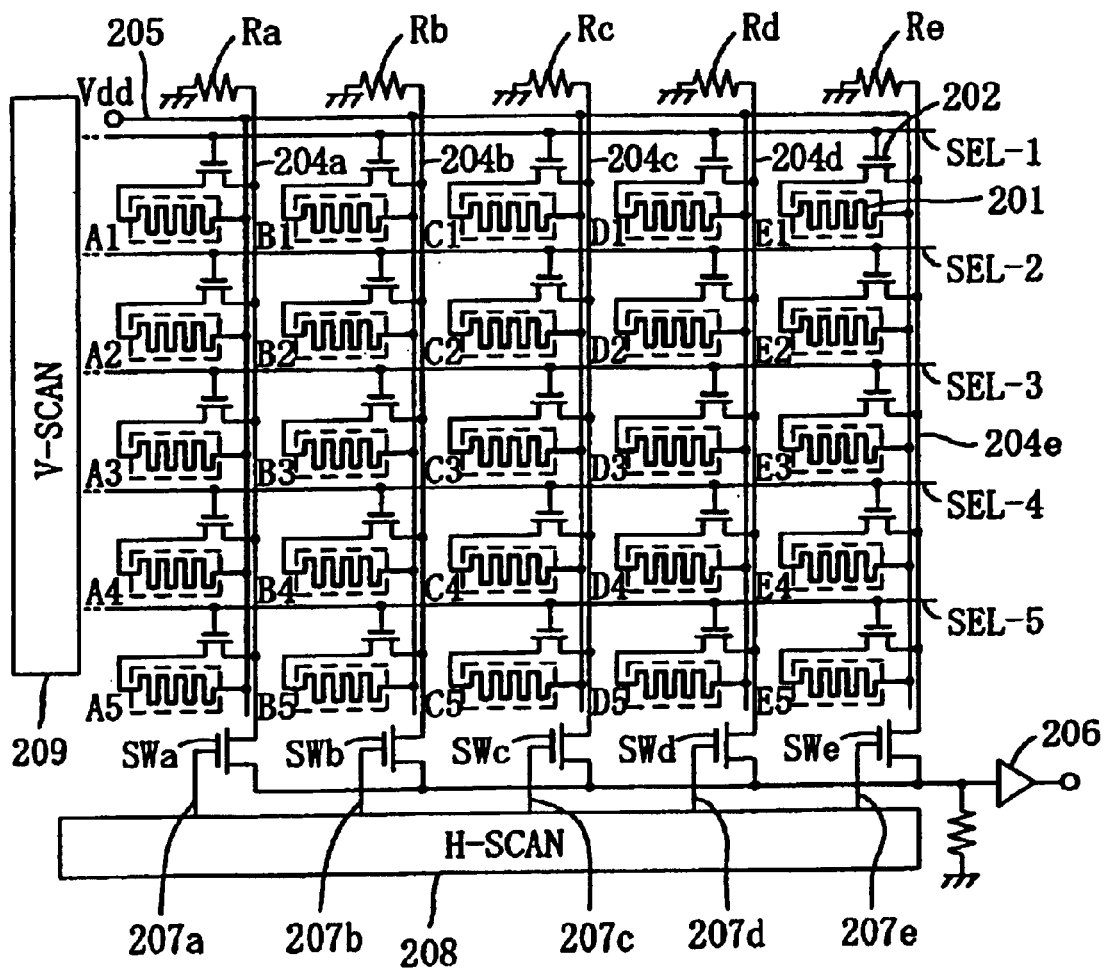
FIG. 22 is an electric circuit diagram showing a configuration for an infrared area sensor according to a fifth specific preferred embodiment of the present invention.
Figure 24:
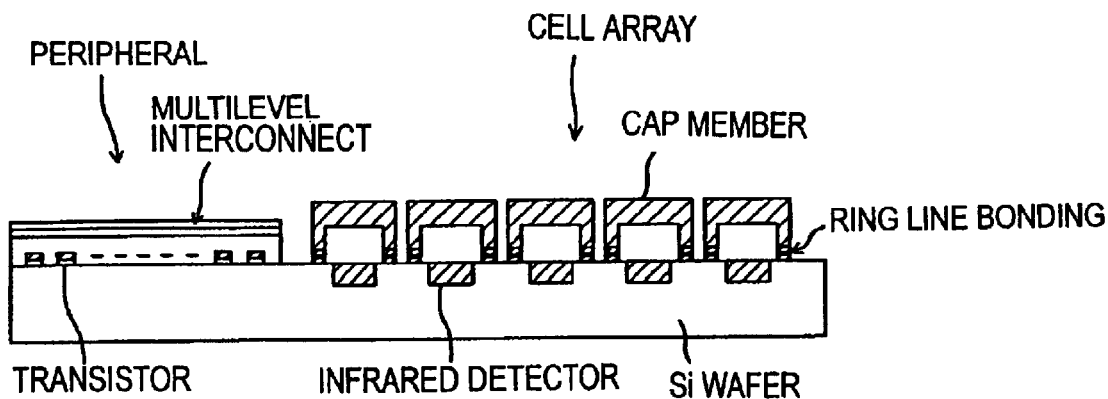
FIG. 24 is a cross-sectional view schematically illustrating the structure of the infrared sensor of the fifth preferred embodiment.

FIG. 22 is an electric circuit diagram showing a configuration for an infrared area sensor according to the fifth preferred embodiment. As shown in FIG. 22, the infrared area sensor includes a plurality of infrared detectors, which are arranged in columns and rows on a single substrate. FIG. 24 is a cross-sectional view schematically illustrating the structure of this infrared area sensor.

An infrared area sensor having such a configuration can be obtained by processing the assembly shown in FIG. 20E. More specifically, the cap prototype wafer 150 shown in FIG. 20E may be divided into multiple cap members 140 for respective infrared detectors, while the body wafer 100 may be diced into multiple infrared detector chips 110 to be arranged in columns and rows.

Hereinafter, the circuit configuration of the infrared area sensor of this preferred embodiment will be described in detail. As shown in FIG. 22, the body wafer includes an array of cells A1 to A5, B1 to B5, C1 to C5, D1 to D5 and E1 to E5, which are arranged in columns and rows and each of which includes a bolometer 201 and a switching transistor 202. Each of these cells may have a size of about 40 μm to about 50 μm, for example. However, the size of each cell only needs to be at least about 20 μm, which is approximately twice the wavelength of the infrared radiation to be detected. In each cell, the gate electrode of the switching transistor 202 is connected to its associated select line SEL-1, SEL-2, SEL-3, SEL-4 or SEL-5 extending from a vertical scanning circuit (V-SCAN) 209. Also, in each cell, one terminal of the bolometer 201 is connected to a power supply line 205, and the source of the switching transistor 202 is connected to its associated data line 204a, 204b, 204c, 204d or 204e extending from a ground terminal by way of a reference resistor Ra, Rb, Rc, Rd or Re. The data lines 204a, 204b, 204c, 204d and 204e are connected to an output amplifier 206 by way of switching transistors SWa, SWb, SWc, SWd and SWe, respectively. Signal lines 207a, 207b, 207c, 207d and 207e, extending from a horizontal scanning circuit (H-SCAN) 208, are connected to the gate electrodes of the switching transistors SWa, SWb, SWc, SWd and SWe, respectively.

Figure 23:
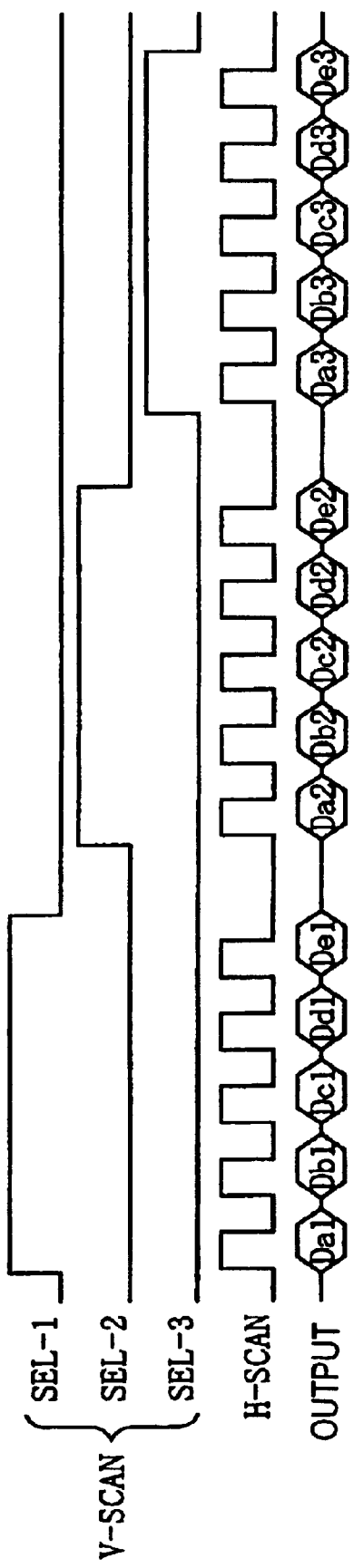
FIG. 23 is a timing diagram showing how to control the infrared area sensor of the fifth preferred embodiment.

FIG. 23 is a timing diagram showing how to control this infrared area sensor. First, the vertical scanning circuit V-SCAN activates the select line SEL-1, thereby turning ON the switching transistors 202 of the cells A1, B1, C1, D1 and E1 on the first row. As a result, voltages are applied to the bolometers 201 of the respective cells A1, B1, C1, D1 and E1 by way of the reference resistors Ra, Rb, Rc, Rd and Re, respectively. In the meantime, the horizontal scanning circuit H-SCAN sequentially turns ON the switching transistors SWa, SWb, SWc, SWd and SWe, thereby outputting data Da1, Db1, Dc1, Dd1 and De1 from the respective cells A1, B1, C1, D1 and E1 through the output amplifier 206. Next, when the vertical scanning circuit V-SCAN activates the select line SEL-2, the horizontal scanning circuit H-SCAN sequentially turns ON the switching transistors SWa, SWb, SWc, SWd and SWe, thereby outputting data Da2, Db2, Dc2, Dd2 and De2 from the respective cells A2, B2, C2, D2 and E2 through the output amplifier 206. Thereafter, the vertical and horizontal scanning circuits V-SCAN and H-SCAN will perform similar control operations, thereby outputting data Da3, Db3, Dc3, Dd3 and De3 from respective cells A3, B3, C3, D3 and E3, data Da4, Db4, Dc4, Dd4 and De4 from respective cells A4, B4, C4, D4 and E4, and data Da5, Db5, Dc5, Dd5 and De5 from respective cells A5, B5, C5, D5 and E5 by way of the output amplifier 206 sequentially.

In this infrared area sensor, the infrared exposure doses of respective cells including the bolometers 201 are summed up, thereby obtaining two-dimensional information about the object to be detected.

Embodiment 6

Hereinafter, a sixth specific preferred embodiment of the present invention will be described.

Figure 25:
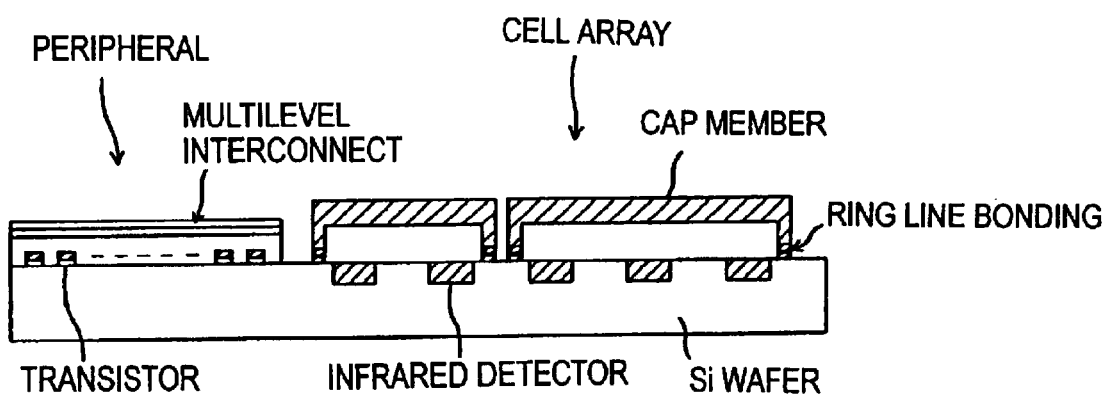
FIG. 25 is a cross-sectional view schematically illustrating the structure of an infrared sensor according to a sixth specific preferred embodiment of the present invention.

In the infrared area sensor of the fifth preferred embodiment shown in FIG. 24, each infrared detector is covered with its own cap member. However, the present invention is in no way limited to such a specific preferred embodiment. FIG. 25 is a cross-sectional view illustrating the structure of an infrared sensor according to an alternative preferred embodiment of the present invention. As shown in FIG. 25, each cap member may cover a number of infrared detectors of the cell array, not a single infrared detector of its associated cell. In the infrared sensor shown in FIG. 25, each ringlike bonding portion surrounds a number of infrared detectors. The materials of the cap members and the bonding portions and the method of making them may be as already described for the fourth preferred embodiment.

Figure 26:
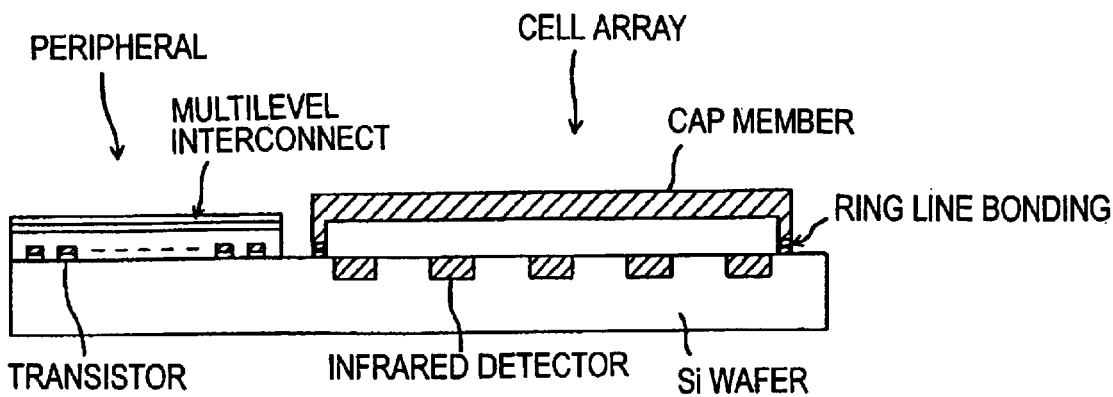
FIG. 26 is a cross-sectional view schematically illustrating the structure of another infrared sensor according to the sixth preferred embodiment.

FIG. 26 is a cross-sectional view illustrating the structure of an infrared sensor according to another alternative preferred embodiment of the present invention. In the infrared sensor shown in FIG. 26, a single cap member covers the overall cell array including a number of infrared detectors. The ring-like bonding portion also surrounds the entire cell array. The materials of the cap members and the bonding portions and the method of making them may be as already described for the fourth preferred embodiment.

In these preferred embodiments, the ringlike bonding portion is formed by metal bonding, hydrogen bonding or normal temperature bonding, instead of the conventional solder bonding technique. Thus, a higher vacuum can be maintained in the space in which each resistor is encapsulated. As a result, the sensor to be encapsulated with such a cap member can also have significantly improved infrared spectral responsivity or resolution.

In the fourth through sixth preferred embodiments of the present invention described above, the cavity to be defined by the cap member is supposed to be a vacuum. In that case, the cavity preferably has an internal pressure of about $10^{-2}$ Pa to about $10^{-4}$ Pa to make the ringlike films bondable sufficiently easily by the pressure bonding technique during the manufacturing process. However, the ringlike films may also be bonded together even within a vacuum of about $10^{-4}$ Pa to about $10^{-7}$ Pa.

Embodiment 7

Hereinafter, a seventh specific preferred embodiment of the present invention will be described with reference to FIGS. 27 through 29. This preferred embodiment is a pyroelectric infrared sensor including a dielectric film of $PbTiO_3$.

Figure 27:
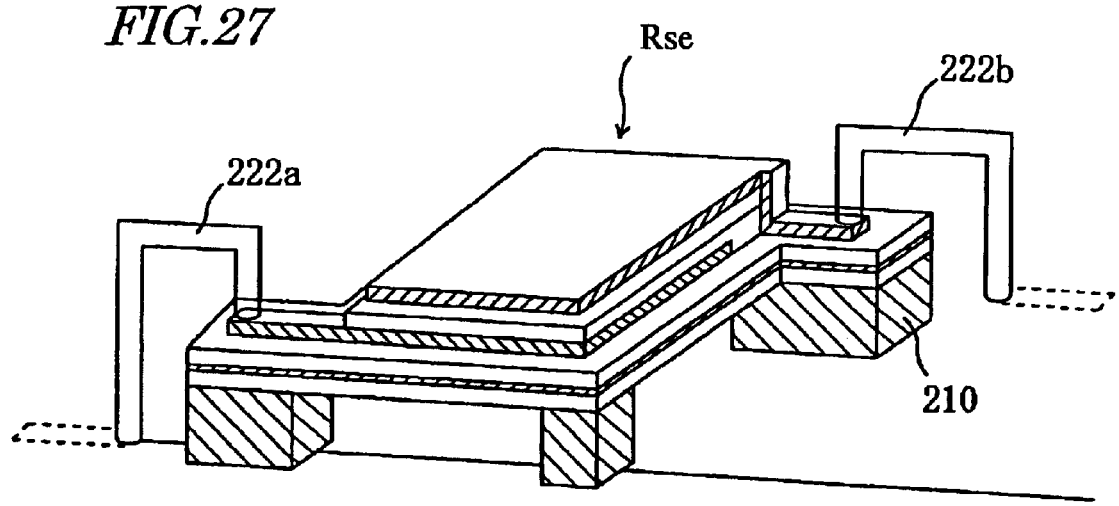
FIG. 27 is a perspective view illustrating the structure of an infrared detector for a pyroelectric infrared sensor according to a seventh specific preferred embodiment of the present invention.

FIG. 27 is a perspective view illustrating the structure of an infrared detector for a pyroelectric infrared sensor according to the seventh preferred embodiment. FIGS. 28 and 29 are respectively a cross-sectional view and a plan view illustrating the structure of an infrared detector in the pyroelectric infrared sensor of the seventh preferred embodiment.

Figure 28:
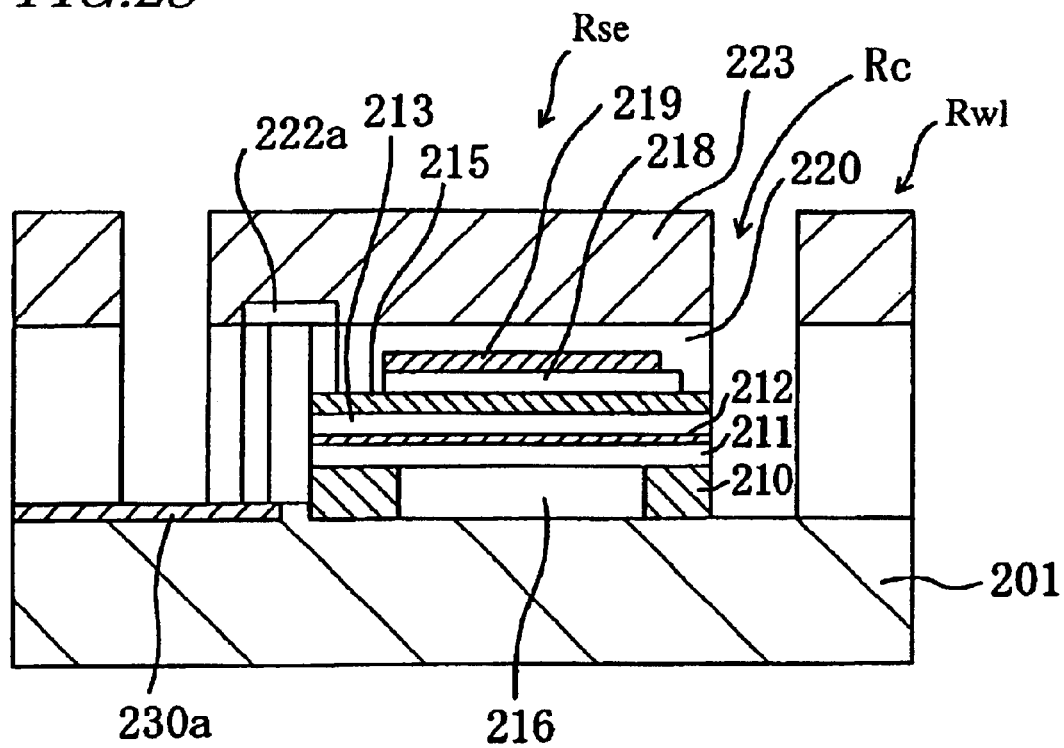
FIG. 28 is a cross-sectional view illustrating the structure of an infrared detector in the pyroelectric infrared sensor of the seventh preferred embodiment.
Figure 29:
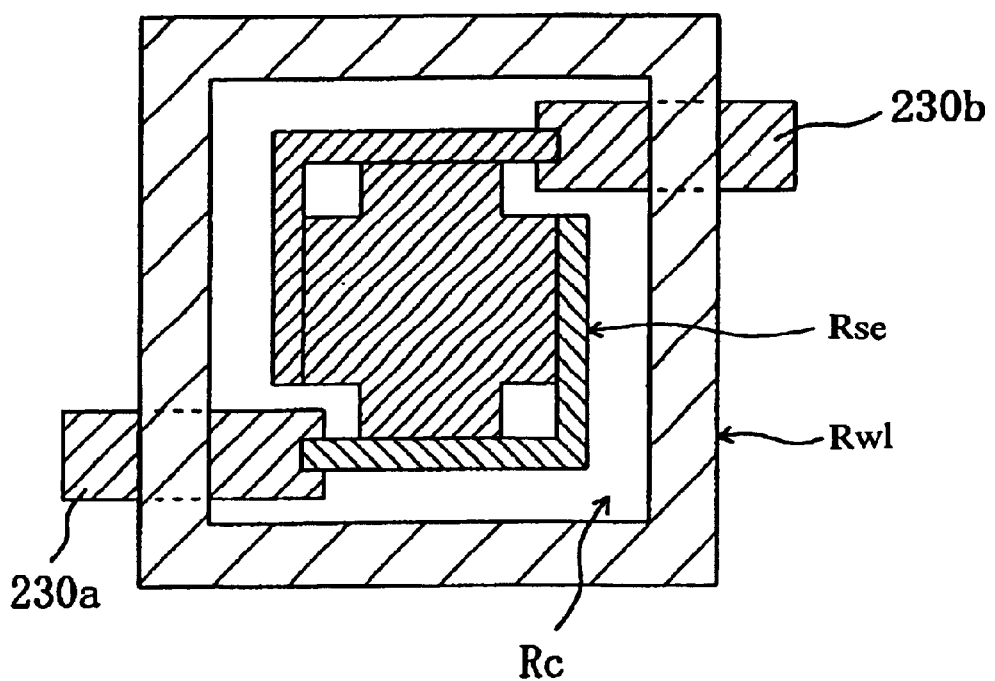
FIG. 29 is a plan view illustrating the structure of the infrared detector in the pyroelectric infrared sensor of the seventh preferred embodiment.

As shown in FIGS. 27 through 29, the infrared detector Rse preferably includes columns 210 of LOCOS on a silicon substrate 201, a TEOS film 211, a silicon nitride layer 212, another TEOS film 213, a lower electrode 215 consisting of Ti and Pt films, a dielectric film 218 of $PbTiO_3$, an upper electrode 219 of Pt, an interlevel dielectric film 220 of BPSG, first and second interconnects 222a and 222b of an Al alloy, and a passivation film 223 of silicon nitride. The TEOS film 211, silicon nitride layer 212 and TEOS film 213 may be deposited by a CVD process in this order on the columns 210. On the TEOS film 213, the lower electrode 215, dielectric film 218 and upper electrode 219 are stacked in this order. The lower and upper electrodes 215 and 219 are preferably formed by a sputtering process. The dielectric film 218 is preferably formed by a sol-gel process. The interlevel dielectric film 220 preferably covers all of these members on the silicon substrate 201. The first interconnect 222a extends through the interlevel dielectric film 220 and is connected to the lower electrode 213 at one terminal thereof. The second interconnect 222b also extends through the interlevel dielectric film 220 and is connected to the upper electrode 219 at one terminal thereof. The passivation film 223 is provided as a protective coating on the interlevel dielectric film 220. The other ends of the first and second interconnects 222a and 222b are electrically connected to first and second doped regions 230a and 230b, respectively, which are defined in the silicon substrate 201.

As shown in FIG. 29, the infrared detector Rse is surrounded with a sidewall Rw1, which is made up of portions of the interlevel dielectric film 220 and passivation film 223. The first and second doped regions 230a and 230b extend under the sidewall Rw1 and reach the outside of the sidewall Rw1. That is to say, the infrared detector Rse and the first and second doped regions 230a and 230b are arranged such that control signals can be supplied through the first and second doped regions 230a and 230b to the infrared detector Rse.

Although not shown, a ringlike film such as that shown in FIG. 19A is provided on the upper surface of the sidewall Rw1 shown in FIG. 29. As described above, the ringlike film of its associated cap member is bonded onto the counterpart on the sidewall Rw1, thereby shutting off the infrared detector Rse in its entirety from the external environment and creating a reduced pressure atmosphere inside.

In this preferred embodiment, the cavity 216 is also defined in the LOCOS film by utilizing the manufacturing process of the first preferred embodiment described above. In this manner, the infrared detector Rse, in which the lower electrode 215, dielectric film 218 and upper electrode 219 are supported on the columns 210 that are residues of the LOCOS film, is obtained.

As a result, a high vacuum can be maintained around this infrared detector while the thermal conductance to be produced between the infrared detector and the silicon substrate 201 or the sidewall Rw1 can be minimized. Thus, an infrared sensor, exhibiting sufficiently high infrared spectral responsivity and resolution, can be obtained.

Figure 30:
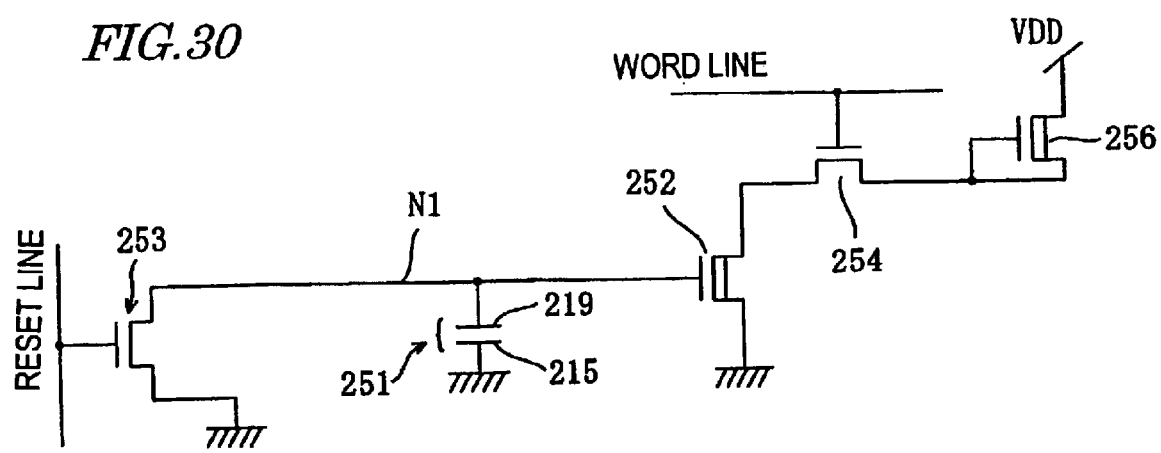
FIG. 30 is an electric circuit diagram showing a controller for use in the pyroelectric infrared sensor of the seventh preferred embodiment.
Figure 31A:
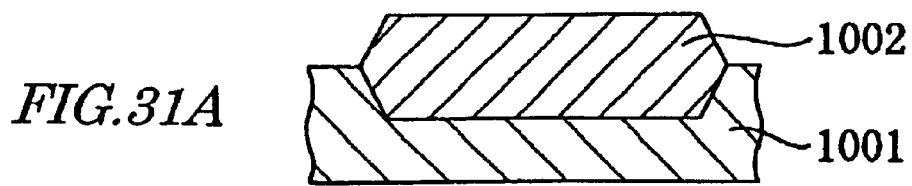
FIGS. 31A through 31F are cross-sectional views illustrating a conventional manufacturing process of an infrared detector as disclosed in Japanese Laid-Open Publication No. 2001-210877.
Figure 31B:
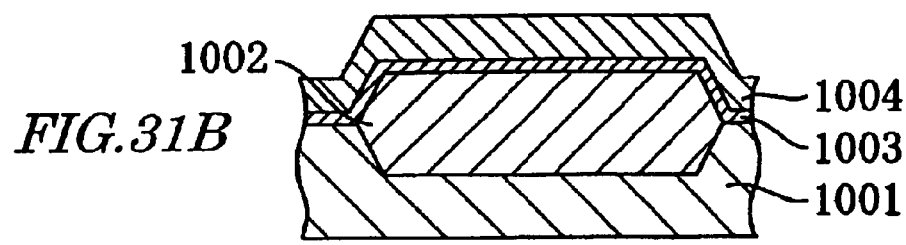
Figure 31C:
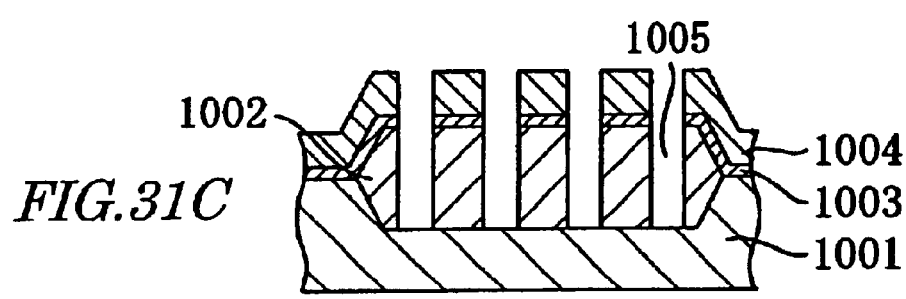
Figure 31D:
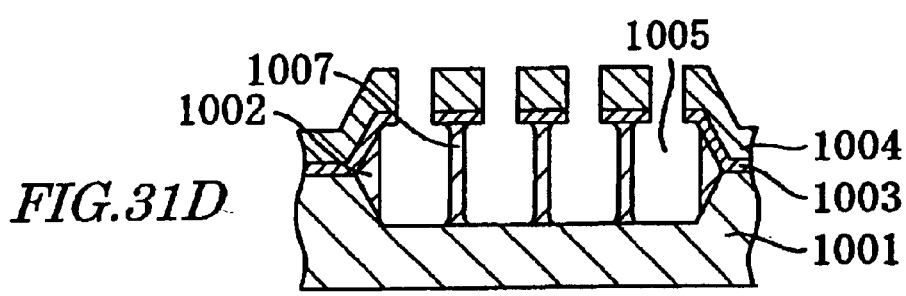
Figure 31E:
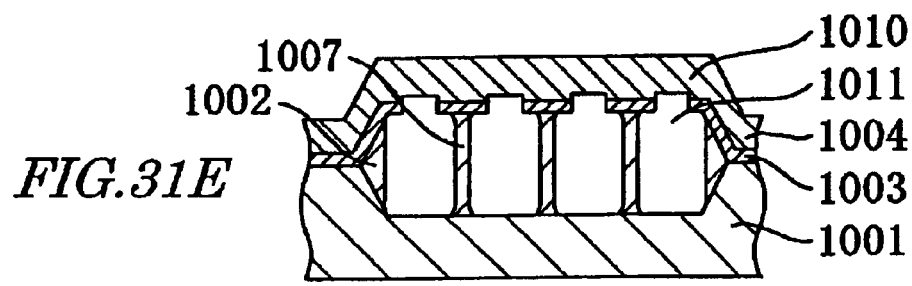
Figure 31F:
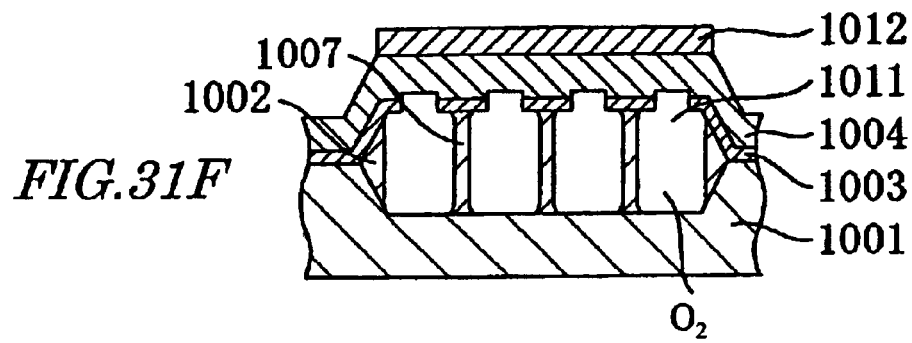
Figure 32A:
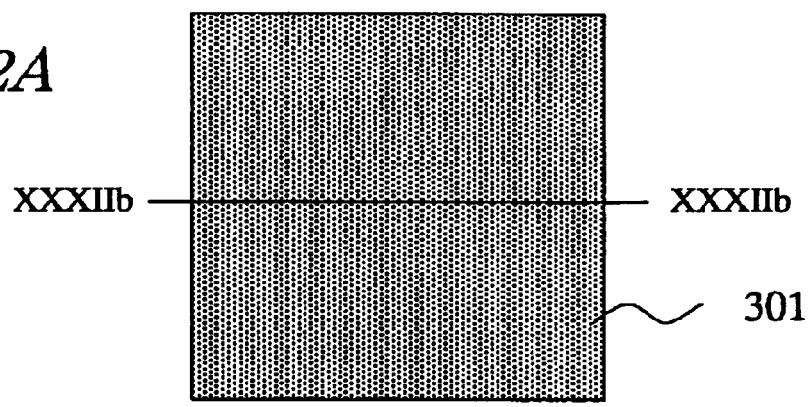
Figure 32B:
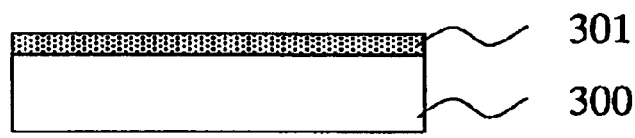
Figure 33A:
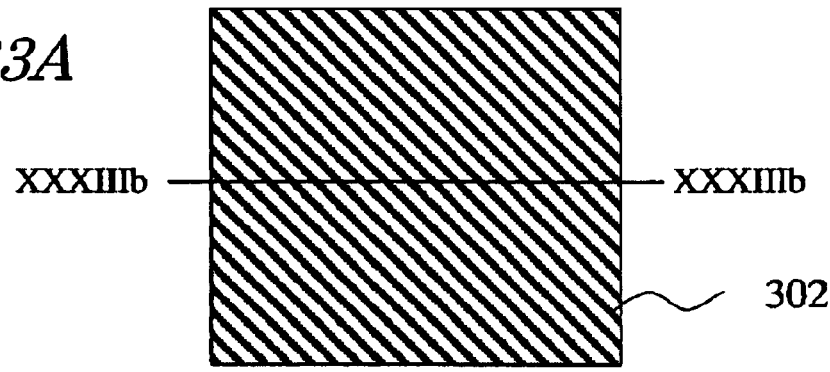
Figure 33B:
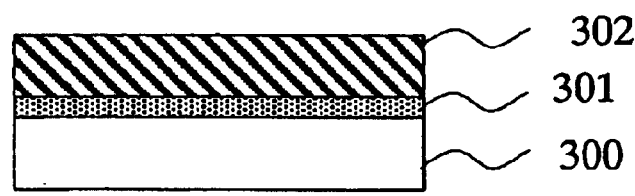
Figure 36A:
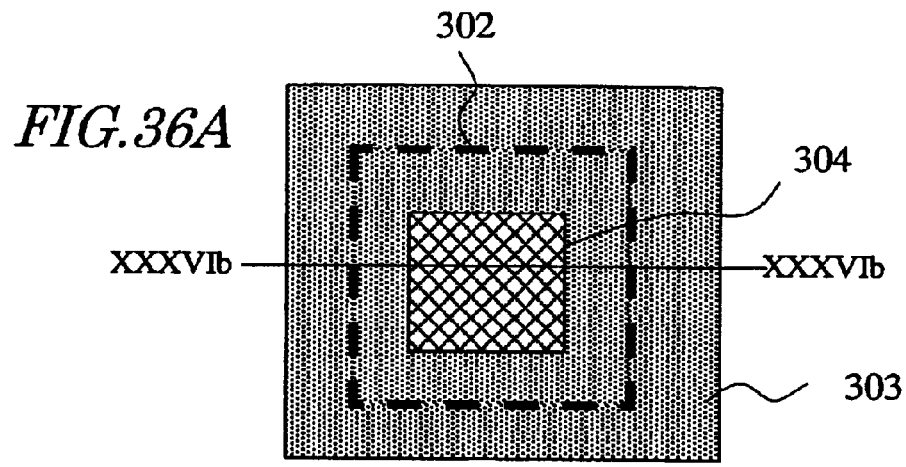
Figure 36B:
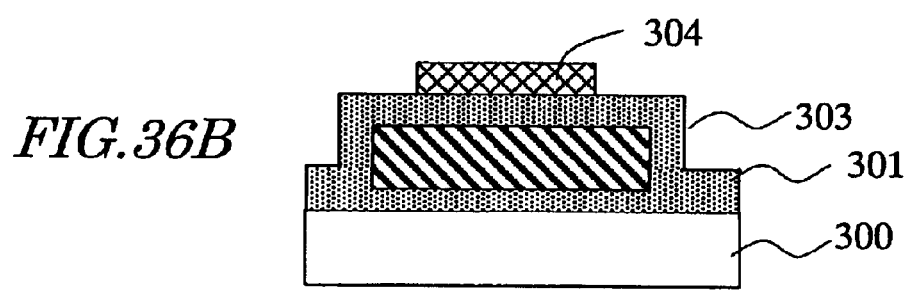
Figure 37A:
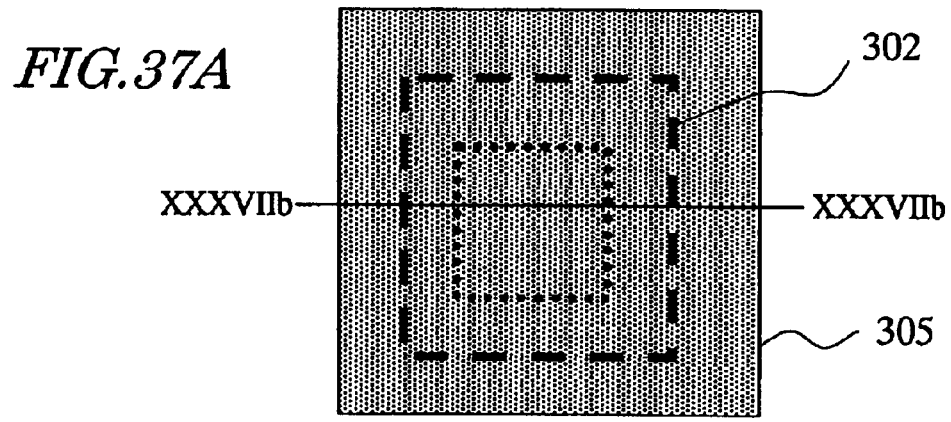
Figure 37B:
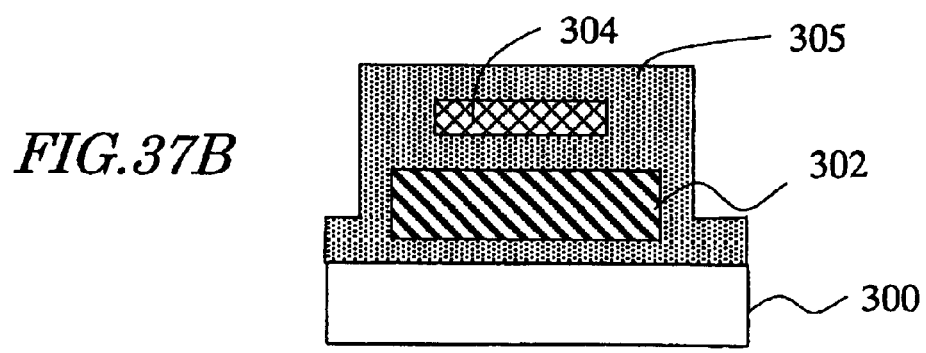
Figure 38A:
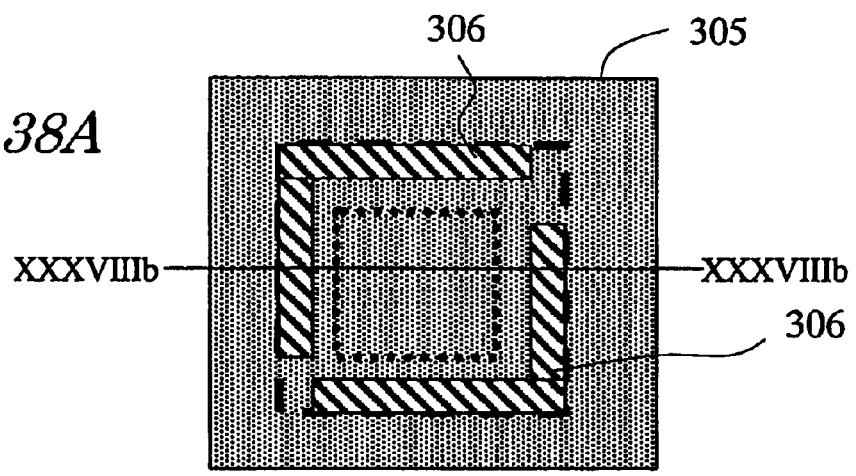
Figure 38B:
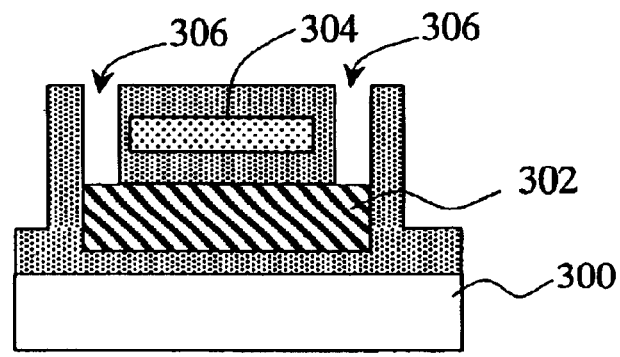
Figure 39A:
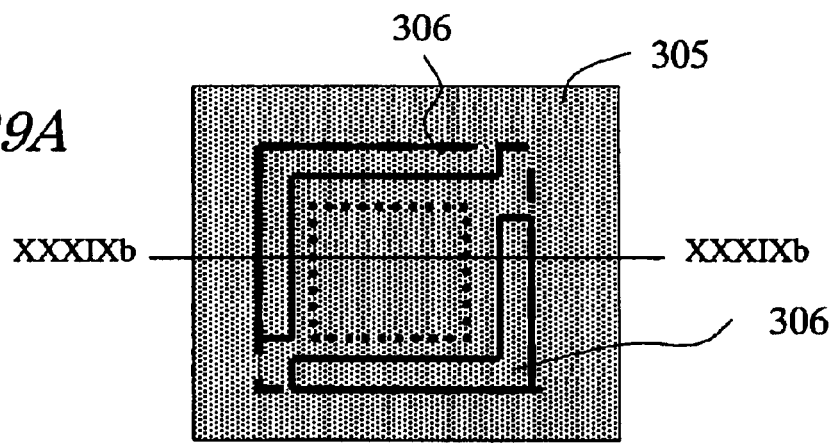
Figure 39B:
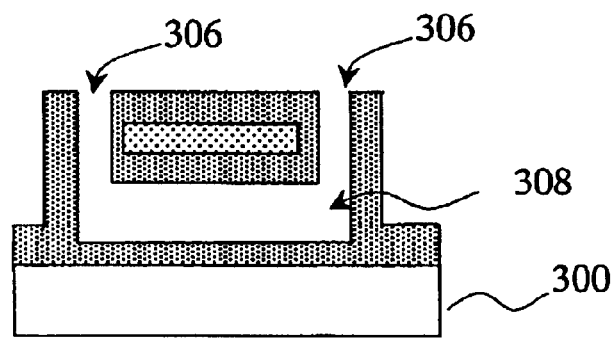

FIG. 30 is an electric circuit diagram showing a controller for use in the pyroelectric infrared sensor of this seventh preferred embodiment. A capacitor 251 is defined by the lower electrode 215, dielectric film 218 and upper electrode 219. The lower electrode 215 is grounded. Four transistors 252, 253, 254 and 256 are preferably arranged as shown in FIG. 30. The transistor 252 is a depletion type charge detecting transistor, the gate of which is connected to the upper electrode 219 by way of a node N1. The transistor 253 is a resetting MIS transistor, the drain of which is connected to the upper electrode 219 by way of the node N1. The transistor 254 is a switching transistor, the source of which is connected to the source of the charge detecting transistor 252 and the gate of which is connected to a word line. The transistor 256 is provided for a resistor.

The infrared sensor of this preferred embodiment obtains the infrared exposure dose by detecting the quantity of charge created at the node N1 when polarization occurs in the dielectric film 218 of the pyroelectric material $PbTiO_3$ in response to incident infrared radiation.

Examples of preferred pyroelectric materials include not just $PbTiO_3$ but also ZnO and PZT.

The present invention is applicable for use in not only such infrared sensors but also pressure sensors, acceleration sensors, flow velocity sensors and other electronic devices.

Infrared sensors of various types are roughly classifiable into thermal sensing types including bolometers, pyroelectric sensors and thermopiles and quantum sensing types that use PbS, InSb or HgCdTe. Some bolometers utilize a variation in electrical resistance of polysilicon, Ti, TiON or $VO_x$. Some thermopiles utilize the Seebeck effect occurring in a pn junction and others utilize the transient characteristic of a forward biased current flowing through a PN diode, for example. Some pyroelectric infrared sensors utilize a variation in dielectric constant of PZT, BST, ZnO, PbTiO$_3$ or any other pyroelectric material. An infrared sensor of a quantum sensing type detects a current flowing due to excitation of electrons. For example, an infrared sensor including a Chromel-Alumel thermocouple that detects incident infrared radiation by utilizing the Seebeck effect is one such quantum sensing infrared sensor.

In each of these infrared sensors, the radiation of heat from the infrared detector is preferably minimized to maintain sufficiently high infrared spectral responsivity and resolution. Thus, if the infrared detector is encapsulated within a vacuum or an inert atmosphere inside of a cap member, then the infrared detector can exhibit improved characteristics.

If the viscous drag of the air is decreased, then the responsivity of a pressure sensor or an acceleration sensor increases. Thus, it is known that the pressure sensor or acceleration sensor also exhibits improved characteristics if the infrared detector thereof is encapsulated within a vacuum or an inert atmosphere inside of a cap member.

How Much Responsivity is Increased

Hereinafter, it will be described exactly how much the responsivity of the infrared sensor to incident infrared radiation (which will be referred to herein as an "infrared spectral responsivity") can be increased by the present invention.

In an infrared sensor of a thermal sensing type, the smaller the thermal conductance produced between the infrared detector and the substrate, the higher the responsivity of the sensor. In the conventional process, however, no walls or columns are removed from the cavity. Accordingly, the thermal conductance is increased by these portions, thus decreasing the responsivity.

In contrast, in various preferred embodiments of the present invention, a heat treatment is carried out, the upper portion of the cavity is reinforced, and then those columns and walls are dry-etched away as described above. Thus, the infrared spectral responsivity can be increased with the damage on the ceiling minimized.

[Equations to Analyze the Responsivity]

According to S. Sedky, P. Fiorini, M. Caymax, C. Baeart and R. Nertens, "Characterization of Bolometers based on Polycrystalline Silicon-Germanium Alloys", IEEE Electron Device Letters Vol. 19, No. 10, October 1998, the infrared spectral responsivity Rv is given by the following Equation (1):

$$Rv = dV/dQ = (\alpha \eta / G(Rbb + Rsr)^2) \times V \times Rsr \times Rbb \qquad (1)$$

where Q is the infrared radiation energy [W] irradiated onto a pixel region per unit time, V is the voltage [V] created between the two terminals of the bolometer, G is the thermal conductance [W/K] produced in the interface between the pixel region and the substrate, a$\alpha$ is the rate [/K] of the variation in resistance of the bolometer to the variation in temperature, $\eta$ is the emissivity of the object, Rbb is the resistance value [$\Omega$] of the bolometer, Rsr is the resistance value [$\Omega$] of a load resistor that is connected in series to the bolometer, and V is the voltage [V] applied to the bolometer and load resistor.

As can be seen from Equation (1), the responsivity Rv is inversely proportional to the thermal conductance G.

Let us focus on the thermal conductance G to calculate the rate of increase in responsivity according to the present invention. The thermal conductance G to be produced between the infrared detector (i.e., the pixel region) and the substrate is given by the following Equation (2):

$$G = Gleg + Gper \qquad (2)$$

where Gleg is the thermal conductance [W/K] produced in the column portions of the cavity and Gper is the thermal conductance [W/K] produced in the lateral portions of the cavity.

Supposing the sensor is operated within a vacuum package, the heat dissipated from the pixel region by way of the air is not herein taken into consideration. Furthermore, the sensor is also supposed to operate at room temperature, and the radiated heat is not taken into consideration, either.

Gleg in Equation (2) is obtained by the following Equation (3):

$$Gleg = g \times Sleg / Lleg \times Nleg \qquad (3)$$

where g is the thermal conductivity [W/mk] of SiO$_2$ (about 1.4), Sleg is the cross-sectional area [m$^2$] of the columns, Nleg is the number of the columns, and Lleg is the length [m] of the columns.

If the following Conditions Nos. 1 and 2 are substituted for Sleg and Lleg of Equation (3), the following Equation (4) is obtained:

Condition No. 1: $Sleg = 2.5 \times 10^{-11}$ m$^2$

Condition No. 2: $Lleg = 2 \times 10^{-6}$ m = 2 $\mu$m $$Gleg = Nleg \times 1.75 \times 10^{-5} \qquad (4)$$

Supposing the lateral portions and twelve column portions of the cavity are dry-etched away as a combination of the first and second preferred embodiments described above, Gper is zero, and the thermal conductance G is $7.00 \times 10^{-5}$.

In the prior art on the other hand, the lateral portions of the cavity have a complex shape, and Gper cannot be analyzed by such a simple method but can be calculated through simulations. Suppose sixteen columns are provided in the conventional cavity. If the upper portion of the cavity has a thickness of about 2 $\mu$m and if the peripheral length of the cavity as viewed from over the upper surface thereof is about 400 $\mu$m, then $$Gper = 5.6 \times 10^{-4} \, [W/K]$$

Consequently, the thermal conductance G is about $8.40 \times 10^{-4}$ in the prior art. Thus, in the manufacturing process of the present invention, the thermal conductance G can be reduced by about one order of magnitude (to approximately 1/12 in this example) as compared with the conventional process.

Embodiment 8

Hereinafter, a method for fabricating an electronic device according to an eighth specific preferred embodiment of the present invention will be described with reference to FIGS. 40A through 48C.

Figure 40A:
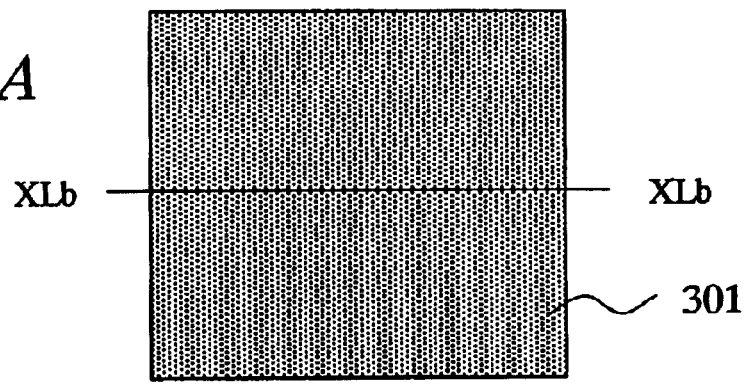
FIGS. 40A, 41A, 42A, 43A, 44A, 45A, 46A, 47A and 48A are plan views illustrating respective process steps for fabricating an infrared sensor according to an eighth specific preferred embodiment of the present invention.
Figure 40B:
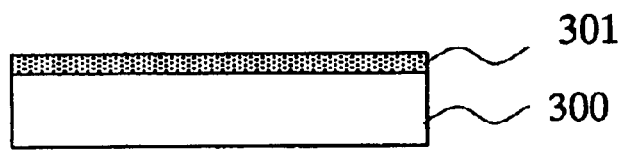
FIGS. 40B, 41B, 42B, 43B, 44B, 45B, 46B, 47B, 48B and 48C are cross-sectional views of the structures shown in FIGS. 40A, 41A, 42A, 43A, 44A, 45A, 46A, 47A, 48A and 48A as taken on the planes XLb—XLb, XLIb—XLIb, XLIIb—XLIIb, XLIIIb—XLIIIb, XLIVb—XLIVb, XLVb—XLVb, XLVIb—XLVIb, XLVIIb—XLVIIb, XLVIIIb—XLVIIIb and XLVIIIb—XLVIIIb, respectively.

First, as shown in FIGS. 40A and 40B, a silicon dioxide layer 301 is deposited on a silicon substrate 300. When a polysilicon film 302 to be deposited in the next process step is etched, the silicon dioxide layer 301 will function as a lower etch stop layer.

Figure 41A:
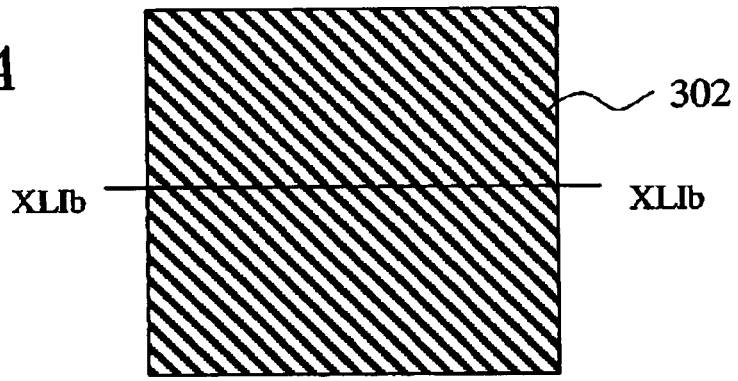
Figure 41B:
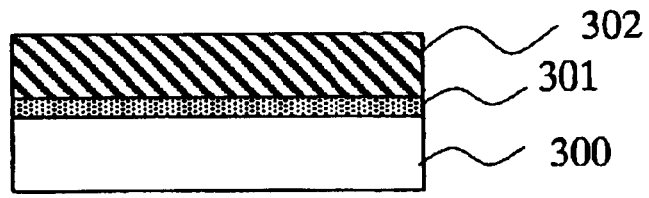

Next, as shown in FIGS. 41A and 41B, the polysilicon film 302 is deposited on the silicon dioxide layer 301. The polysilicon film 302 will function as a cavity defining sacrificial layer and the thickness of the polysilicon film 302 will substantially define the height of the cavity to be formed later. In this preferred embodiment, the polysilicon film 302 preferably has a thickness of about 1 μm. The polysilicon film 302 covers the entire surface of the substrate 300 at this point in time but will be patterned into a cavity defining shape in the next process step.

Figure 42A:
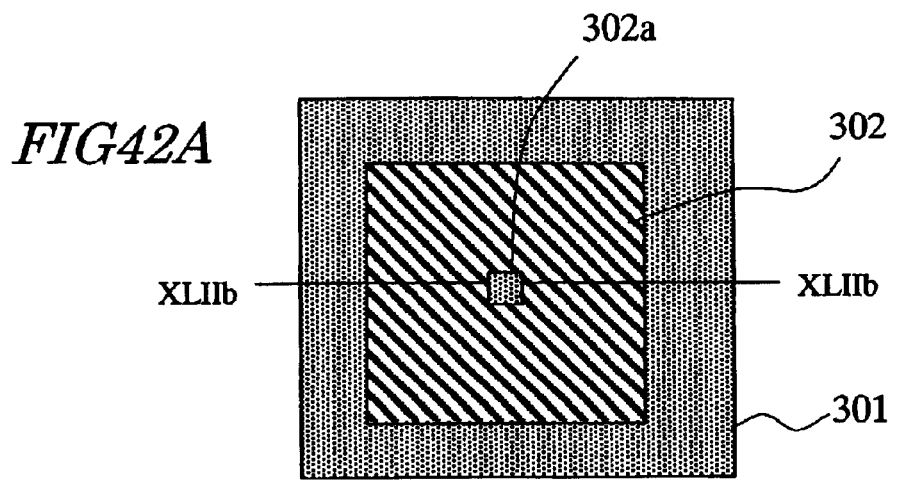
Figure 42B:
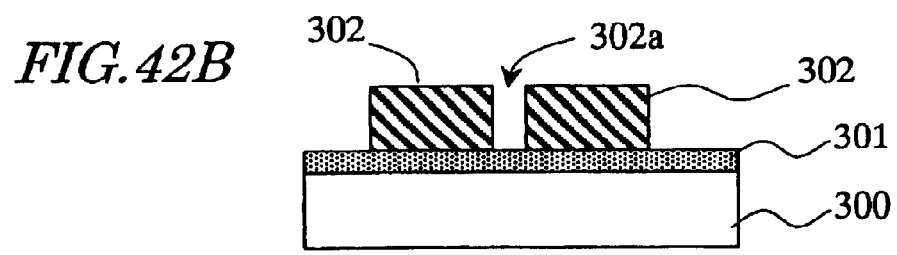

Subsequently, as shown in FIGS. 42A and 42B, the polysilicon film 302 is patterned by photolithographic and etching techniques. The patterned polysilicon film 302 will define the shape of provisional cavity. In this preferred embodiment, the patterned polysilicon film 302 has an opening 302a, which is located approximately at the center of the polysilicon film 302 and reaches the underlying silicon dioxide film 301. When the provisional cavity is defined by etching away the polysilicon film 302, this opening 302a will define the shape and location of a supporting portion to support the ceiling of the provisional cavity. This opening 302a may be defined by a through hole that has a depth of about 1 μm and a diameter of about 0.4 μm.

Figure 43A:
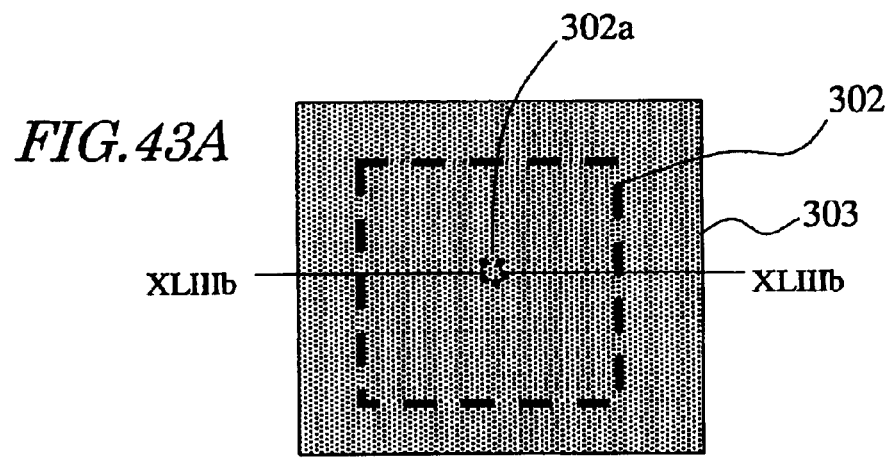
Figure 43B:
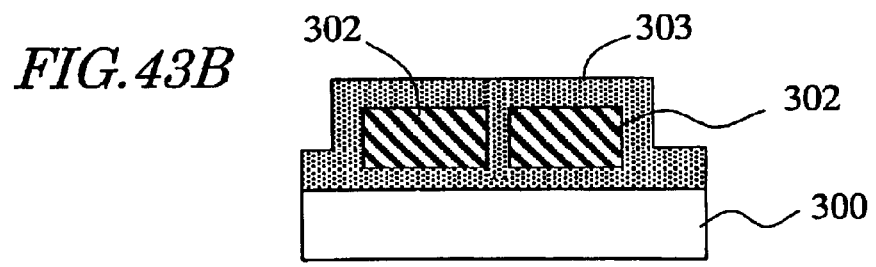

Next, as shown in FIGS. 43A and 43B, another silicon dioxide layer 303 is deposited on the patterned polysilicon film 302. The silicon dioxide layer 303 will function as an upper etch stop layer when the polysilicon film 302 is etched. However, a portion of the silicon dioxide layer 303 fills the opening 302a of the polysilicon film 302. That portion of the silicon dioxide layer 303, filling the opening 302a, will function as a supporting portion for the upper etch stop layer, thereby preventing the provisional cavity from being blocked.

The thickness of the silicon dioxide layer 303 is determined appropriately according to the inside diameter and depth of the opening 302a of the polysilicon film 302. In this preferred embodiment, the silicon dioxide layer 303 preferably has a thickness of about 200 nm.

Figure 44A:
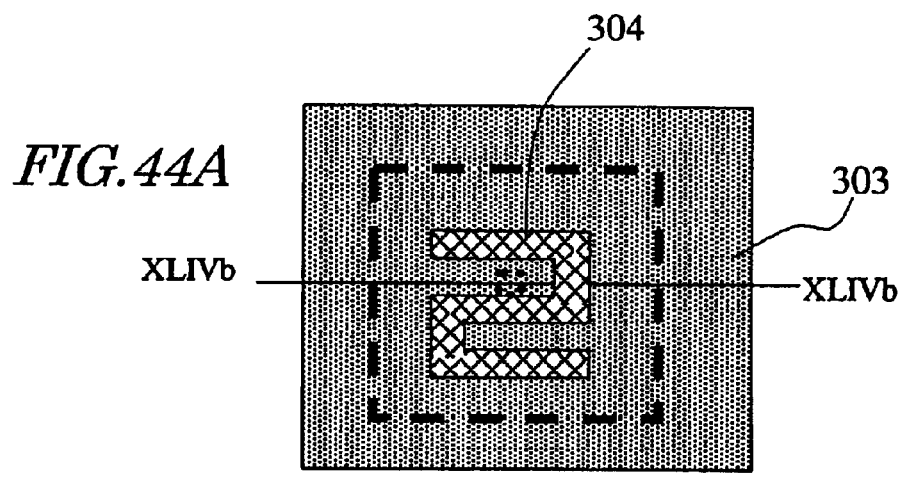
Figure 44B:
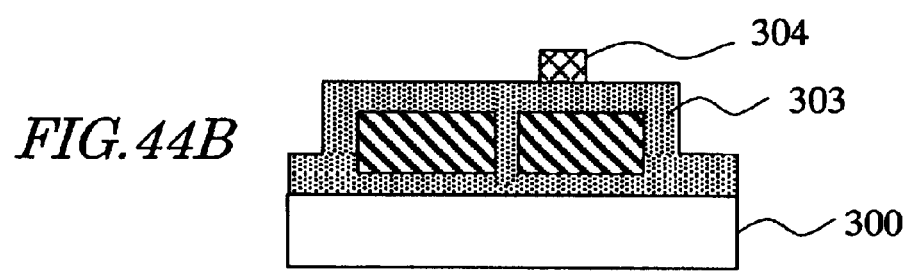

Thereafter, as shown in FIGS. 44A and 44B, a bolometer 304 is formed on the silicon dioxide layer 303 so as not to overlap with the opening 302a of the polysilicon film 302.

Figure 45A:
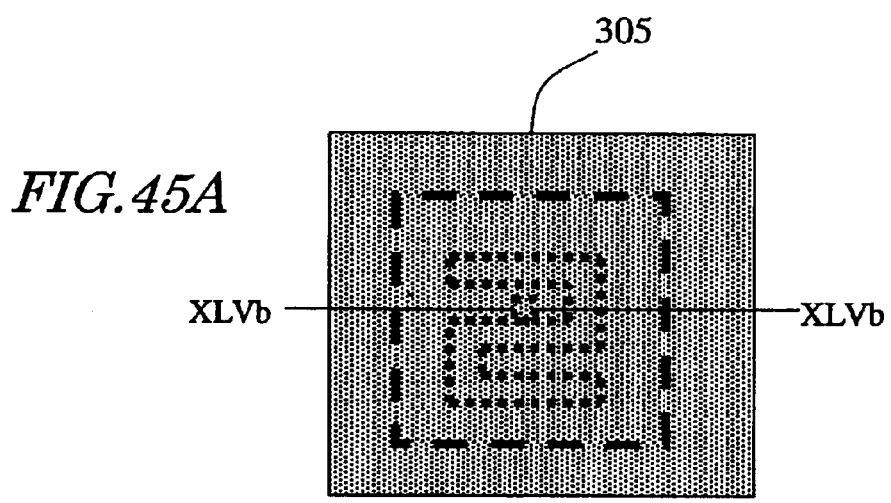
Figure 45B:
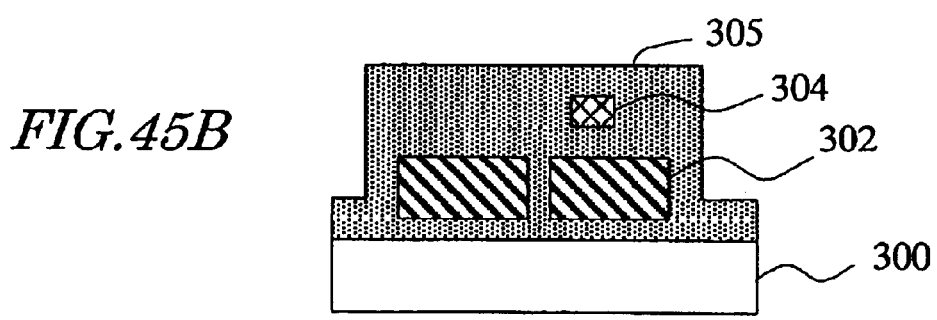

Subsequently, as shown in FIGS. 45A and 45B, yet another silicon dioxide layer 305 is deposited over the bolometer 304 so as to function as an infrared radiation absorbing portion.

Figure 46A:
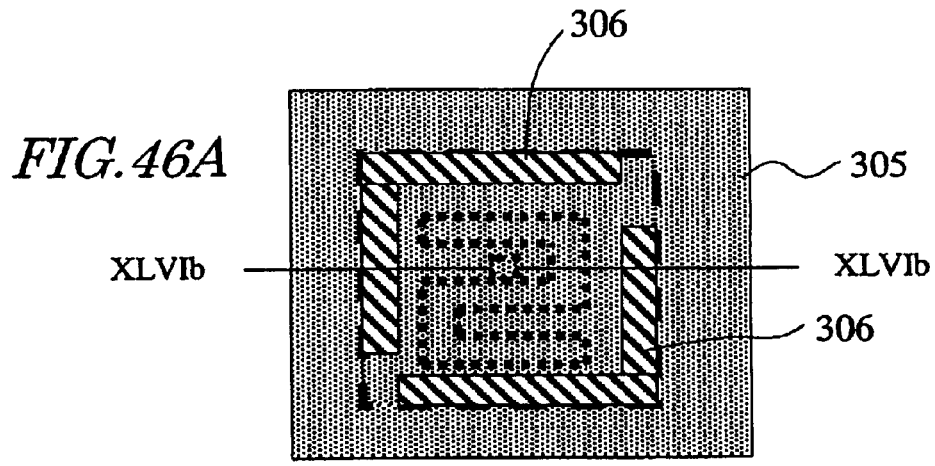
Figure 46B:
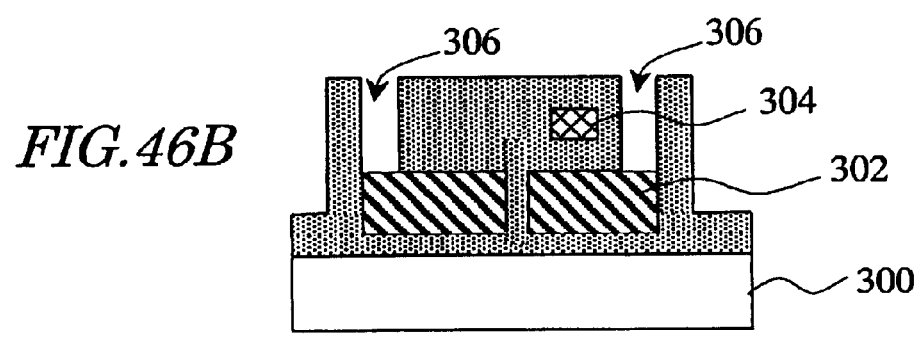

Then, as shown in FIGS. 46A and 46B, holes 306 are formed by photolithographic and etching techniques through the stack of silicon dioxide layers 303 and 305, thereby partially exposing the surface of the polysilicon film 302 as the cavity defining sacrificial layer.

Figure 47A:
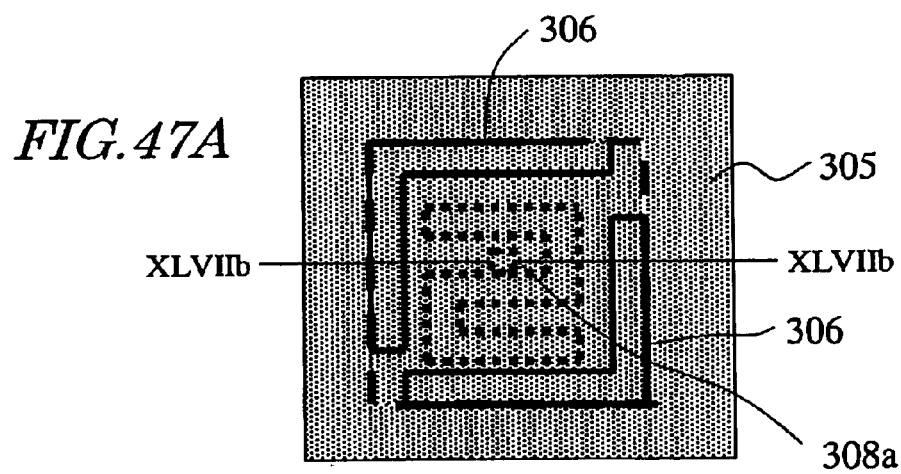
Figure 47B:
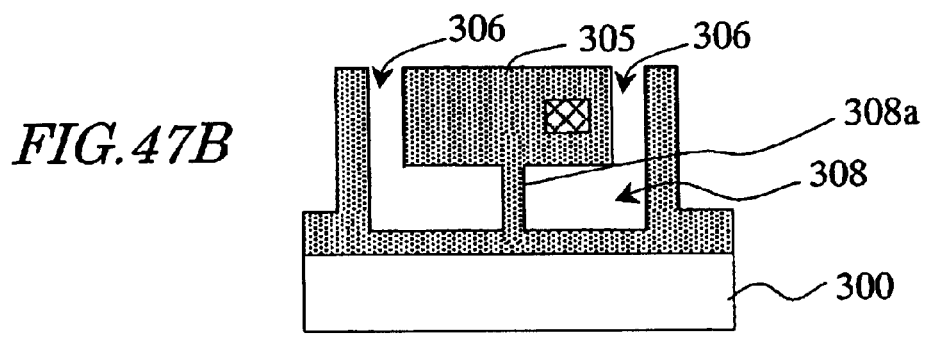

Next, hydrazine ($H_4N_2$) is supplied through the holes 306 of the silicon dioxide layers 303 and 305, thereby etching away the remaining polysilicon film 302. As a result of this etching process, the polysilicon film 302 is removed completely and a provisional cavity 308 is defined under the silicon dioxide layers 303 and 305 as shown in FIGS. 47A and 47B. In this case, a portion of the silicon dioxide layer is not etched by hydrazine ($H_4N_2$) but left where the opening 302a of the polysilicon film 302 was located. Thus, a column (i.e., supporting portion) 308a is defined. The provisional cavity 308 will be expanded in a subsequent process step. In this process step, the polysilicon film 302 may be removed by any other chemical agent such as tetramethylammonium hydroxide (TMAH) or KOH or by an XeF or any other suitable gas.

Figure 48A:
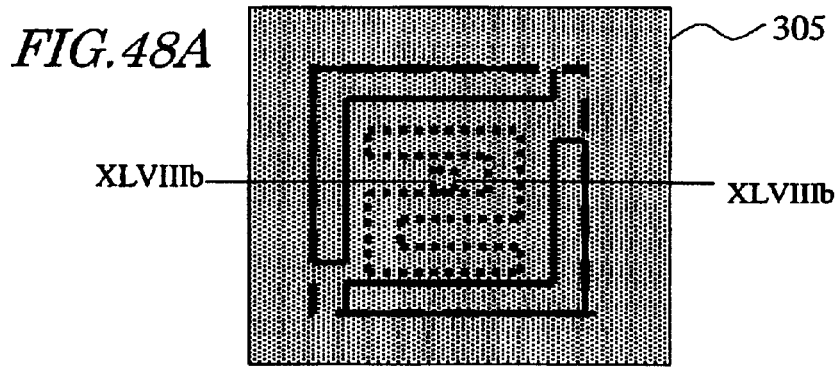
Figures 48B, 48C:
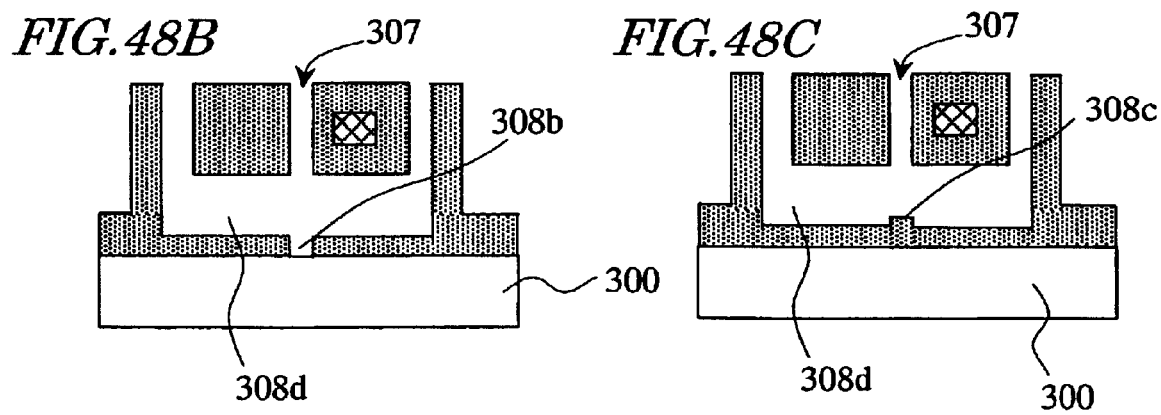

Thereafter, as shown in FIGS. 48A, 48B and 48C, the column 308a is dry-etched away from inside of the provisional cavity 308, thereby expanding the provisional cavity 308 into a final cavity 308d. The column 308a is removed by etching downward a portion of the stacked silicon dioxide layers 303 and 305 that is located right over the column 308a. This etching process is preferably carried out with a resist mask (not shown). More specifically, a photoresist mask (not shown) is defined on the silicon dioxide layer 305 such that an opening of the resist mask is located right over the column 308a. Then, the silicon dioxide layers 303 and 305 are etched anisotropically through the opening of the resist mask.

FIGS. 48B and 48C are cross-sectional views showing two possible structures from which the column 308a has just been removed. In this preferred embodiment, either a recess 308b such as that shown in FIG. 48B or a protrusion 308c such as that shown in FIG. 48C is left where the column 308a was present. This feature can be confirmed by observing the device of this preferred embodiment with an electron microscope, for example.

In this preferred embodiment, the supporting portion of silicon dioxide is preferably etched away by using at least one type of gas to be selected from the group consisting of $CF_4$, $H_2$, $CH_3$, $C_2F_6$, $C_4F_8$, $CH_2F_2$, CO, Ar and $O_2$ gases. Accordingly, C, F and other elements are left profusely, but no element N is left, in the recess 308b or the protrusion 308c. In contrast, in the conventional process in which the cavity 308 is formed by etching the polysilicon film 302 with hydrazine or TMAH, element N should be left on the inner walls of the cavity 308. In the same way, if the polysilicon film 302 is etched with KOH, element K will be left on the inner walls of the cavity.

If the polysilicon film 302 is wet-etched away with hydrazine or any other chemical solution, then an excessive stress may be applied to, may cause some damage in, the device when the chemical solution is dried. However, if the polysilicon film 302 is wet-etched away with a chemical solution as is done in this preferred embodiment, then such damage is avoidable because the column 308a is left as the supporting portion. Also, in the subsequent process step of removing the column (supporting portion) 308a, a dry etching technique is adopted and such damage is also avoidable.

In the preferred embodiment described above, the polysilicon film 302 is used as a cavity defining sacrificial layer. Alternatively, the cavity defining sacrificial layer may also be made of amorphous silicon, silicon dioxide or any other suitable material. When the cavity defining sacrificial layer is made of silicon dioxide, the provisional cavity may be defined by using hydrofluoric acid as an etchant. In that case, however, the etch stop layers are preferably made of a material that is hard to etch by hydrofluoric acid.

It should be noted that an internal oxide layer of an SOI substrate may also be used as an etch stop layer. In that case, an opening may be defined through the internal oxide layer, a chemical agent or etchant may be introduced to form a provisional cavity under the internal oxide layer, and then the column may be dry-etched away from inside of the provisional cavity.

To cut down the manufacturing cost, the process step of defining the provisional cavity by removing the cavity defining sacrificial layer is preferably carried out as a wet etching process that uses a chemical solution such as TMAH. However, a dry etching process that uses XeF or any other suitable gas may also be carried out for that purpose.

If the cavity defining sacrificial layer is made of silicon dioxide and is removed by hydrofluoric acid, all of the process steps of this infrared sensor manufacturing process can be carried out as a silicon process that is normally adopted to fabricate an LSI. In that case, various preferred embodiments of the present invention can be carried out with a normal LSI manufacturing system, thus cutting down the manufacturing cost significantly.

In the preferred embodiment described above, the cavity is provided for the purpose of improving the thermal insulation of the infrared sensor. However, the present invention is also applicable for use in forming a membrane structure with a bottom cavity for any other type of sensor such as an acceleration sensor, a communications device such as a filter, or any other type of electronic device.

In the process step of removing the column 308a, however, the following respects should be borne in mind.

Generally speaking, when a thin film is patterned by an etching process, the thin film is partially covered with a mask, which protects the other portions of the thin film that should not be etched, and then target portions of the thin film are etched away through the openings of the mask. The mask is normally made of a photoresist material. However, if the surface of the thin film has a significant degree of roughness, then the surface sometimes cannot be coated with the photoresist material evenly enough to get the thin film patterned just as intended. In an infrared image sensor, for example, the cavity normally has a height of about 2 $\mu$m, thus creating a level difference of about 2 $\mu$m on the surface of the substrate and possibly making the photoresist pattern unevenly applied. Also, in a photolithographic process, when the photoresist material applied is baked, a stress may be created in the supporting portion, thus possibly doing some damage on the cavity. Even when such a problem happens, however, the supporting portion can still be dry-etched away with good reproducibility by performing the following process steps.

Figure 58A:
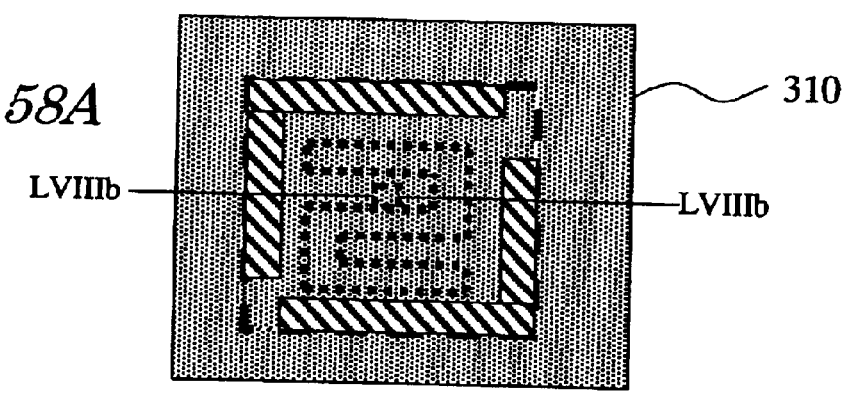
FIGS. 58A, 59A, 60A and 61A are plan views illustrating respective process steps for fabricating an infrared sensor according to an eighth specific preferred embodiment of the present invention.
Figure 58B:
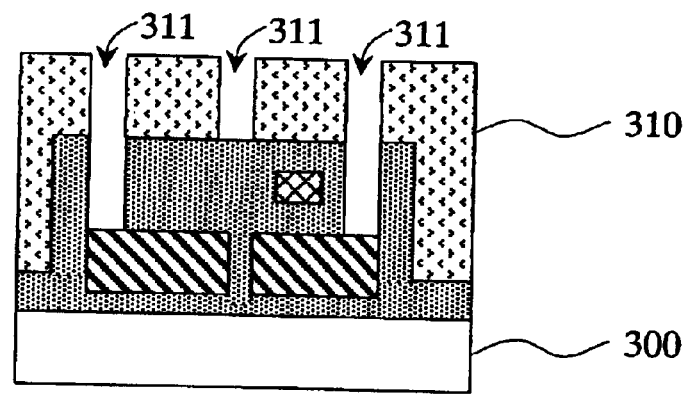
FIGS. 58B, 59B, 60B and 61B are cross-sectional views of the structures shown in FIGS. 58A, 59A, 60A and 61A as taken on the planes LVIIIb—LVIIIb, LIXb—LIXb, LX-LXb and LXIb—LXIb, respectively.

First, after the holes 306 have been formed as shown in FIGS. 46A and 46B, a resist mask, having openings over the holes 306 and the column 308a, is defined on the substrate. FIGS. 58A and 58B show the state in which a resist mask 310 having such openings 311 has been defined.

Figure 59A:
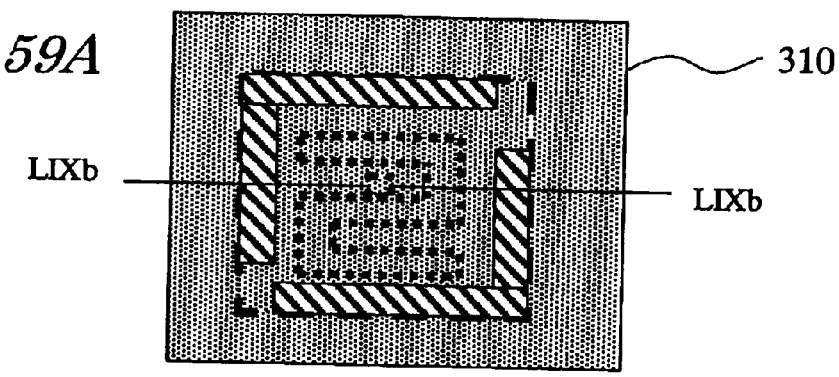
Figure 59B:
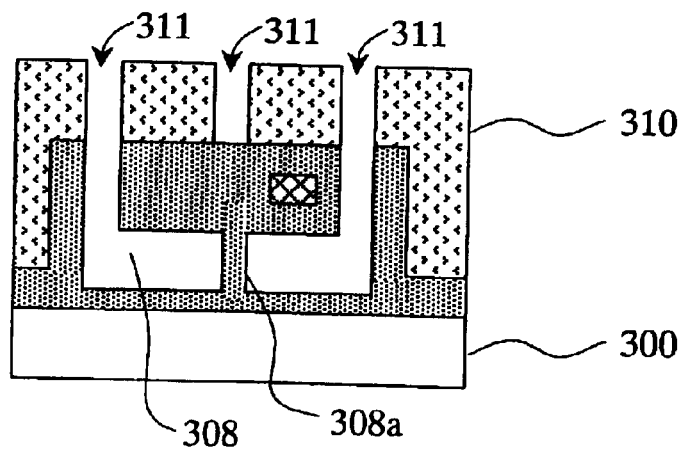

Next, hydrazine or any other chemical agent or etchant, which should etch the polysilicon film 302 selectively, is introduced through the openings 311 of the resist mask 310, thereby removing the polysilicon film 302 and defining a provisional cavity 308 as shown in FIGS. 59A and 59B. In this process step, the chemical such as hydrazine also contacts with the column 308a of silicon dioxide but does not etch the silicon dioxide at all. Accordingly, when the provisional cavity 308 is formed, the column 308a is not etched at all but functions as a supporting portion.

Figure 60A:
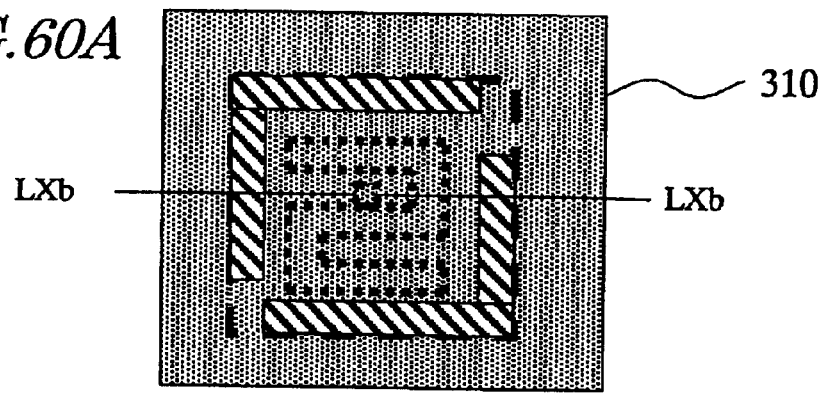
Figure 60B:
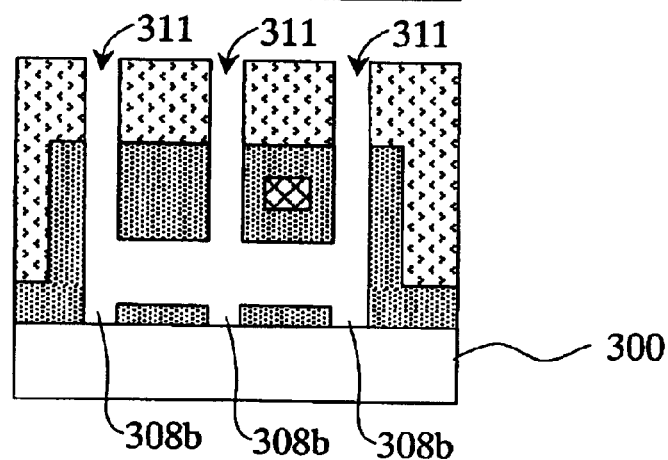

Thereafter, without stripping the resist mask 310, the substrate is loaded into a dry etching system, thereby removing portions of the silicon dioxide layers 303 and 305 that are not covered with the resist mask 310. FIGS. 60A and 60B show an intermediate state in which some (including the column 308a) of those non-covered portions of the silicon dioxide layers has been removed by the dry etching process. If the conditions of the dry etching process are adjusted appropriately, only the silicon dioxide layers can be removed selectively without etching the underlying silicon substrate 300 at all. As a result of this dry etching process, the recesses 308b are formed in the silicon dioxide layer 301. It should be noted that the column 308a does not have to be removed completely but a portion of the column 308a may be left as the protrusion 308c.

Figure 61A:
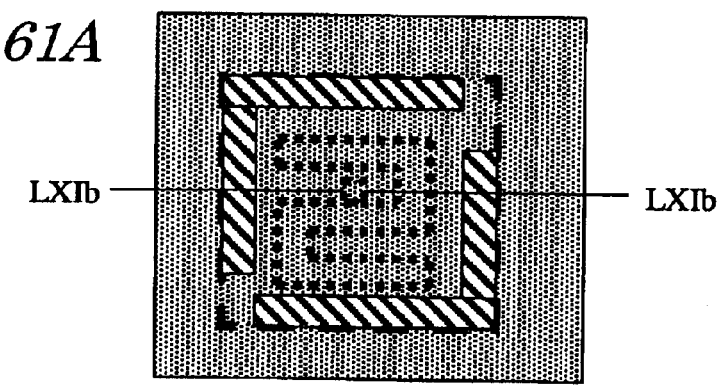
Figure 61B:
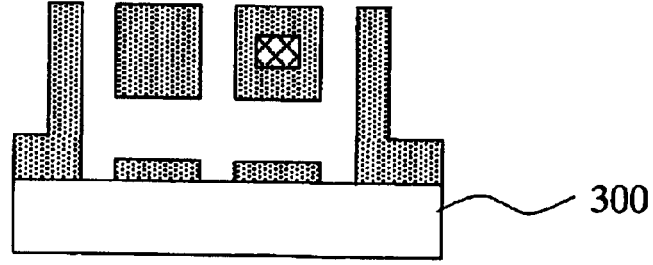

Finally, the resist mask 310 is stripped. FIGS. 61A and 61B show a state in which the resist mask 310 has been removed. If the substrate is subjected to a sulfuric acid cleaning or exposed to any other chemical solution to strip the photoresist material, then the chemical solution should enter the cavity 308. In that case, an unwanted stress may be produced and may do some damage on the cavity 308 in the drying process step. For that reason, the photoresist material 310 is preferably removed by ashing or any other process using no such chemical solution.

Embodiment 9

Hereinafter, a method for fabricating an electronic device according to a ninth specific preferred embodiment of the present invention will be described with reference to FIGS. 49A through 52C.

First, by performing the process steps shown in FIGS. 32A through 37B of the conventional manufacturing process that has already been mentioned in the background section, a structure including a polysilicon film that is covered with a silicon dioxide layer is obtained. In this ninth preferred embodiment, however, a polysilicon film 302 that has been patterned by photolithographic and etching processes so as to have notches at the four corners thereof is used.

Figure 49A:
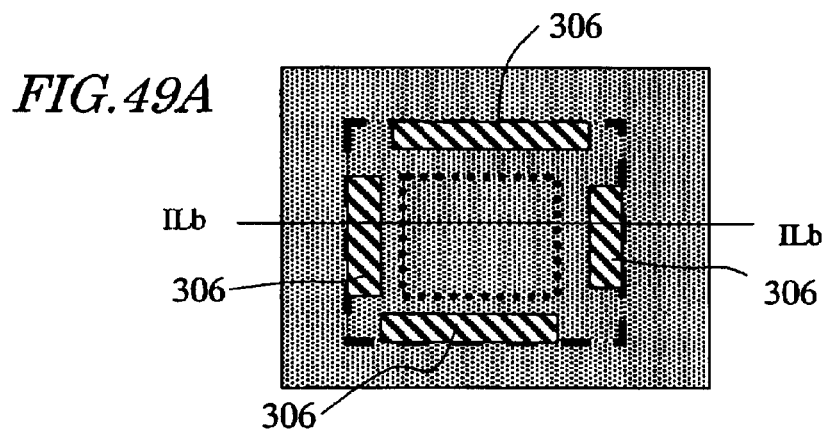
FIGS. 49A, 50A, 51A and 52A are plan views illustrating respective process steps for fabricating an infrared sensor according to a ninth specific preferred embodiment of the present invention.
Figure 49B:
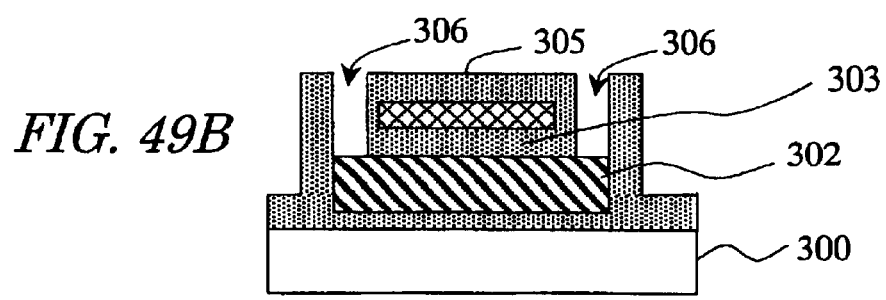
FIGS. 49B, 50B, 51B, 51C, 52B and 52C are cross-sectional views of the structures shown in FIGS. 49A, 50A, 51A, 51A, 52A and 52A as taken on the planes ILb—ILb, Lb—Lb, LIb—LIb, LIc—LIc, LIIb—LIIb and LIIc—LIIc, respectively.

Next, as shown in FIGS. 49A and 49B, openings 306 are formed through the silicon dioxide layers 303 and 305 so as to reach the polysilicon film 302. The shape and arrangement of the openings 306 are indicated by the oblique lines in FIG. 49A. The polysilicon film 302 as the cavity defining sacrificial layer is exposed at the bottom of these holes.

Figure 50A:
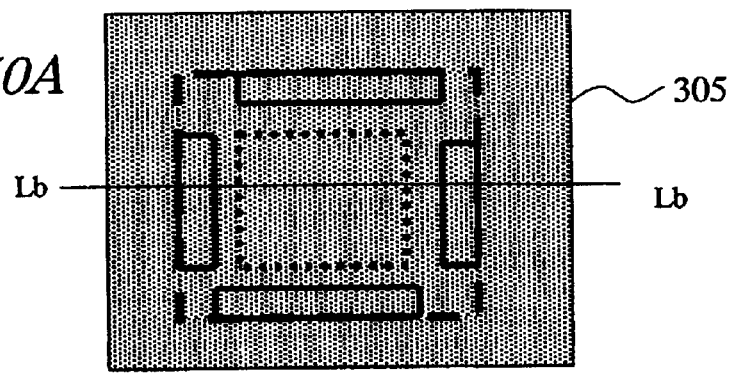
Figure 50B:
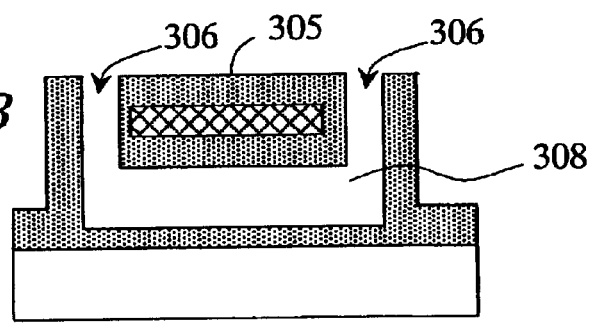

Thereafter, hydrazine is introduced through the openings 306, thereby removing the polysilicon film 302 and defining a provisional cavity 308 as shown in FIGS. 50A and 50B. The chemical agent or etchant for use to remove the polysilicon film 302 does not have to be hydrazine but may also be TMAH or any other suitable etchant.

Figure 51A:
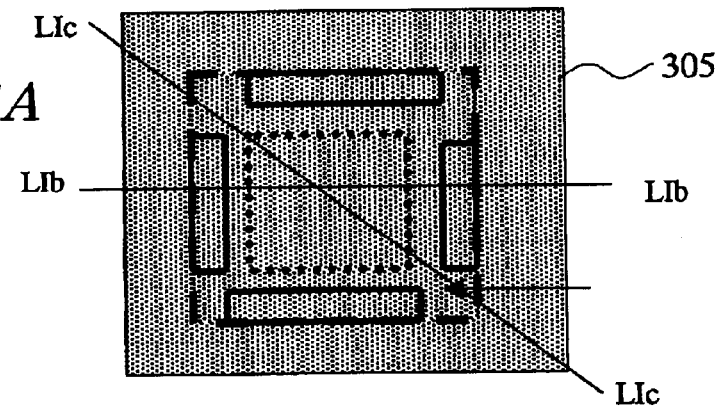
Figure 51B:
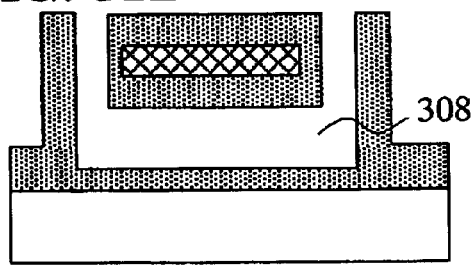
Figure 51C:
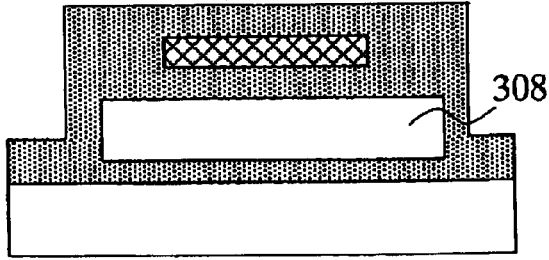

FIGS. 51B and 51C are cross-sectional views taken on the planes LIb—LIb and LIc—LIc shown in FIG. 51A, respectively. In this preferred embodiment, portions of the etch stop layer function as laterally extending supporting portions and are etched away eventually, thereby defining an expanded cavity.

Figure 52A:
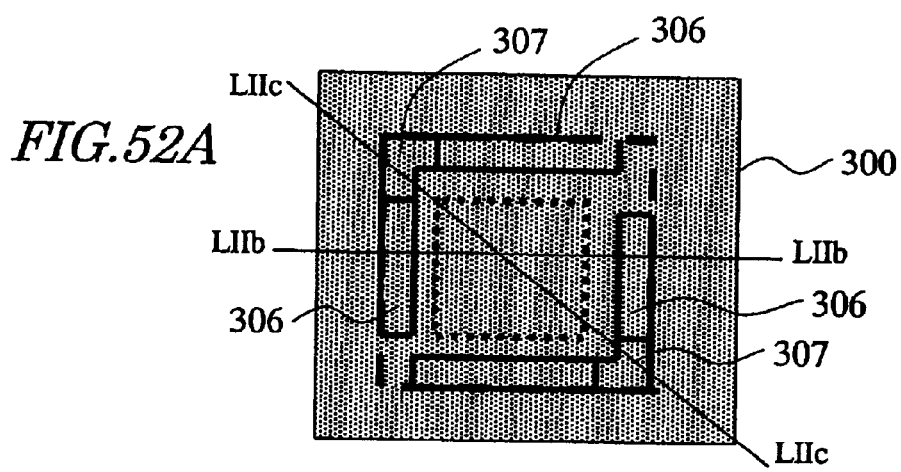
Figure 52B:
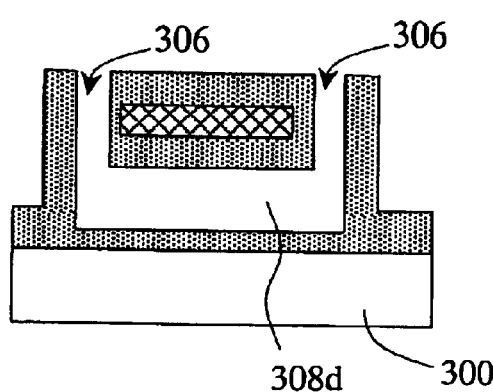
Figure 52C:
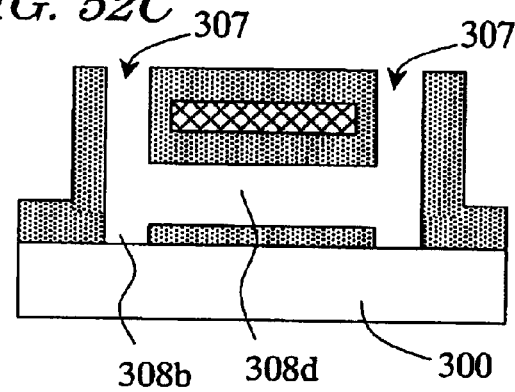

Subsequently, those supporting portions, which are located over the four corners of the provisional cavity 308, are partially etched down anisotropically, thereby removing the supporting portions at least partially to define additional openings 307 and expanding the provisional cavity 308. In this manner, an expanded cavity 308d is obtained as shown in FIGS. 52A, 52B and 52C.

As described above, if the polysilicon film 302 is removed with a chemical solution such as hydrazine, some damage may be done on the provisional cavity 308 when the chemical solution is dried. In this preferred embodiment, however, the supporting portions are left while the polysilicon film 302 is removed, thereby minimizing the damage. And in the next process step, the supporting portions are removed partially to expand the provisional cavity 308.

In this preferred embodiment, the cavity defining sacrificial layer is also made of polysilicon. Alternatively, the cavity defining sacrificial layer may also be made of any other material.

It should be noted that an internal oxide layer of an SOI substrate may also be used as an alternative etch stop layer. In that case, an opening may be defined through the internal oxide layer, a chemical solution may be introduced to form a provisional cavity in the silicon substrate under the internal oxide layer, and then the columns may be dry-etched away from inside of the provisional cavity.

While part of the etch stop layer serves as a supporting portion in this embodiment, a peripheral region surrounding the side face of the cavity defining sacrificial layer can be used as a supporting portion. In this case, the peripheral region is partially dry-etched to form a final cavity.

In the process step of etching the supporting portion(s) for the provisional cavity, a photoresist mask may also be defined as in the eighth preferred embodiment described above.

Embodiment 10

Hereinafter, a method for fabricating an electronic device according to a tenth specific preferred embodiment of the present invention will be described. In this tenth preferred embodiment, an SOI substrate is used.

Figure 53A:
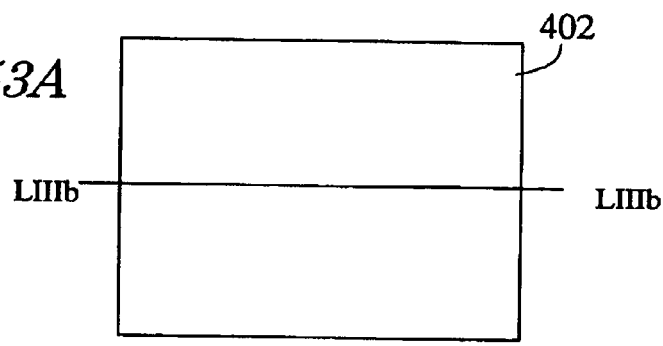
FIGS. 53A, 54A, 55A, 56A and 57A are plan views illustrating respective process steps for fabricating an infrared sensor according to a tenth specific preferred embodiment of the present invention.
Figure 53B:
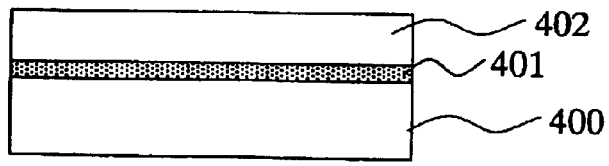
FIGS. 53B, 54B, 55B, 56B and 57B are cross-sectional views of the structures shown in FIGS. 53A, 54A, 55A, 56A, and 57A as taken on the planes LIIIb—LIIIb, LIVb—LIVb, LVb—LVb, LVIb—LVIb and LVIIb—LVIIb, respectively.

FIGS. 53A and 53B are respectively a plan view and cross-sectional view of an SOI substrate for use in this tenth preferred embodiment. The SOI substrate includes an upper silicon layer 402, an internal silicon dioxide layer 401 and a single crystalline silicon substrate 400.

Figure 54A:
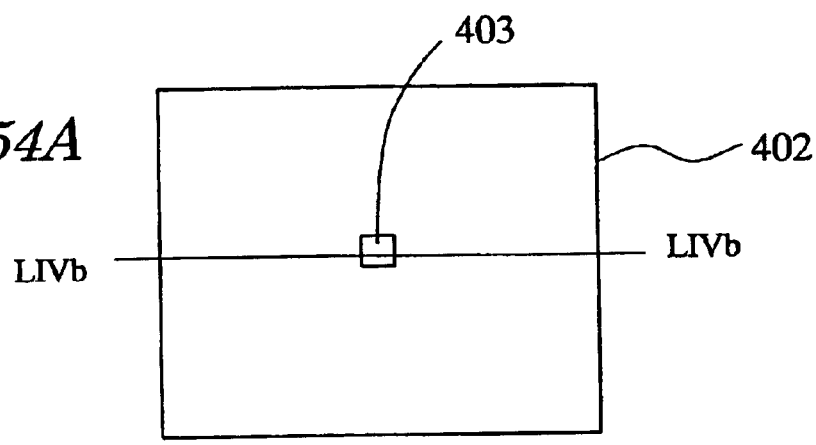
Figure 54B:
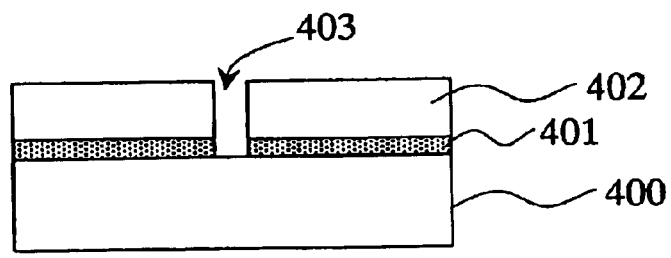

As shown in FIGS. 54A and 54B, an opening 403 is formed so as to extend through the upper silicon layer 402 and the internal silicon dioxide layer 401 of this SOI substrate.

Figure 55A:
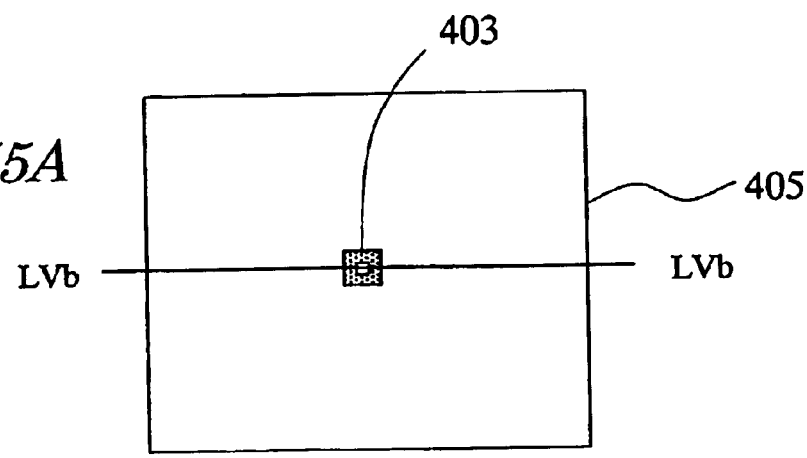
Figure 55B:
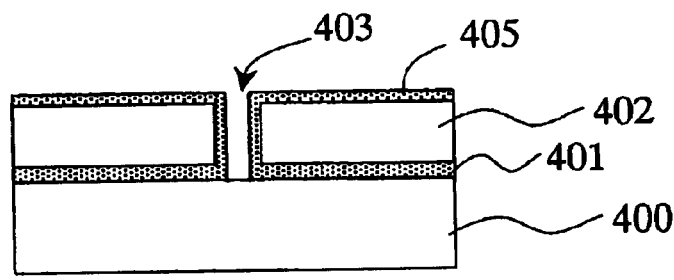

Next, as shown in FIGS. 55A and 55B, a silicon dioxide film 405 is deposited over the surface of the SOI substrate by a CVD process, a thermal oxidation process or any other suitable process.

Figure 56A:
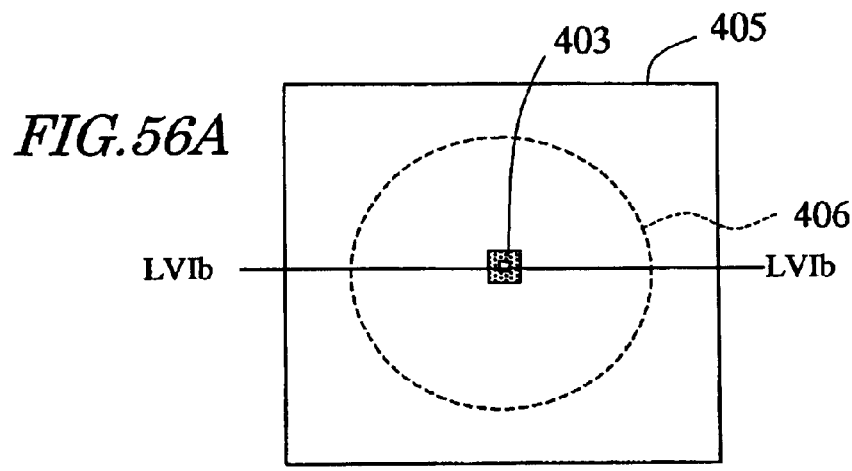
Figure 56B:
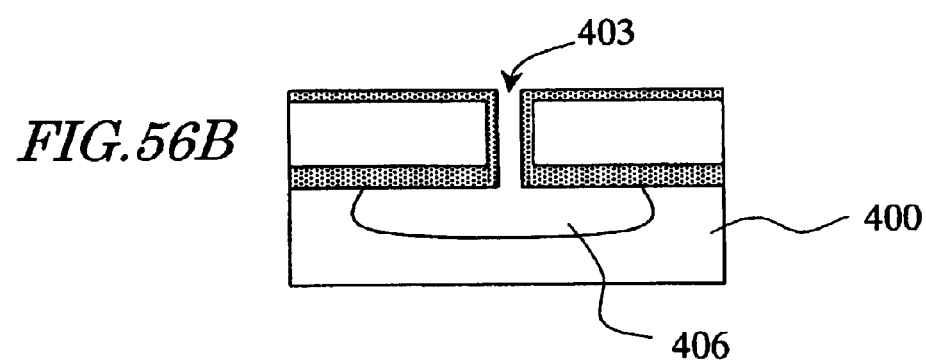

Thereafter, hydrazine is introduced through the opening 403, thereby removing a portion of the single crystalline silicon substrate 400 (i.e., a portion functioning as a sacrificial layer) and defining a provisional cavity 406 as shown in FIGS. 56A and 56B. The silicon substrate may also be etched with TMAH or any other appropriate chemical agent instead of hydrazine.

Figure 57A:
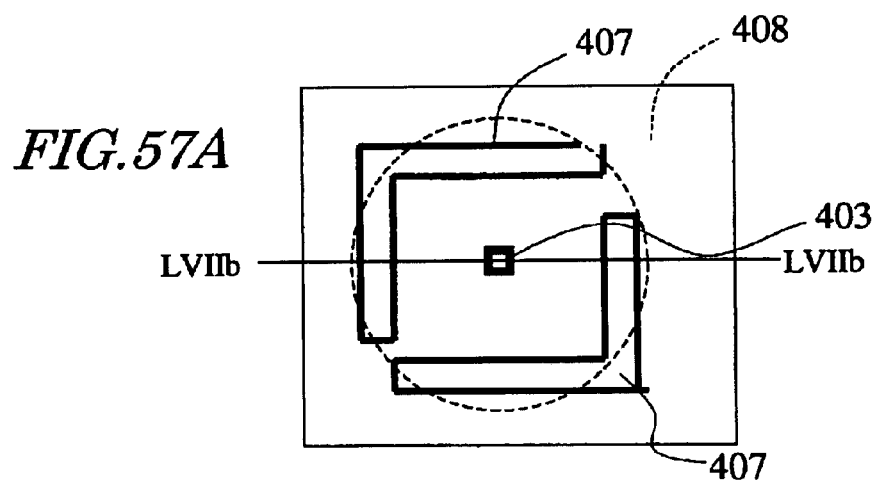
Figure 57B:
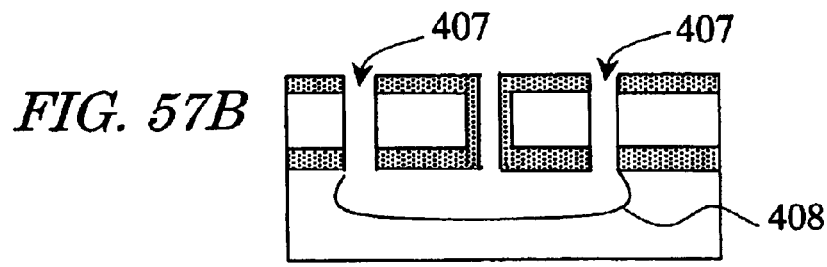

Finally, as shown in FIGS. 57A and 57B, openings 407 are formed through the upper silicon layer 402 and the internal silicon dioxide layer 401 of the SOI substrate, and then a final cavity 408 is defined. By providing these openings 407, the supporting portion to support the silicon dioxide film 405 thereon has a decreased volume, and therefore, the lateral heat flow through the supporting portion can be reduced.

As described above, if the silicon substrate 400 is etched with a chemical solution such as hydrazine, some damage may be done on the provisional cavity 406 when the chemical solution is dried. In this preferred embodiment, however, while the provisional cavity 406 is being formed by etching the silicon substrate 400, the supporting portions of silicon dioxide are left over a wide area, thereby maintaining a sufficient mechanical strength and minimizing the damage. Subsequently, after the chemical solution has been dried, the supporting portions are partially dry-etched away to expand the provisional cavity 406 into a final cavity 408. Thus, a big cavity can be formed at a good yield. In this preferred embodiment, the supporting portions are also etched downward anisotropically. Accordingly, a recess such as that shown in FIG. 48B or a protrusion such as that shown in FIG. 48C is often left.

Each of the various preferred embodiments of the present invention described above is an electronic device that arranges a bolometer over a cavity to detect incident infrared radiation. However, the present invention is in no way limited to these specific preferred embodiments. Rather, the effects of the present invention are also achievable even when the present invention is implemented as an electronic device including a piezoelectric element, an actuator or any of various other structures to be supported by an etch stop layer over a cavity.

A bulk acoustic wave (BAW) device is known as one of such devices including a piezoelectric film and an electrode layer for use to apply a voltage to the piezoelectric film over a cavity. While being propagated through the piezoelectric film, a bulk acoustic wave should produce a resonance at a predetermined frequency. By utilizing such a property, the BAW device operates as a filter or a high frequency resonator. According to a preferred embodiment of the present invention, after a provisional cavity has been formed in a substrate, for example, the piezoelectric film and electrode layer are provided over the cavity and then the cavity is expanded.

Examples of known electronic devices in which an actuator is provided over a cavity include an optical switching element that drives a micro mirror or a micro prism by the actuator. Such an optical switching element sometimes needs a cavity to allow a particular member to move freely. When such an electronic device is fabricated by a method according to a preferred embodiment of the present invention, a provisional cavity is formed, at least a portion of the actuator is provided over the provisional cavity, and then the provisional cavity is expanded.

According to any of various preferred embodiments of the present invention described above, a supporting portion that supports the ceiling of a provisional cavity is used while an electronic device is being fabricated, and then the provisional cavity is expanded into a final cavity by removing the supporting portion at least partially in the end. Accordingly, the ceiling of the cavity never collapses during the manufacturing process of the electronic device, and yet the final cavity can have a sufficiently large volume. Thus, the present invention contributes to manufacturing a great number of electronic devices with a cavity, such as infrared sensors, at a good yield.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for fabricating an electronic device, the method comprising the steps of:
    (a) preparing a cavity defining sacrificial layer, at least the upper surface of which is covered with an etch stop layer;
    (b) forming at least one first opening in the etch stop layer, thereby partially exposing the surface of the cavity defining sacrificial layer;
    (c) etching the cavity defining sacrificial layer through the first opening, thereby defining a provisional cavity under the etch stop layer and a supporting portion that supports the etch stop layer thereon; and
    (d) etching away a portion of the etch stop layer, thereby defining at least one second opening that reaches the provisional cavity through the etch stop layer and expanding the provisional cavity into a final cavity.

2. The method of claim 1, wherein the step (d) includes the step of etching at least a part of the supporting portion, which is located under the second opening, through the second opening.

3. The method of claim 2, wherein the step (c) includes the step of selectively removing the cavity defining sacrificial layer by a wet etching technique, and
    wherein the step (d) includes the step of removing the supporting portion at least partially by a dry etching technique.

4. The method of claim 1, further comprising the step of forming a structure, including a patterned thin film, on the etch stop layer before the step (d) is performed.

5. The method of claim 4, wherein the step of forming the structure includes the step of forming the structure such that the patterned thin film does not overlap with the portion of the etch stop layer to be removed to define the second opening in the step (d).

6. The method of claim 5, further comprising the step of forming a cap member that encapsulates the structure including the patterned thin film.

7. The method of claim 1, wherein the step (a) comprises the steps of:
   depositing a material film of the cavity defining sacrificial layer on a substrate; and
   patterning the material film into the shape of the cavity defining sacrificial layer.

8. The method of claim 7, wherein the step of patterning the material film includes the step of patterning the material film into a cavity defining sacrificial layer that has a through hole extending from the upper surface thereof through the lower surface thereof.

9. The method of claim 8, wherein the step (c) includes the step of defining the supporting portion in a region in which the cavity defining sacrificial layer is not present.

10. The method of claim 7, wherein the step (c) includes the step of defining the supporting portion in a region in which the cavity defining sacrificial layer is not present.

11. The method of claim 10, wherein the step (c) includes the step of making a portion of the etch stop layer function as the supporting portion.

12. The method of claim 7, wherein the step (c) includes the step of leaving a portion of the cavity defining sacrificial layer as the supporting portion.

13. The method of claim 1, further comprising the steps of:
   defining a mask, having a pattern that will define the second opening and that exposes the inside of the first opening, on the etch stop layer between the steps (b) and (c); and
   removing the mask after the step (d) has been performed.

14. The method of claim 1, further comprising, between the steps (c) and (e), the steps of:
   depositing a thin film on the etch stop layer to close up the first opening of the etch stop layer;
   forming a film for a sensor on the thin film; and
   patterning the film for the sensor.

15. The method of claim 14, wherein the step of depositing the thin film includes the step of depositing the thin film by a chemical vapor deposition process.

16. The method of claim 15, further comprising the step of forming a heat-absorbing insulating film on the thin film.

17. The method of claim 16, further comprising the step of forming a passivation film on the heat-absorbing insulating film.

18. The method of claim 14, wherein the step (a) includes the step of depositing a nitride layer as the etch stop layer, and
   wherein the step of depositing the thin film includes the step of depositing a silicon dioxide film.

19. The method of claim 1, wherein the step (a) includes the step of depositing the etch stop layer on the cavity defining sacrificial layer.

20. The method of claim 1, wherein the step (a) includes the step of using a surface portion of a semiconductor substrate as the cavity defining sacrificial layer.

21. The method of claim 1, wherein the step (c) includes the steps of:
   forming a recess, extending from the first opening into the cavity defining sacrificial layer, by a dry etching technique; and
   expanding the recess by an isotropic etching technique.

22. The method of claim 21, wherein the step (c) includes the step of defining three to ten columns, each having a transversal sectional area of at least about 10 $\mu m2$, as the supporting portion where the final cavity has an overall transversal sectional area of about 1,000 $\mu m2$ or more.

23. The method of claim 1, wherein the step (c) includes the step of defining the supporting portion only inside of the provisional cavity.

24. The method of claim 1, wherein the step (a) includes the step of preparing an SOI substrate that includes a silicon dioxide layer functioning as the etch stop layer and a single crystalline silicon substrate including a portion functioning as the cavity defining sacrificial layer.

25. The method of claim 1, wherein the step (a) includes the step of locally oxidizing the surface of a single crystalline silicon substrate to define a silicon dioxide region on a selected area on the surface of the silicon substrate, at least a portion of the silicon dioxide region being used as the cavity defining sacrificial layer.

26. The method of claim 25, further comprising the step of using the silicon dioxide region as an isolation film.

27. The method of claim 1, wherein the step (c) includes the step of defining the supporting portion only around the provisional cavity.

* * * * *